US 12,546,935 B2

(12) United States Patent
Yu et al.

(10) Patent No.: US 12,546,935 B2
(45) Date of Patent: Feb. 10, 2026

(54) INTEGRATED CIRCUIT PACKAGE AND METHOD OF FORMING SAME

(71) Applicant: Taiwan Semiconductor Manufacturing Co., Ltd., Hsinchu (TW)

(72) Inventors: Chen-Hua Yu, Hsinchu (TW); Chuei-Tang Wang, Taichung (TW); Wen-Hao Cheng, Hsinchu (TW); Tung-Liang Shao, Hsinchu (TW); Chung-Hao Tsai, Huatan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 440 days.

(21) Appl. No.: 17/812,530

(22) Filed: Jul. 14, 2022

(65) Prior Publication Data
US 2023/0314702 A1   Oct. 5, 2023

Related U.S. Application Data

(60) Provisional application No. 63/362,424, filed on Apr. 4, 2022.

(51) Int. Cl.
  *G02B 6/13* (2006.01)
  *G02B 6/12* (2006.01)
(52) U.S. Cl.
  CPC .......... *G02B 6/12004* (2013.01); *G02B 6/13* (2013.01)
(58) Field of Classification Search
  CPC ........................................ G02B 6/13

USPC ............................................. 385/14
See application file for complete search history.

(56) References Cited

U.S. PATENT DOCUMENTS

| 5,608,264 A * | 3/1997 | Gaul ............... H01L 23/481 257/734 |
| 8,816,463 B2 * | 8/2014 | Akram ............. H04N 25/76 257/459 |
| 8,993,380 B2 | 3/2015 | Hou et al. |
| 9,035,411 B2 * | 5/2015 | Ueno ............... H01L 25/0655 257/444 |
| 9,281,254 B2 | 3/2016 | Yu et al. |
| 9,299,649 B2 | 3/2016 | Chiu et al. |

(Continued)

FOREIGN PATENT DOCUMENTS

| TW | 201933558 A | 8/2019 |
| TW | 202131458 A | 8/2021 |

(Continued)

*Primary Examiner* — Kaveh C Kianni
(74) *Attorney, Agent, or Firm* — Slater Matsil, LLP

(57) ABSTRACT

A package includes an encapsulant having a first side and a second side opposite to the first side, a first integrated circuit die and a second integrated circuit die embedded in the encapsulant, and a first interposer on the first side of the encapsulant. The first interposer is mechanically and electrically coupled to the first integrated circuit die and the second integrated circuit die. The package further includes a second interposer on the second side of the encapsulant. The second interposer is mechanically and electrically coupled to the first integrated circuit die and the second integrated circuit die. The second interposer optically or electrically couples the first integrated circuit die to the second integrated circuit die.

20 Claims, 47 Drawing Sheets

(56) References Cited

U.S. PATENT DOCUMENTS

| | | | |
|---|---|---|---|
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,333,623 B1* | 6/2019 | Liao | G02B 6/4283 |
| 10,393,959 B1* | 8/2019 | Razdan | H01L 23/5384 |
| 10,943,851 B1* | 3/2021 | Elsherbini | H01L 25/0652 |
| 11,493,714 B1* | 11/2022 | Mendoza | H01L 25/0657 |
| 2013/0241025 A1* | 9/2013 | Pagani | H01L 24/73 |
| | | | 438/584 |
| 2016/0085038 A1* | 3/2016 | Decker | G02B 6/428 |
| | | | 385/14 |
| 2016/0216445 A1* | 7/2016 | Thacker | G02B 6/4219 |
| 2017/0186707 A1* | 6/2017 | Brun | H01L 21/76885 |
| 2018/0358298 A1 | 12/2018 | Zhai et al. | |
| 2019/0164905 A1 | 5/2019 | Hsieh et al. | |
| 2020/0083172 A1 | 3/2020 | Hsieh et al. | |
| 2020/0098736 A1* | 3/2020 | Liao | G02B 6/1225 |
| 2021/0091056 A1* | 3/2021 | Yu | H01L 25/167 |
| 2021/0132309 A1* | 5/2021 | Zhang | G02B 6/4249 |
| 2021/0257396 A1* | 8/2021 | Piggott | H01L 27/1464 |
| 2021/0271020 A1 | 9/2021 | Islam et al. | |
| 2021/0311252 A1* | 10/2021 | Chen | G02B 6/12002 |
| 2021/0375741 A1 | 12/2021 | Tsou et al. | |
| 2022/0246772 A1* | 8/2022 | Wilcoxon | H01L 23/3675 |
| 2023/0018654 A1* | 1/2023 | Winzer | G02B 6/4268 |
| 2023/0077877 A1* | 3/2023 | Kung | G02B 6/4274 |
| | | | 385/15 |
| 2023/0176304 A1* | 6/2023 | Winzer | G02B 6/4284 |
| | | | 385/92 |
| 2023/0375793 A1* | 11/2023 | Winzer | G02B 6/428 |

FOREIGN PATENT DOCUMENTS

| | | |
|---|---|---|
| TW | 202133353 A | 9/2021 |
| TW | 202145487 A | 12/2021 |

\* cited by examiner

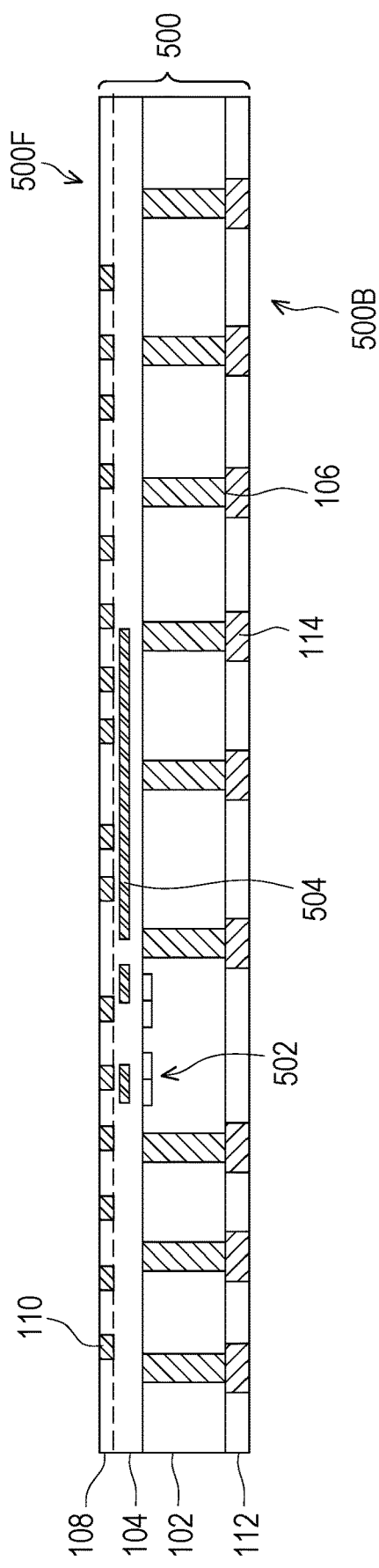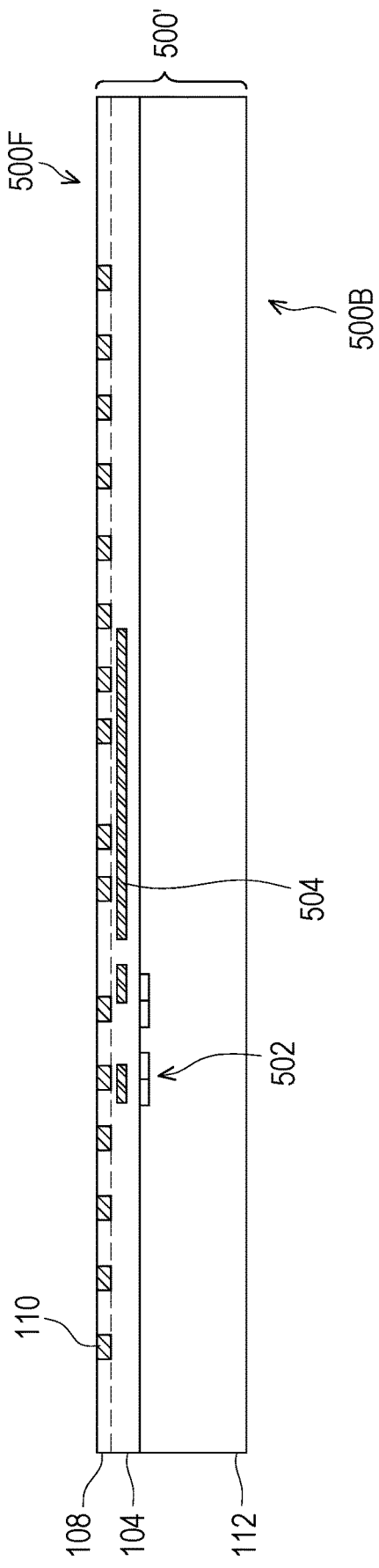

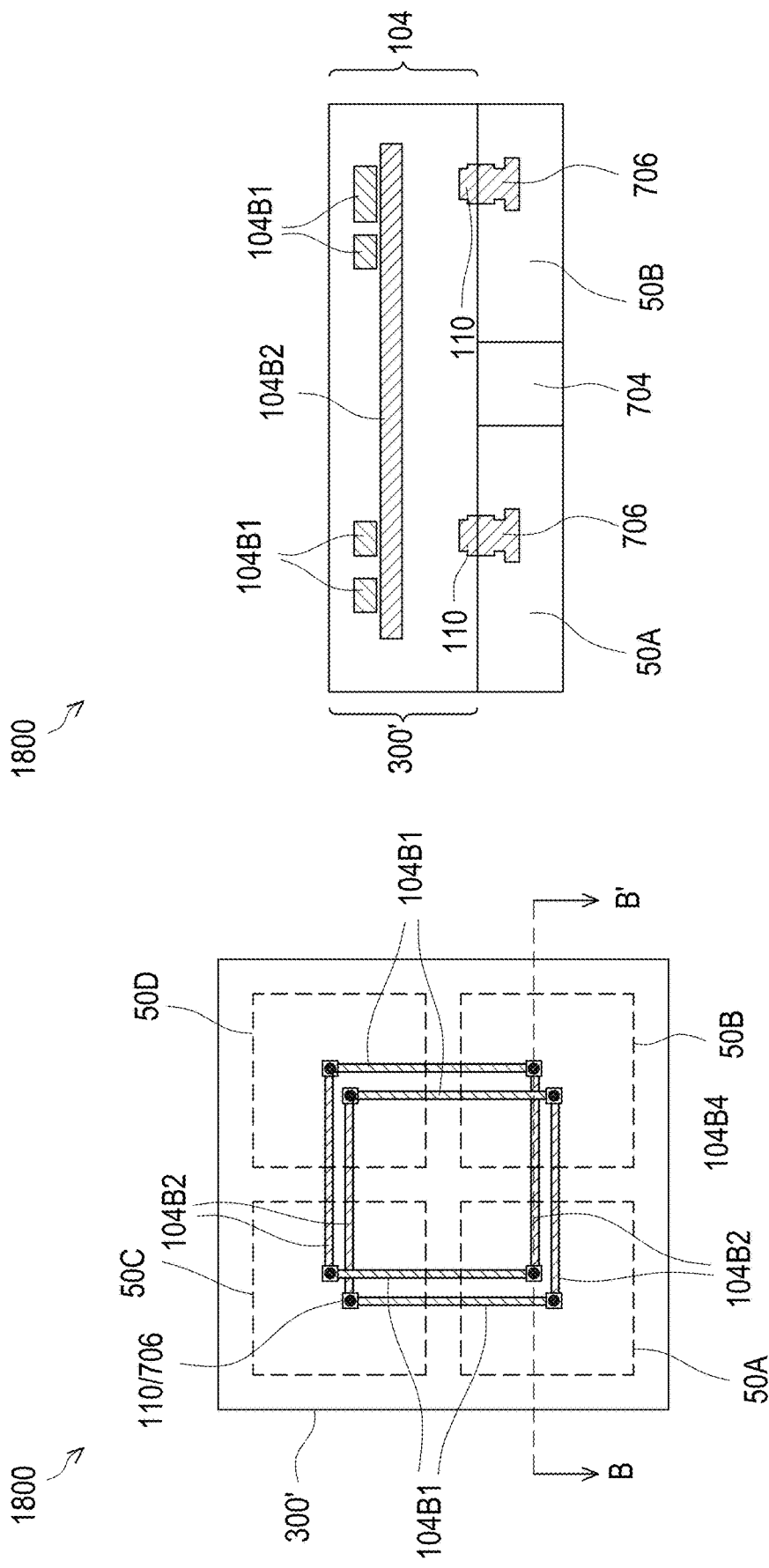

INTEGRATED CIRCUIT PACKAGE AND METHOD OF FORMING SAME

PRIORITY CLAIM AND CROSS-REFERENCE

This application claims the benefit of U.S. Provisional Application No. 63/362,424, filed on Apr. 4, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a trend for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 illustrates a cross-sectional view of an interposer, in accordance with some embodiments.

FIG. 10 illustrates a cross-sectional view of an interposer, in accordance with some embodiments.

FIGS. 33A and 33B illustrate plan and cross-sectional views of an interconnect structure of a package component, in accordance with some embodiments.

DETAILED DESCRIPTION

Figure 1:
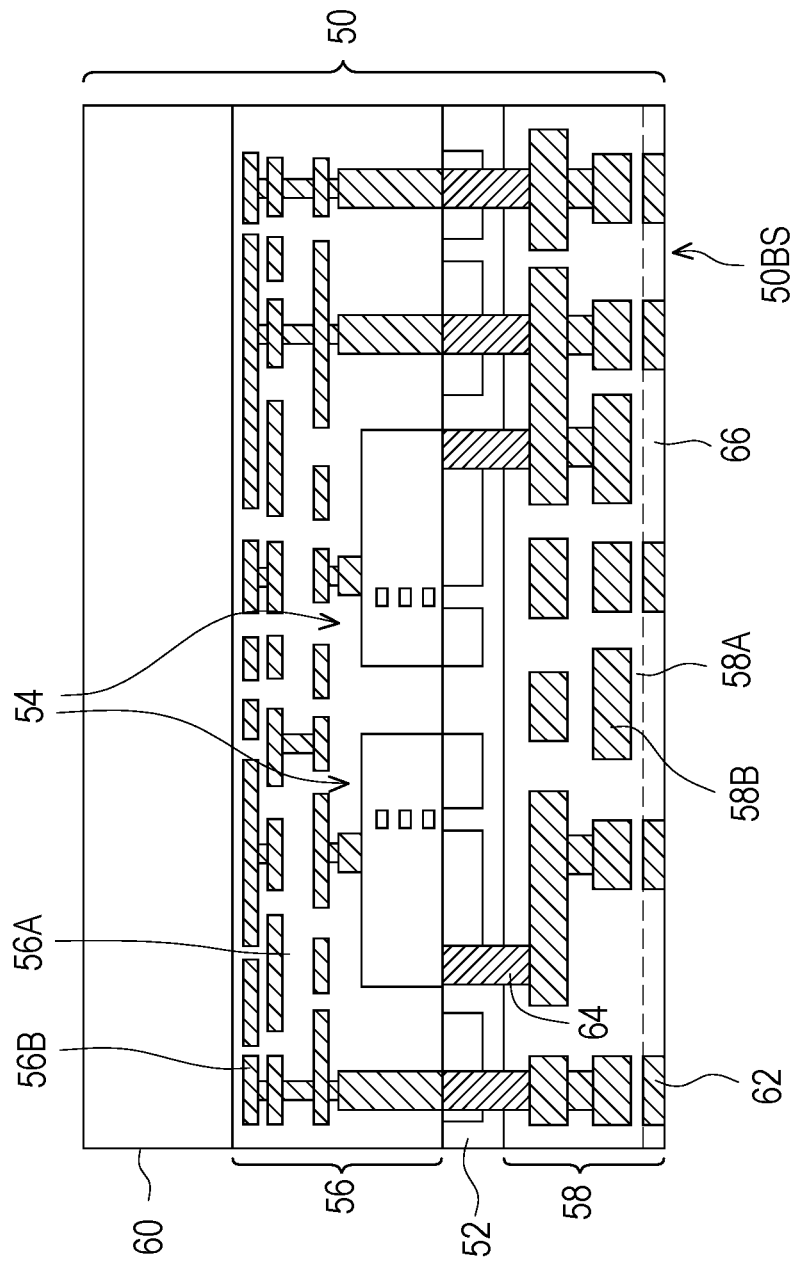
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely integrated circuit packages and methods of forming the same. According to various embodiments, an integrated circuit package comprises a plurality of integrated circuit dies encapsulated in an encapsulant, where each of the integrated circuit dies includes a front-side interconnect structure and a backside interconnect structure. The package further includes a first interposer in physical and electrical contact with the backside interconnect structures of the integrated circuit dies and a second interposer in physical and electrical contact with the front-side interconnect structures of the integrated circuit dies. The first interposer may be an active interposer (including active electrical devices), a passive interposer (including passive electrical devices), an input/output (I/O) interposer (including I/O circuitry), or the like. The second interposer may be an active interposer (including active electrical devices), a passive interposer (including passive electrical devices), an optical or a photonic interposer (including optical devices, such as modulators and/or waveguides, for example), a hybrid (electrical/optical) interposer (including electrical and optical devices), or the like. In various embodiments, the second interposer allows for coupling the front-side interconnect structures of the integrated circuit dies without relying on back-side interconnect structures (such as super power rails) of the integrated circuit dies, and interconnect structures and through vias of the first interposer. In various embodiments, the first interposer and the second interposer are hybrid bonded to the integrated circuit dies, which reduces a thermal resistance of the resulting integrated circuit package. By electrically coupling the integrated circuit dies through the second interposer, flexibility in circuit design for the integrated circuit package may be improved.

FIG. 1 illustrates a cross-sectional view of an integrated circuit die 50, in accordance with some embodiments. Integrated circuit dies 50 will be packaged in subsequent processing to form integrated circuit packages. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, devices 54, a front-side interconnect structure 56, a backside interconnect structure 58, a carrier 60, and die connectors 62.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface or a front-side surface (e.g., the surface facing upward) and an inactive surface or a backside surface (e.g., the surface facing downward).

Devices 54 (illustrated by transistors) are at the active surface of the semiconductor substrate 52. The devices 54 may be active devices (e.g., transistors, diodes, etc.), capacitors, resistors, etc. The inactive surface may be free from devices. In the illustrated embodiment, the integrated circuit die 50 comprises gate-all-around (GAA) transistors, such as nanostructure field effect transistors (NSFETs). In other embodiments, the integrated circuit die 50 may include fin field effect transistors (FinFETs), planar FETs, or the like, in addition to or in lieu of the GAA transistors.

The front-side interconnect structure 56 is over the active surface of the semiconductor substrate 52, and is used to electrically connect the devices 54 to form an integrated circuit. The front-side interconnect structure 56 may include one or more dielectric layer(s) 56A and respective metallization layer(s) 56B (including conductive lines and vias) in the dielectric layer(s) 56A. Acceptable dielectric materials for the dielectric layers 56A include low-k dielectric materials such as phospho-silicate glass (PSG), boro-silicate glass (BSG), boron-doped phospho-silicate glass (BPSG), undoped silicate glass (USG), or the like. Acceptable dielectric materials for the dielectric layers 56A further include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layers 56B may be formed of a conductive material, such as a metal, such as copper, cobalt, aluminum, gold, combinations thereof, or the like. The front-side interconnect structure 56 may be formed by a damascene process, such as a single damascene process, a dual damascene process, or the like.

The backside interconnect structure 58 is formed on the inactive surface of the semiconductor substrate 52, and may be used to provide power to the devices 54 of the semiconductor substrate 52. The semiconductor substrate 52 is interposed between the front-side interconnect structure 56 and the backside interconnect structure 58. The backside interconnect structure 58 may include one or more dielectric layer(s) 58A and respective metallization layer(s) 58B (including conductive lines and vias) in the dielectric layer(s) 58A. The one or more dielectric layer(s) 58A may be formed using similar materials and methods as the one or more dielectric layer(s) 56A. The metallization layers 58B may be formed of a conductive material, such as a metal, such as copper, cobalt, aluminum, gold, combinations thereof, or the like. The backside interconnect structure 58 may be formed by a damascene process, such as a single damascene process, a dual damascene process, or the like.

In some embodiments, the backside interconnect structure 58 is electrically coupled to the devices 54 and/or the front-side interconnect structure 56 using a super power rail 64. In some embodiments, the super power rail 64 comprises through substrate vias (TSVs) that extend through the semiconductor substrate 52 to couple to the devices 54. The super power rail 64 may be formed of a conductive material, such as a metal, such as copper, cobalt, aluminum, gold, combinations thereof, or the like. In some embodiments, the super power rail 64 may be formed as a part of the backside interconnect structure 58.

The carrier 60 may be bonded to the front-side interconnect structure 56, such that the front-side interconnect structure 56 is interposed between the carrier 60 and the semiconductor substrate 52. The carrier 60 may comprise a semiconductor material (such as silicon, or the like), or a dielectric material (such as quartz, or the like). In some embodiments, the carrier 60 and the semiconductor substrate 52 comprise a same semiconductor material. In other embodiments, the carrier 60 and the semiconductor substrate 52 comprise different semiconductor materials. In some embodiments, the carrier 60 may be used as a support while forming the backside interconnect structure 58. As describe below in greater detail, in some embodiments, the carrier 60 may be removed during packaging.

Die connectors 62 are at the backside SOBS of the integrated circuit die 50. The die connectors 62 may be conductive pillars, pads, or the like, to which external connections are made. As described below in greater detail, the die connectors 62 may be used as bond pads for bonding the integrated circuit die 50 to other package components during packaging. The die connectors 62 are in and/or on the backside interconnect structure 58. For example, the die connectors 62 may be part of an uppermost metallization layer (a metallization layer that is farthest away from the semiconductor substrate 52) of the backside interconnect structure 58. The die connectors 62 may be formed of a metal, such as copper, aluminum, or the like, and may be formed by, for example, plating, or the like.

Optionally, solder regions (not separately illustrated) may be disposed on the die connectors 62 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 62. Chip probe testing may be performed on the integrated circuit die 50 to ascertain whether the integrated circuit die 50 is a known good die (KGD). Thus, only integrated circuit dies 50, which are KGDs, undergo subsequent processing and are packaged, and dies which fail the chip probe testing are not packaged. After testing, the solder regions may be removed in subsequent processing steps.

An insulating layer 66 is at the backside SOBS of the integrated circuit die 50. The insulating layer 66 is in and/or on the backside interconnect structure 58. For example, the insulating layer 66 may be an uppermost dielectric layer (a dielectric layer that is farthest away from the semiconductor substrate 52) of the backside interconnect structure 58. The insulating layer 66 laterally encapsulates the die connectors 62. The insulating layer 66 may be an oxide, a nitride, a carbide, a polymer, the like, or a combination thereof. The insulating layer 66 may be formed, for example, by spin coating, lamination, chemical vapor deposition (CVD), or the like. Initially, the insulating layer 66 may bury the die connectors 62, such that the bottom surface of the insulating layer 66 is below the bottom surfaces of the die connectors 62. In some embodiments, the die connectors 62 are exposed through the insulating layer 66 during formation of the integrated circuit die 50. In other embodiments, the die connectors 62 are exposed through the insulating layer 66 during packaging of the integrated circuit die 50. Exposing the die connectors 62 may remove any solder regions that may be present on the die connectors 62. A removal process can be applied to the various layers to remove excess materials over the die connectors 62. The removal process may be a planarization process such as a chemical mechanical polish (CMP), an etch-back, combinations thereof, or the like. After the planarization process, bottom surfaces of the die connectors 62 and the insulating layer 66 are substantially coplanar (within process variations), such that they are level with one another.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias. Each of the semiconductor substrates 52 may (or may not) have a separate interconnect structure.

Figure 2:
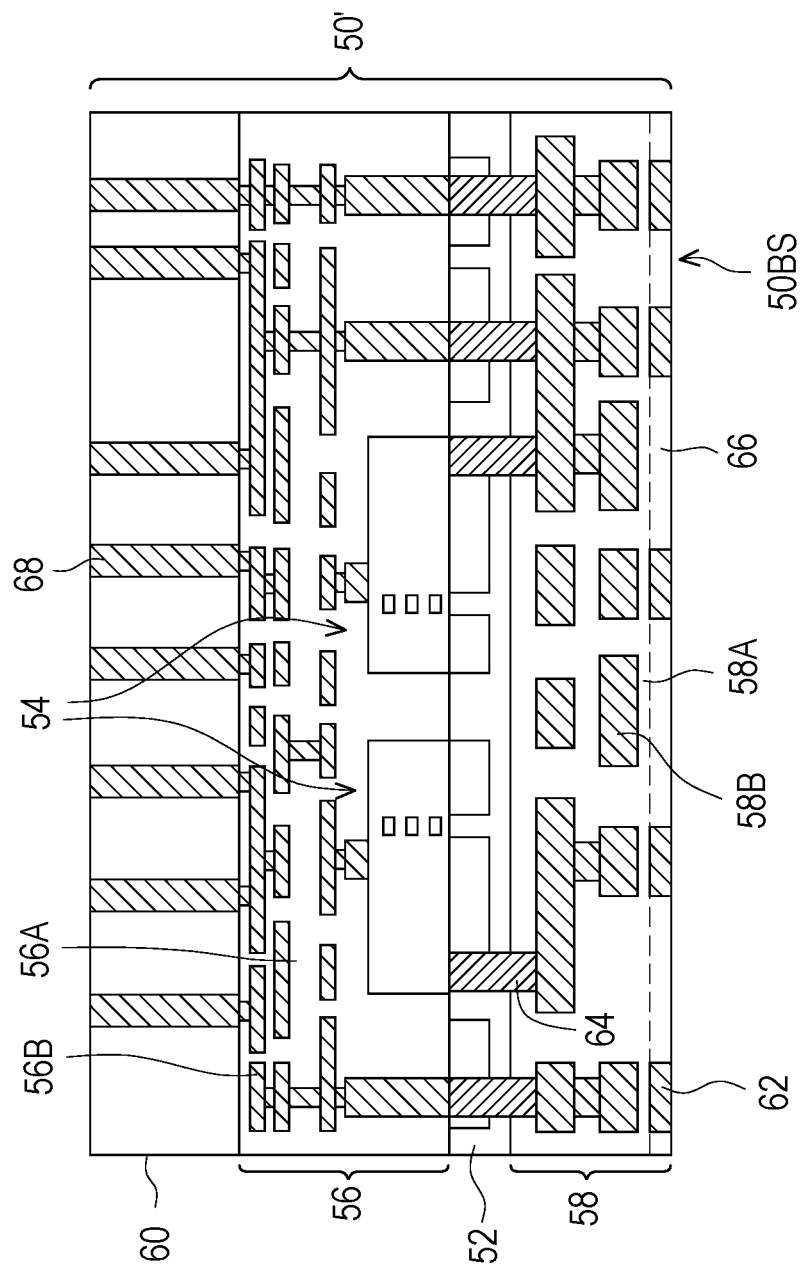
FIG. 2 illustrates a cross-sectional view of an integrated circuit die, in accordance with some embodiments.

FIG. 2 illustrates a cross-sectional view of an integrated circuit die 50', in accordance with some embodiments. The integrated circuit die 50' is similar to the integrated circuit die 50 (see FIG. 1), with similar features being labeled by similar numerical references, and descriptions of the similar features are not repeated herein. In the illustrated embodiment, the integrated circuit die 50' comprises conductive vias 68 that extend through the carrier 60 and electrically couple to the front-side interconnect structure 56. As an example to form the conductive vias 68, openings are formed in the carrier 60 by, for example, etching, milling, laser techniques, a combination thereof, and/or the like. A thin dielectric material may be formed in the openings, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from an upper surface of the carrier 60 by, for example, a CMP. Remaining portions of the barrier layer and conductive material form the conductive vias 68.

Figure 3:
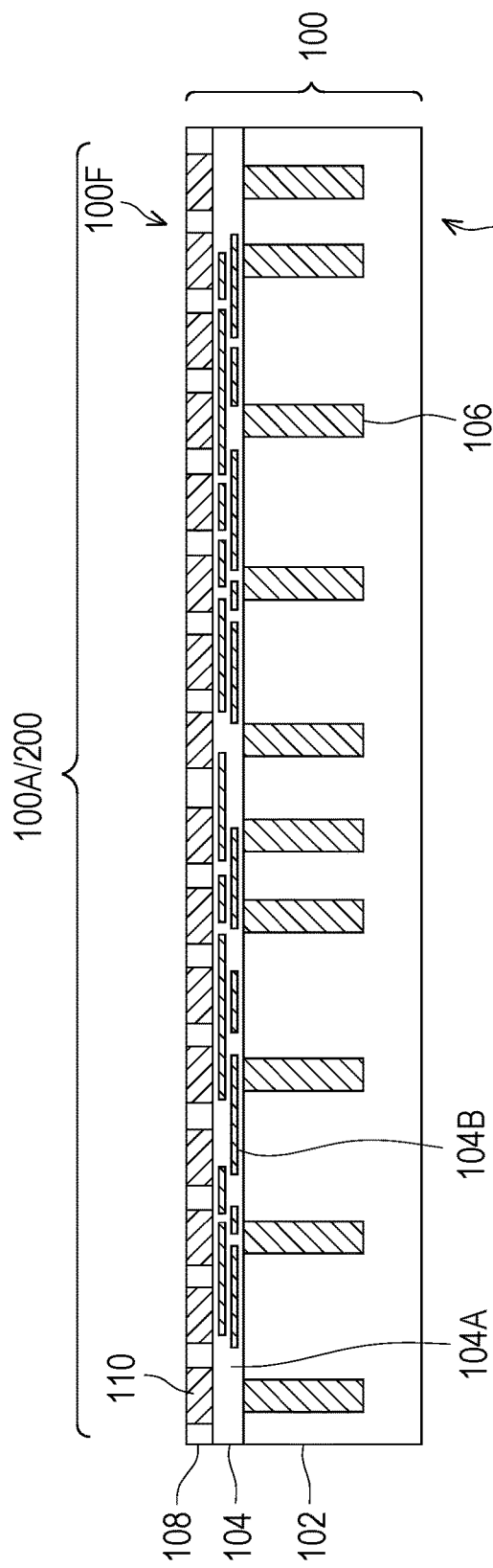
FIGS. 3 and 4 illustrate cross-sectional views of intermediate stages in the manufacturing of interposers, in accordance with some embodiments.
Figure 4:
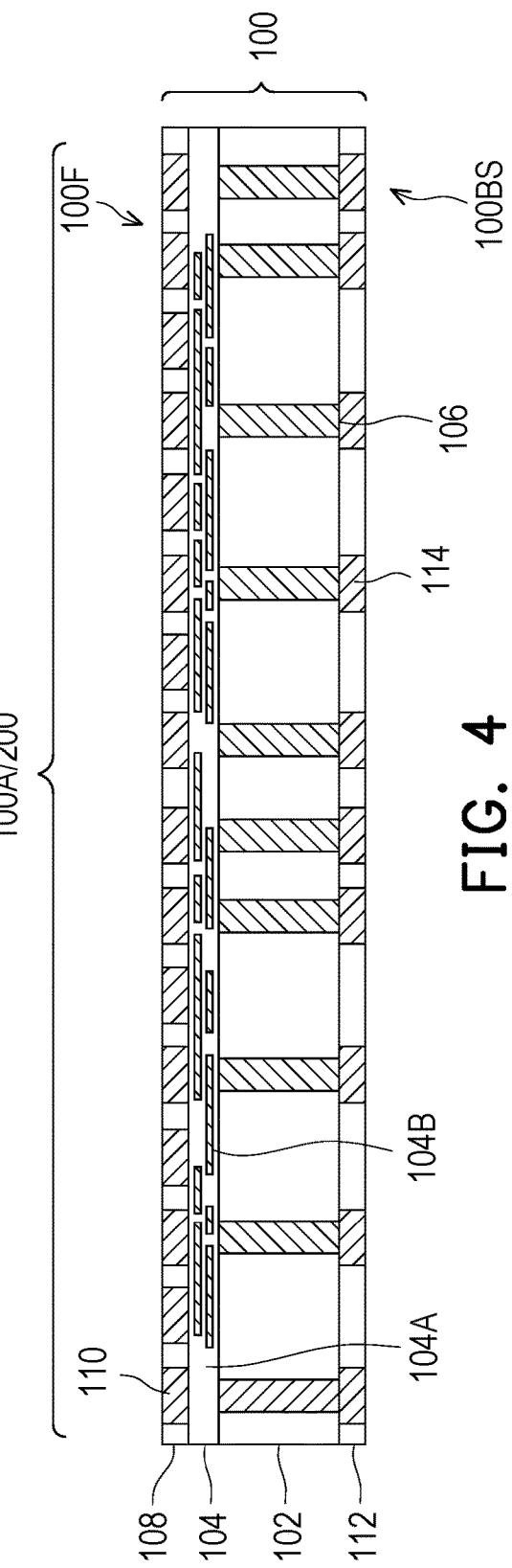

FIGS. 3 and 4 illustrate cross-sectional views of intermediate stages in the manufacturing of interposers 200, in accordance with some embodiments. In FIG. 3, a wafer 100 is obtained or formed. The wafer 100 comprises a plurality of device regions (such as the device region 100A), which will be singulated in subsequent processing to form individual devices. In some embodiments, interposers 200 are formed in respective device regions of the wafer 100. The interposers 200 may comprise a substrate 102, an interconnect structure 104, and conductive vias 106.

The substrate 102 may be a bulk semiconductor substrate, a semiconductor-on-insulator (SOI) substrate, a multi-layered semiconductor substrate, or the like. The substrate 102 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 102 may be doped or undoped.

In some embodiments, the substrate 102 generally does not include active devices therein, although the interposers 200 may include passive devices formed in and/or on an active or a front surface (e.g., the surface facing upward in FIG. 3) of the substrate 102. In other embodiments, active devices (such as transistors, diodes, or the like) and passive devices (capacitors, resistors and the like), may be formed in and/or on the front surface of the substrate 102. In some embodiments, the interposers 200 may include optical devices, such as modulators and/or waveguides. The interposers 200 may be active interposers (including active electrical devices, such as SRAM devices, for example), passive interposers (including passive electrical devices, such as capacitors, for example), I/O interposers (including I/O circuitry), optical or photonic interposers (including optical devices, such as modulators and/or waveguides, for example), hybrid (electrical/optical) interposers (including electrical and optical devices), or the like.

The interconnect structure 104 is over the front surface of the substrate 102, and is used to electrically connect the devices (if any) of the substrate 102. The interconnect structure 104 may include one or more dielectric layer(s) 104A and respective metallization layer(s) 104B (including conductive lines and vias) in the dielectric layer(s) 104A. The interconnect structure 104 may be formed using similar materials and methods as the front-side interconnect structure 56 described above with reference to FIG. 1, and the description is not repeated herein.

In some embodiments, die connectors 110 and a dielectric layer 108 are at the front side 100F of the wafer 100. Specifically, the wafer 100 may include die connectors 110 and the dielectric layer 108 that are similar to die connectors 62 and the dielectric layer 66, respectively, of the integrated circuit die 50 described above with reference to FIG. 1, and the description is not repeated herein. In some embodiments, the die connectors 110 may be a part of an upper metallization layer of the interconnect structure 104 (a metallization layer that is farthest away from the semiconductor substrate 102) and the dielectric layer 108 may be a part of an upper dielectric layer of the interconnect structure 104 (a dielectric layer that is farthest away from the semiconductor substrate 102). In other embodiments, the die connectors 110 and the dielectric layer 108 may be formed separately from the interconnect structure 104. As described below in greater detail, the die connectors 110 may be used as bond pads for bonding package components (such as, for example, integrated circuit dies) to the wafer 100. Accordingly, the die connectors 110 may be also referred to as bond pads, and the die connectors 110 and the dielectric layer 108 may be collectively referred to as a bonding layer.

The conductive vias 106 extend into the interconnect structure 104 and/or the substrate 102. The conductive vias 106 are electrically connected to metallization layer(s) 104B of the interconnect structure 104. The conductive vias 106 are also sometimes referred to as through-substrate vias (TSVs). As an example to form the conductive vias 106, openings can be formed in the interconnect structure 104 and/or the substrate 102 by, for example, etching, milling, laser techniques, a combination thereof, and/or the like. A thin dielectric material may be formed in the openings, such as by using an oxidation technique. A thin barrier layer may be conformally deposited in the openings, such as by CVD, ALD, PVD, thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 104 or the substrate 102 by, for example, a CMP. Remaining portions of the barrier layer and conductive material form the conductive vias 106.

In FIG. 4, the substrate 102 is thinned to expose the conductive vias 106. Exposure of the conductive vias 106 may be accomplished by a thinning process, such as a grinding process, a CMP, an etch-back, combinations thereof, or the like. In some embodiments (not separately illustrated), the thinning process for exposing the conductive vias 106 includes a CMP, and the conductive vias 106 protrude at the backside 100BS of the wafer 100 as a result of dishing that occurs during the CMP. In such embodiments, an insulating layer (not separately illustrated) may optionally be formed on the back surface of the substrate 102, surrounding the protruding portions of the conductive vias 106. The insulating layer may be formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. After the substrate 102 is thinned, the exposed surfaces of the conductive vias 106 and the insulating layer (if present) or the substrate 102 are coplanar (within process variations) such that they are level with one another, and are exposed at the backside 100BS of the wafer 100.

After thinning the wafer 100, die connectors 114 and a dielectric layer 112 are formed at the backside 100BS of the wafer 100. Specifically, the wafer 100 may include die connectors 114 and the dielectric layer 112 that are similar to the die connectors 62 and the dielectric layer 66, respectively, of the integrated circuit die 50 described above with reference to FIG. 1, and the description is not repeated herein. In some embodiments, a planarization process (such as, for example, a CMP) is performed on the die connectors 114 and the dielectric layer 112, such that exposed surfaces of the die connectors 114 and the dielectric layer 112 are level with each other within process variations of the planarization process. As described below in greater detail, the die connectors 114 may be used as bond pads for bonding other package components to the interposers 200. Accordingly, the die connectors 114 may be also referred to as bond pads, and the die connectors 114 and the dielectric layer 112 may be collectively referred to as a bonding layer.

Further, a singulation process is performed on the wafer 100 by cutting along scribe line regions, e.g., around the device region 100A. The singulation process may include sawing, etching, dicing, a combination thereof, or the like.

The singulation process forms interposers 200 from the singulated portions of the wafer 100.

Figure 5:
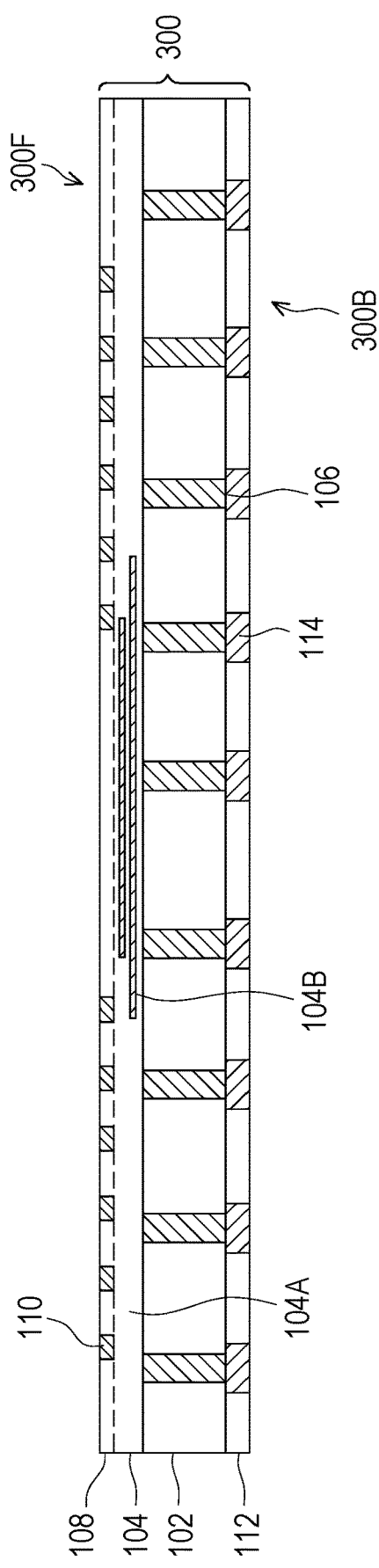
FIG. 5 illustrates a cross-sectional view of an interposer, in accordance with some embodiments.

FIG. 5 illustrates a cross-sectional view of an interposer 300, in accordance with some embodiments. The interposer 300 is similar to the interposer 200 (see FIG. 4), with similar features being labeled by similar numerical references, and descriptions of the similar features are not repeated herein. The interposer 300 may be formed using process steps that are similar to the process steps described above with reference to FIGS. 3 and 4, and the description is not repeated herein. In the illustrated embodiment, the interposer 300 comprises passive electrical devices and does not comprise active electrical devices. The interposer 300 may be also referred to as a passive interposer. In the illustrated embodiment, the interposer 300 comprises the dielectric layer 108 and the die connectors 110 at the front side 300F of the interposer 300 and the dielectric layer 112 and the die connectors 114 at the backside 300B of the interposer 300.

Figure 6:
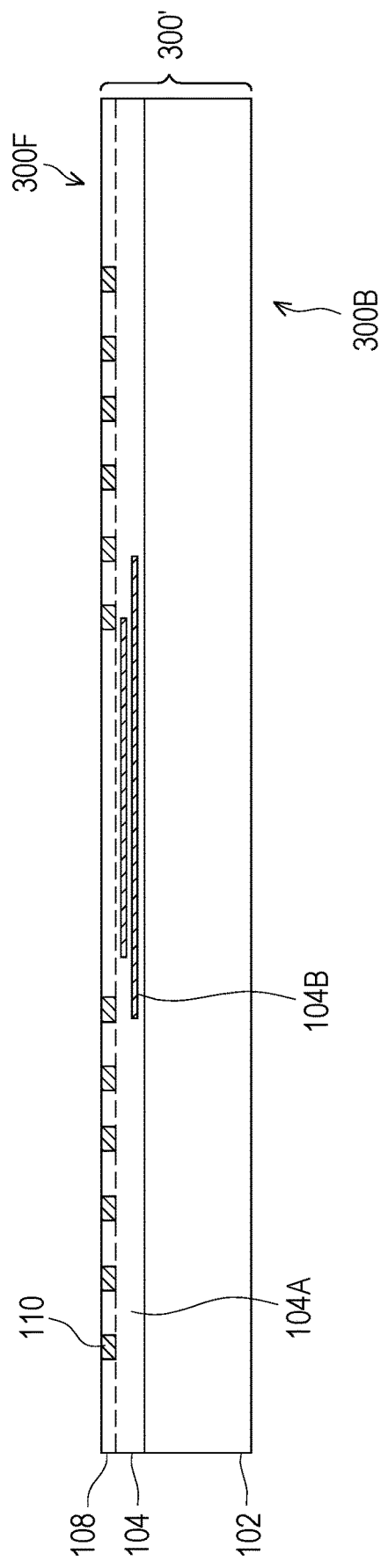
FIG. 6 illustrates a cross-sectional view of an interposer, in accordance with some embodiments.

FIG. 6 illustrates a cross-sectional view of an interposer 300', in accordance with some embodiments. The interposer 300' is similar to the interposer 300 (see FIG. 5), with similar features being labeled by similar numerical references, and descriptions of the similar features are not repeated herein. The interposer 300' may be formed in a similar manner as the interposer 300 (see FIG. 5) and the description is not repeated herein. In the illustrated embodiment, the interposer 300' comprises passive electrical devices and does not comprise active electrical devices. The interposer 300' may be also referred to as a passive interposer. In distinction with the interposer 300, the interposer 300' does not include the conductive vias 106 (see FIG. 5) within the substrate 102, and the die connectors 114 and the dielectric layer 112 (see FIG. 5) at the backside 300B of the interposer 300'. In the illustrated embodiment, the interposer 300' comprises the dielectric layer 108 and the die connectors 110 at the front-side 300F of the interposer 300'.

Figure 7:
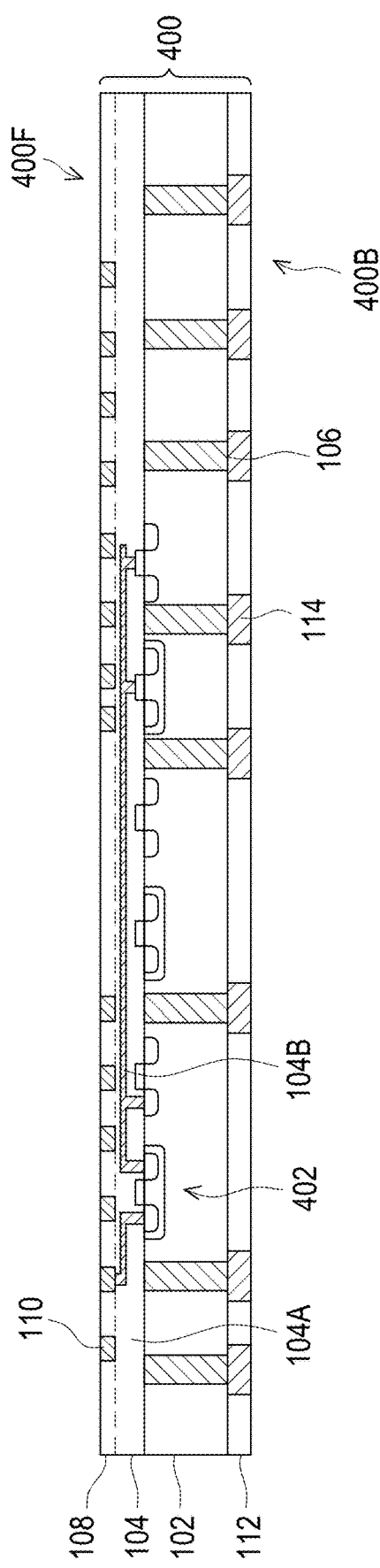
FIG. 7 illustrates a cross-sectional view of an interposer, in accordance with some embodiments.

FIG. 7 illustrates a cross-sectional view of an interposer 400, in accordance with some embodiments. The interposer 400 is similar to the interposer 200 (see FIG. 4), with similar features being labeled by similar numerical references, and descriptions of the similar features are not repeated herein. The interposer 400 may be formed using process steps that are similar to the process steps described above with reference to FIGS. 3 and 4, and the description is not repeated herein. In the illustrated embodiment, the interposer 400 comprises devices 402 that include active and/or passive electrical devices. The interposer 400 may be also referred to as an active interposer. In the illustrated embodiment, the interposer 400 comprises the dielectric layer 108 and the die connectors 110 at the front side 400F of the interposer 400 and the dielectric layer 112 and the die connectors 114 at the backside 400B of the interposer 400.

Figure 8:
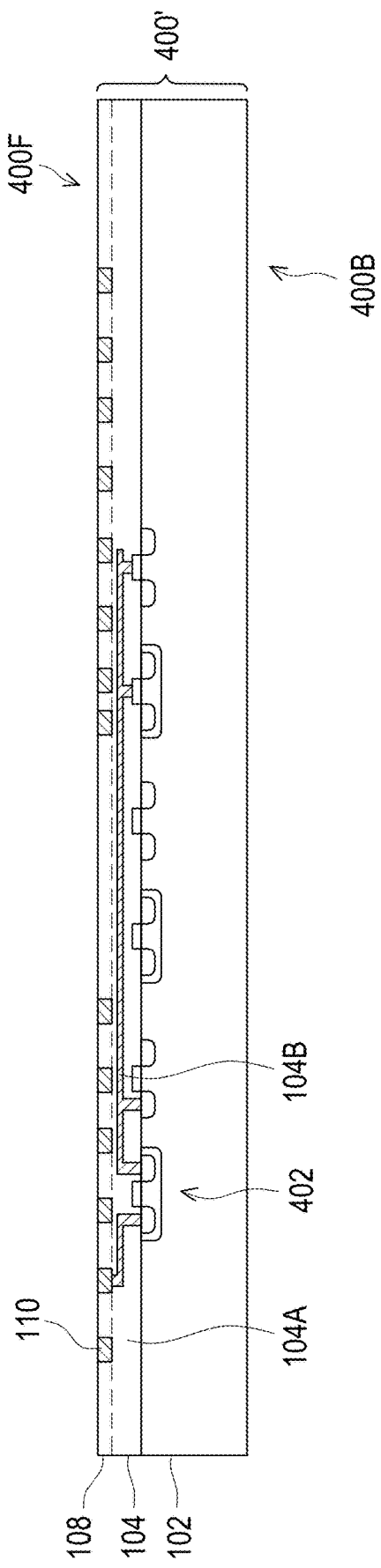
FIG. 8 illustrates a cross-sectional view of an interposer, in accordance with some embodiments.

FIG. 8 illustrates a cross-sectional view of an interposer 400', in accordance with some embodiments. The interposer 400' is similar to the interposer 400 (see FIG. 7), with similar features being labeled by similar numerical references, and descriptions of the similar features are not repeated herein. The interposer 400' may be formed in a similar manner as the interposer 400 (see FIG. 7) and the description is not repeated herein. In the illustrated embodiment, the interposer 400' comprises devices 402 that include active and/or passive electrical devices. The interposer 400' may be also referred to as an active interposer. In distinction with the interposer 400, the interposer 400' does not include the conductive vias 106 (see FIG. 7) within the substrate 102, and the die connectors 114 and the dielectric layer 112 (see FIG. 7) at the backside 400B of the interposer 400'. In the illustrated embodiment, the interposer 400' comprises the dielectric layer 108 and the die connectors 110 at the front-side 400F of the interposer 400'.

FIG. 9 illustrates a cross-sectional view of an interposer 500, in accordance with some embodiments. The interposer 500 is similar to the interposer 200 (see FIG. 4), with similar features being labeled by similar numerical references, and descriptions of the similar features are not repeated herein. The interposer 500 may be formed using process steps that are similar to the process steps described above with reference to FIGS. 3 and 4, and the description is not repeated herein. In the illustrated embodiment, the interposer 500 comprises devices 502 that include optical devices, such as modulators, photodetector, phase shifter, switch, or the like. The interposer 500 may not include active and passive electrical devices. Furthermore, the interconnect structure 104 may include one or more optical waveguides 504 and may or may not include metallization layers 104B (see FIG. 4). The interposer 500 may be also referred to as an optical interposer. In the illustrated embodiment, the interposer 500 comprises the dielectric layer 108 and the die connectors 110 at the front side 500F of the interposer 500 and the dielectric layer 112 and the die connectors 114 at the backside 500B of the interposer 500.

FIG. 10 illustrates a cross-sectional view of an interposer 500', in accordance with some embodiments. The interposer 500' is similar to the interposer 500 (see FIG. 9), with similar features being labeled by similar numerical references, and descriptions of the similar features are not repeated herein. The interposer 500' may be formed in a similar manner as the interposer 500 (see FIG. 9) and the description is not repeated herein. In the illustrated embodiment, the interposer 500' comprises devices 502 that include optical devices such as modulators, photodetector, phase shifter, switch, or the like. The interposer 500' may not include active and passive electrical device. Furthermore, the interconnect structure 104 may include one or more optical waveguide 504 and may or may not include metallization layers 104B (see FIG. 4). The interposer 500' may be also referred to as an optical interposer. In distinction with the interposer 500, the interposer 500' does not include the conductive vias 106 (see FIG. 9) within the substrate 102, and the die connectors 114 and the dielectric layer 112 (see FIG. 9) at the backside 500B of the interposer 500'. In the illustrated embodiment, the interposer 500' comprises the dielectric layer 108 and the die connectors 110 at the front-side 500F of the interposer 500'.

Figure 11:
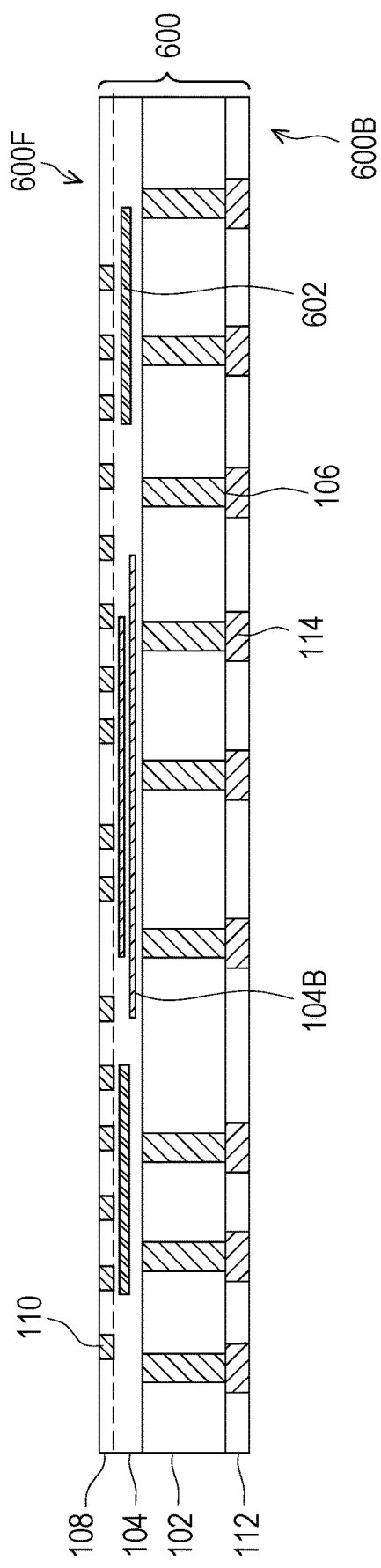
FIG. 11 illustrates a cross-sectional view of an interposer, in accordance with some embodiments.

FIG. 11 illustrates a cross-sectional view of an interposer 600, in accordance with some embodiments. The interposer 600 is similar to the interposer 200 (see FIG. 4), with similar features being labeled by similar numerical references, and descriptions of the similar features are not repeated herein. The interposer 600 may be formed using process steps that are similar to the process steps described above with reference to FIGS. 3 and 4, and the description is not repeated herein. In the illustrated embodiment, the interposer 600 comprises devices (not illustrated) that include optical devices and active and/or passive electrical devices. Furthermore, the interconnect structure 104 may include one or more optical waveguides 602 in addition to the metallization layers 104B. The interposer 600 may be also referred to as a hybrid interposer. In the illustrated embodiment, the interposer 600 comprises the dielectric layer 108 and the die connectors 110 at the front side 600F of the interposer 600 and the dielectric layer 112 and the die connectors 114 at the backside 600B of the interposer 600.

Figure 12:
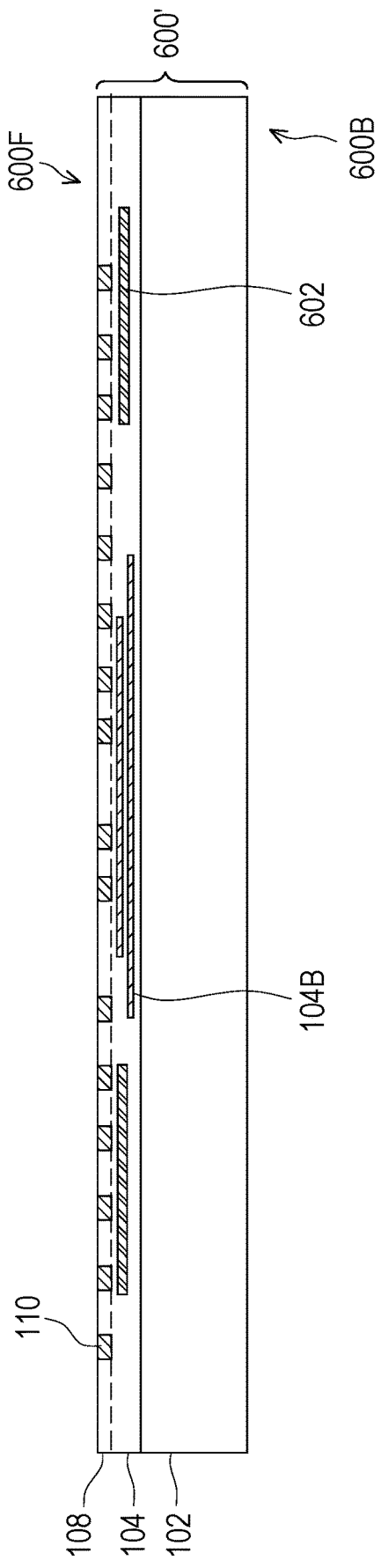
FIG. 12 illustrates a cross-sectional view of an interposer, in accordance with some embodiments.

FIG. 12 illustrates a cross-sectional view of an interposer 600', in accordance with some embodiments. The interposer 600' is similar to the interposer 600 (see FIG. 11), with similar features being labeled by similar numerical references, and descriptions of the similar features are not repeated herein. The interposer 600' may be formed in a similar manner as the interposer 600 (see FIG. 11) and the description is not repeated herein. In the illustrated embodiment, the interposer 600' comprises devices (not illustrated) that include optical devices and active and/or passive electrical devices. Furthermore, the interconnect structure 104 may include one or more optical waveguides 602 in addition to the metallization layers 104B. The interposer 600' may be also referred to as a hybrid interposer. In distinction with the interposer 600, the interposer 600' does not include the conductive vias 106 (see FIG. 11) within the substrate 102, and the die connectors 114 and the dielectric layer 112 (see FIG. 11) at the backside 600B of the interposer 600'. In the illustrated embodiment, the interposer 600' comprises the dielectric layer 108 and the die connectors 110 at the front-side 600F of the interposer 600'.

Figure 13:
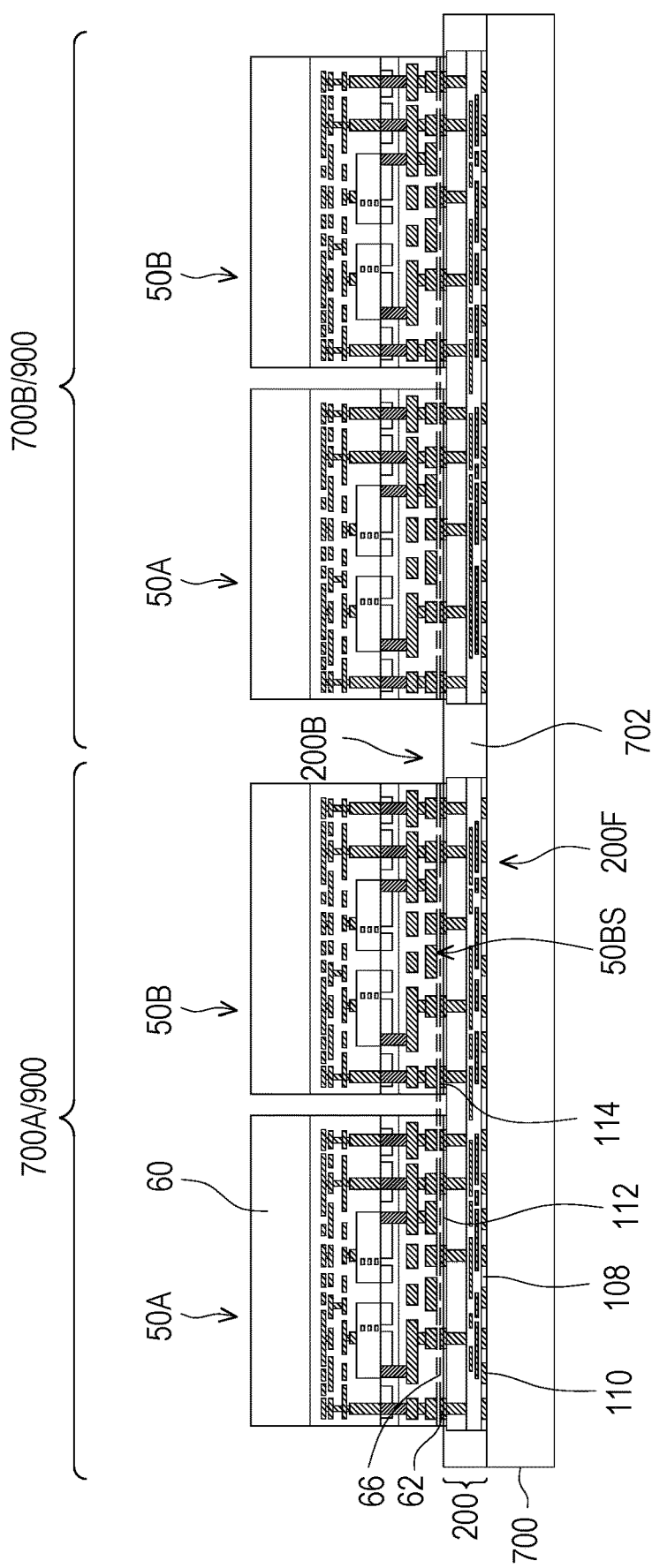
FIGS. 13-17 illustrate cross-sectional views of intermediate stages in the manufacturing of package components, in accordance with some embodiments.

FIGS. 13-17 illustrate cross-sectional views of intermediate stages in the manufacturing of package components 900, in accordance with some embodiments. In FIG. 13, a carrier wafer 700 is provided or formed. The carrier wafer 700 is used as a platform or a support for a packaging process described below. In some embodiments, the carrier wafer 700 comprises a semiconductor material (such as silicon, or the like), a dielectric material (such as quartz, or the like), a combination thereof, or the like. As described below in greater detail, a wafer-level package component is formed over the carrier wafer, which is singulated in subsequent processing into individual die-level package components 900. In particular, the carrier wafer 700 comprises a plurality of package regions (such as the package regions 700A and 700B), which correspond to respective die-level package components 900.

Interposers 200 (see FIG. 4) are attached to the carrier wafer 700. In the illustrated embodiment, one interposer 200 is attached in each package region (such as the package region 700A or 700B) of the carrier wafer 700. In other embodiments, two or more interposers 200 may be attached in each package region of the carrier wafer 700 based on design requirements of the package components 900. The interposers 200 may be active interposers (including active electrical devices, such as SRAM devices, for example), passive interposers (including passive electrical devices, such as capacitors, for example), I/O interposers (including I/O circuitry), or the like. In the illustrated embodiment, the front sides 200F of the interposers 200 are attached to the carrier wafer 700. In other embodiments, the backsides 200B of the interposers 200 are attached to the carrier wafer 700.

In the illustrated embodiment, the interposers 200 are attached to the carrier wafer 700 using a bonding method such as, for example, a fusion bonding. In some embodiments when the carrier wafer 700 comprises a dielectric material, the interposers 200 are attached to the carrier wafer 700 by fusion bonding the dielectric layers 108 at the front sides 200F of the interposers 200 to the carrier wafer 700. In some embodiments when the carrier wafer 700 comprises a semiconductor material, a dielectric layer (not shown) is formed over the carrier wafer 700 and the interposers 200 are attached to the carrier wafer 700 by fusion bonding the dielectric layers 108 at the front sides 200F of the interposers 200 to the dielectric layer formed on the carrier wafer 700. In some embodiments, before the bonding process, bonding surfaces of the interposers 200 (such as the bonding surfaces of the dielectric layers 108) and a bonding surface of the carrier wafer 700 (or a bonding surface of a dielectric layer formed on the carrier wafer 700) are cleaned and subsequently activated using a plasma process (such as, for example, an Ar plasma process). Subsequently, an anneal process may be performed to improve the bonds between the interposers 200 and the carrier wafer 700. In other embodiments, the interposers 200 are attached to the carrier wafer 700 using adhesives.

After attaching the interposers 200 to the carrier wafer 700, an encapsulant 702 is formed on and around the interposers 200. The encapsulant 702 may be a molding compound, epoxy, or the like. The encapsulant 702 may be applied by compression molding, transfer molding, or the like, and is formed over the carrier wafer 700 such that the interposers 200 are buried or covered. The encapsulant 702 may be applied in liquid or semi-liquid form and then subsequently cured. The encapsulant 702 may be thinned to expose the dielectric layers 112 and the die connectors 114 at the backsides 200B of the interposers 200. The thinning process may be a grinding process, a CMP, an etch-back, combinations thereof, or the like. After the thinning process, the top surfaces of the dielectric layers 112, the die connectors 114, and the encapsulant 702 are coplanar (within process variations) such that they are level with one another.

After forming the encapsulant 702, backsides 50BS of integrated circuit dies 50 (e.g., a first integrated circuit die 50A and a second integrated circuit die 50B) are attached to a backside 200B of each interposer 200. In the illustrated embodiment, two integrated circuit dies 50 are attached to each interposer 200. In other embodiments, one or more than two integrated circuit dies 50 may attached to each interposer 200 based on design requirements of the package components 900. In some embodiments, the first integrated circuit die 50A is a logic device, such as a CPU, GPU, or the like, and the second integrated circuit die 50B is a memory device, such as DRAM dies, HMC modules, HBM modules, or the like. In some embodiments, the first integrated circuit die 50A is the same type of device (e.g., SoCs) as the second integrated circuit die 50B.

In some embodiments, the integrated circuit dies 50 are attached to respective interposers 200 by a bonding process, such as a hybrid bonding process. In such embodiments, the integrated circuit dies 50 are bonded to the respective interposers 200 by fusion bonding the dielectric layers 66 at the backsides 50BS of the integrated circuit dies 50 to the dielectric layers 112 at the backsides 200B of the respective interposers 200, and fusion bonding the die connectors 62 at the backsides 50BS of the integrated circuit dies 50 to the die connectors 114 at the backsides 200B of the respective interposers 200. In some embodiments, before the bonding process, bonding surfaces of the interposers 200 (such as bonding surfaces of the dielectric layers 112 and the die connectors 114) and the integrated circuit dies 50 (such as bonding surfaces of the dielectric layers 66 and the die connectors 62) are cleaned and subsequently activated using a plasma process (such as, for example, an Ar plasma process). Subsequently, an anneal process may be performed to improve the bonds between the interposers 200 and the integrated circuit dies 50. The integrated circuit dies 50 and respective interposers 200 are electrically coupled through bonded structures that are formed by fusion bonding the die connectors 62 of the integrated circuit dies 50 to the die connectors 114 of the respective interposers 200.

Figure 14:
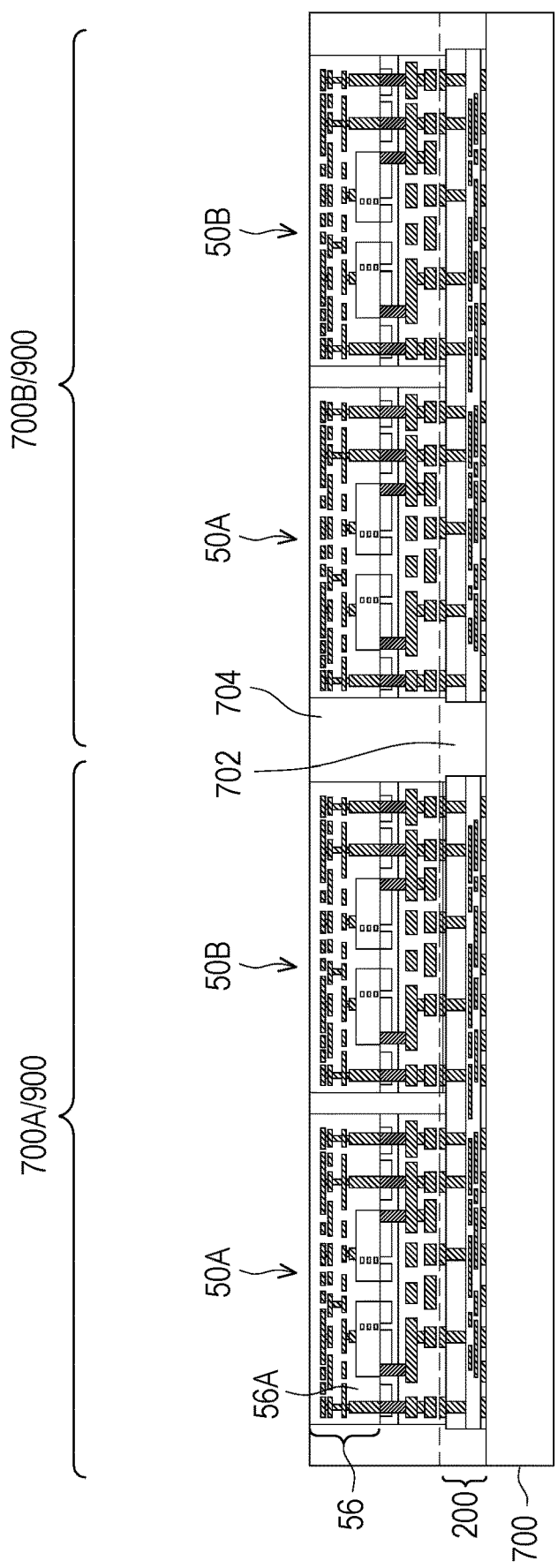

In FIG. 14, an encapsulant 704 is formed on and around the integrated circuit dies 50. After formation, the encapsulant 704 encapsulates the integrated circuit dies 50. The encapsulant 704 may be formed using similar materials and methods as the encapsulant 702 described above with reference to FIG. 13, and the description is not repeated herein. The encapsulant 704 may be thinned to expose the integrated circuit dies 50. The thinning process may be a grinding process, a CMP, an etch-back, combinations thereof, or the like. In some embodiments, the thinning process also removes carriers 60 of the integrated circuit dies 50. After the thinning process, top surfaces of the front-side interconnect structures 56 of the integrated circuit dies 50 and the encapsulant 704 are coplanar (within process variations) such that they are level with one another. In some embodiments, the encapsulant 702 and the encapsulant 704 comprise a same material and an interface between the encapsulant 702 and the encapsulant 704 may not be detectable. In other embodiment, the encapsulant 702 and the encapsulant 704 comprise different materials.

In the illustrated embodiment, the interposers 200 and integrated circuit dies 50 are encapsulated by the encapsulants 702 and 704 in a two-stage process as described above. In other embodiments, the interposers 200 and the integrated circuit dies 50 may be encapsulated in a single-stage process. In such embodiments, the formation of the encapsulant 702 is omitted and the encapsulant 704 is formed after attaching both the interposers 200 and the integrated circuit dies 50 to the carrier wafer 700, such that the encapsulant 704 fills gaps between adjacent interposers 200 as well as gaps between adjacent integrated circuit dies 50.

Figure 15:
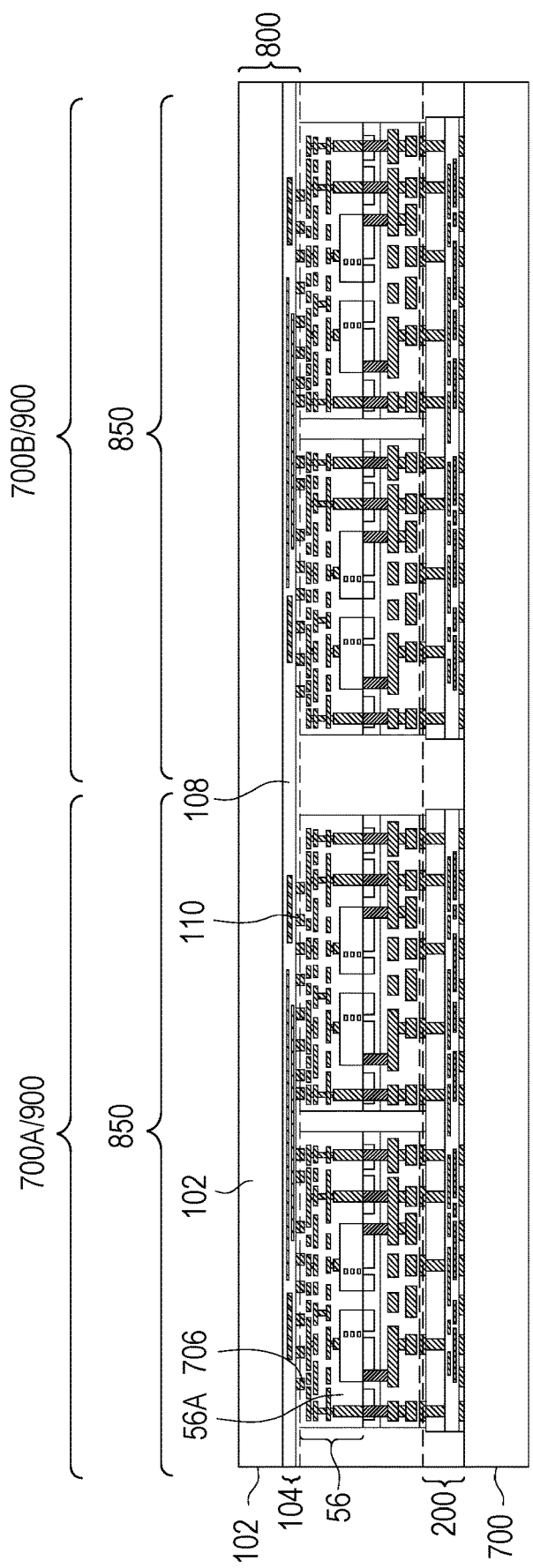

In FIG. 15, an interposer wafer 800 is attached to the integrated circuit dies 50. The interposer wafer 800 may comprise a plurality of die-level interposers 850, such that the die-level interposers 850 correspond to respective package regions of the carrier wafer 700. The interposer wafer 800 may be similar to the interposer wafer 100 (see FIG. 4), with similar features being labeled by similar numerical references, and descriptions of the similar features are not repeated herein. The interposer wafer 800 may be formed using process steps that are similar to the process steps described above with reference to FIGS. 3 and 4, with the distinction that the formation of the conductive vias 106, the dielectric layer 112 and the die connectors 144 are omitted. In some embodiments, the interposers 850 may be active interposers (including active electrical devices, such as SRAM devices, for example), passive interposers (including passive electrical devices, such as capacitors, for example), I/O interposers (including I/O circuitry), an optical or a photonic interposer (including optical devices, such as modulators and/or waveguides, for example), a hybrid (electrical/optical) interposer (including electrical and optical devices), or the like.

In some embodiments, before attaching the interposer wafer 800 to the integrated circuit dies 50, die connectors 706 are formed in uppermost dielectric layers of the front-side interconnect structures 56 of the integrated circuit dies 50 (such as dielectric layers of the front-side interconnect structures 56 that are farthest away from substrates of respective integrated circuit dies 50). In some embodiments, the die connectors 706 may be formed using similar materials and methods as the die connectors 62 described above with reference to FIG. 2, and the description is not repeated herein. In some embodiments, the interposer wafer 800 is attached to the integrated circuit dies 50 by a bonding process, such as a hybrid bonding process. In such embodiments, the interposer wafer 800 is bonded to the integrated circuit dies 50 by fusion bonding the dielectric layer 108 of the interposer wafer 800 to the uppermost dielectric layers of the front-side interconnect structures 56 of the integrated circuit dies 50, and fusion bonding the die connectors 110 of the interposer wafer 800 to the die connectors 706 of the integrated circuit dies 50. In some embodiments, before the bonding process, bonding surfaces of the interposer wafer 800 (such as bonding surfaces of the dielectric layer 108 and the die connectors 110 of the interposer wafer 800) and bonding surfaces of the integrated circuit dies 50 (such as bonding surfaces of the uppermost dielectric layers of the front-side interconnect structures 56 of the integrated circuit dies 50 and bonding surfaces of the die connectors 706 of the integrated circuit dies 50) are cleaned and subsequently activated using a plasma process (such as, for example, an Ar plasma process). Subsequently, an anneal process may be performed to improve the bonds between the interposer wafer 800 and the integrated circuit dies 50. The interposer wafer 800 and the integrated circuit dies 50 are electrically coupled through bonded structures that are formed by fusion bonding the die connectors 110 of the interposer wafer 800 to the die connectors 706 of the integrated circuit dies 50.

Figure 16:
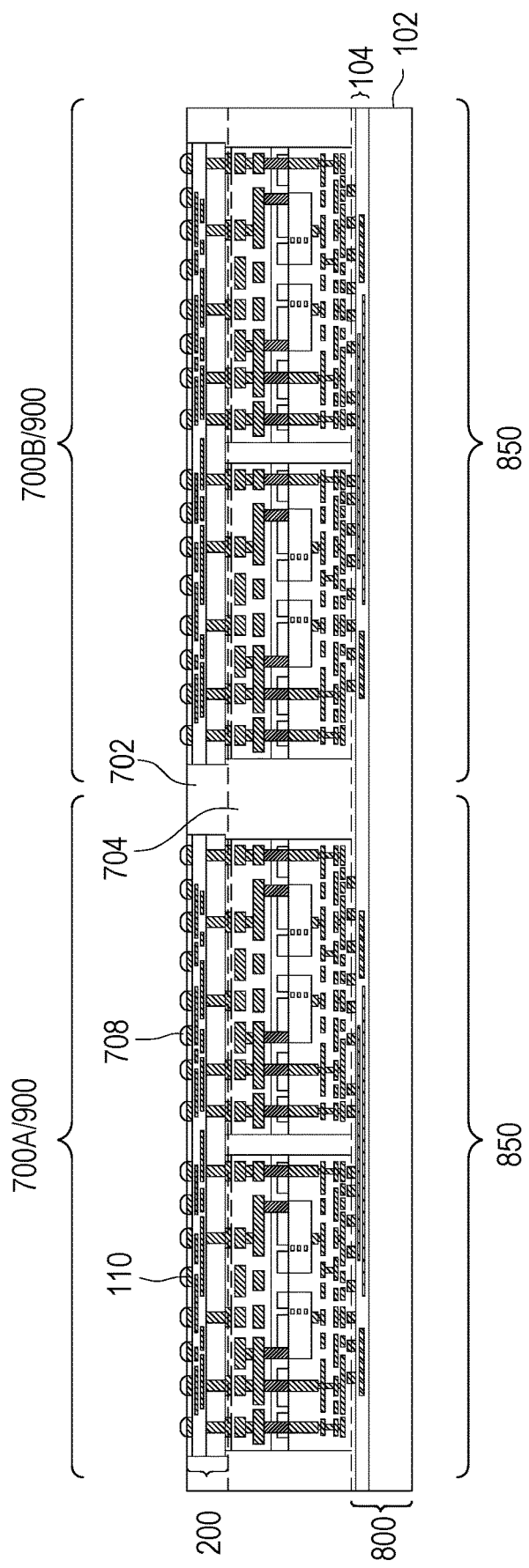

In FIG. 16, after attaching the interposer wafer 800 to the integrated circuit dies 50, the carrier wafer 700 is de-bonded from the interposers 200. Subsequently, conductive connectors 708 are formed on the die connectors 110 of the interposers 200. The conductive connectors 708 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 708 may include a conductive material such as solder, copper, aluminum, gold, nickel, silver, palladium, tin, the like, or a combination thereof. In some embodiments, the conductive connectors 708 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 708 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 17:
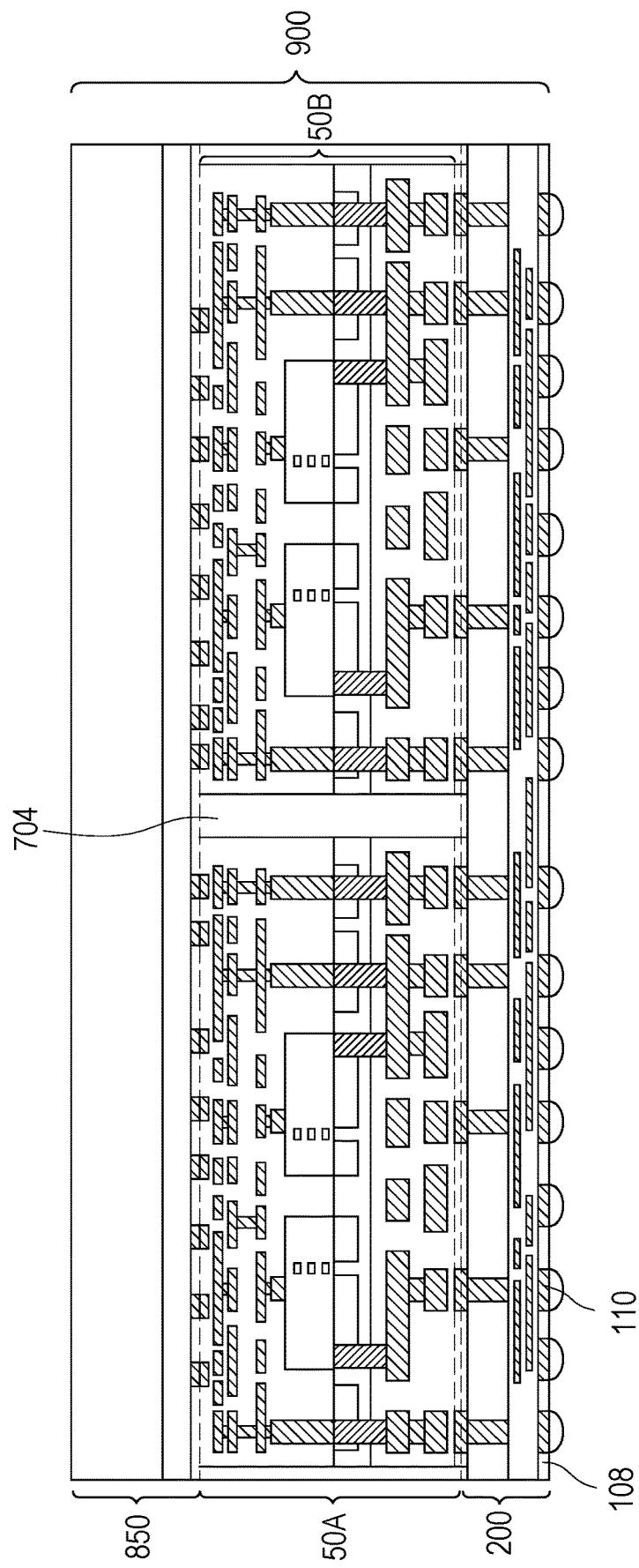

Further, a singulation process is performed on the resulting wafer level structure by cutting along scribe line regions, e.g., around the package regions 700A and 700B. The singulation process may include sawing, etching, dicing, a combination thereof, or the like. For example, the singulation process can include sawing the encapsulants 702 and 704, and the interconnect structure 104 and the substrate 102 of the interposer wafer 800. The singulation process singulates the package regions (such as the package region 700A) from adjacent package regions (such as the package region 700B) to form singulated package components 900. Such a package component 900 is illustrated in FIG. 17. The singulation process further forms interposers 850 from the singulated portions of the interposer wafer 800. As a result of the singulation process, the outer sidewalls of the interposer 850 and the encapsulant 704 are laterally coterminous (within process variations) as illustrated in FIG. 17.

Figure 18:
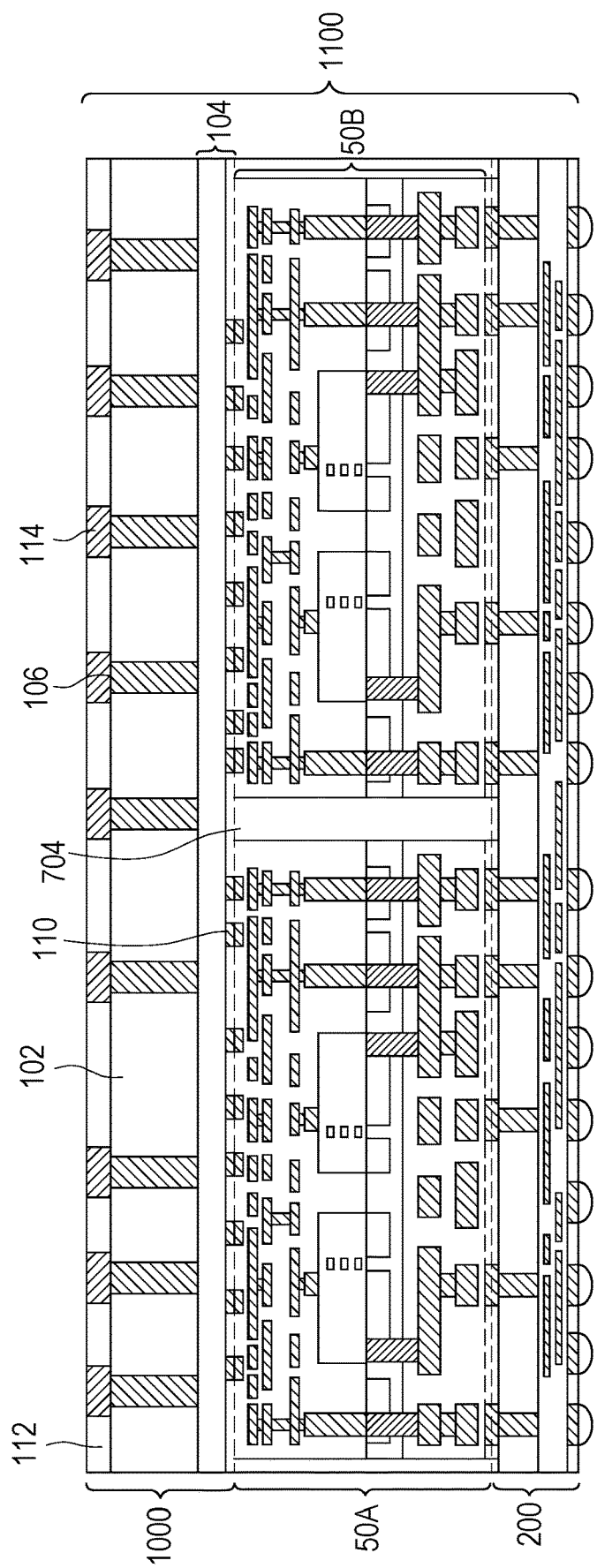
FIG. 18 illustrates a cross-sectional view of a package component, in accordance with some embodiments.

FIG. 18 illustrates a cross-sectional view of a package component 1100, in accordance with some embodiments.

The package component 1100 is similar to package component 900, with similar features being labeled by similar numerical references, and descriptions of the similar features are not repeated herein. In contrast with the package component 900, the package component 1100 comprises an interposer 1000 instead of the interposer 850. The interposer 1000 is similar to the interposer 850, with similar features being labeled by similar numerical references, and descriptions of the similar features are not repeated herein. In contrast with the interposer 850, the interposer 1000 comprises conductive vias 106, a dielectric layer 112, and die connectors 114. The conductive vias 106, the dielectric layer 112, and the die connectors 114 may be formed as described above with reference to FIG. 4, and the description is not repeated herein.

Figure 19:
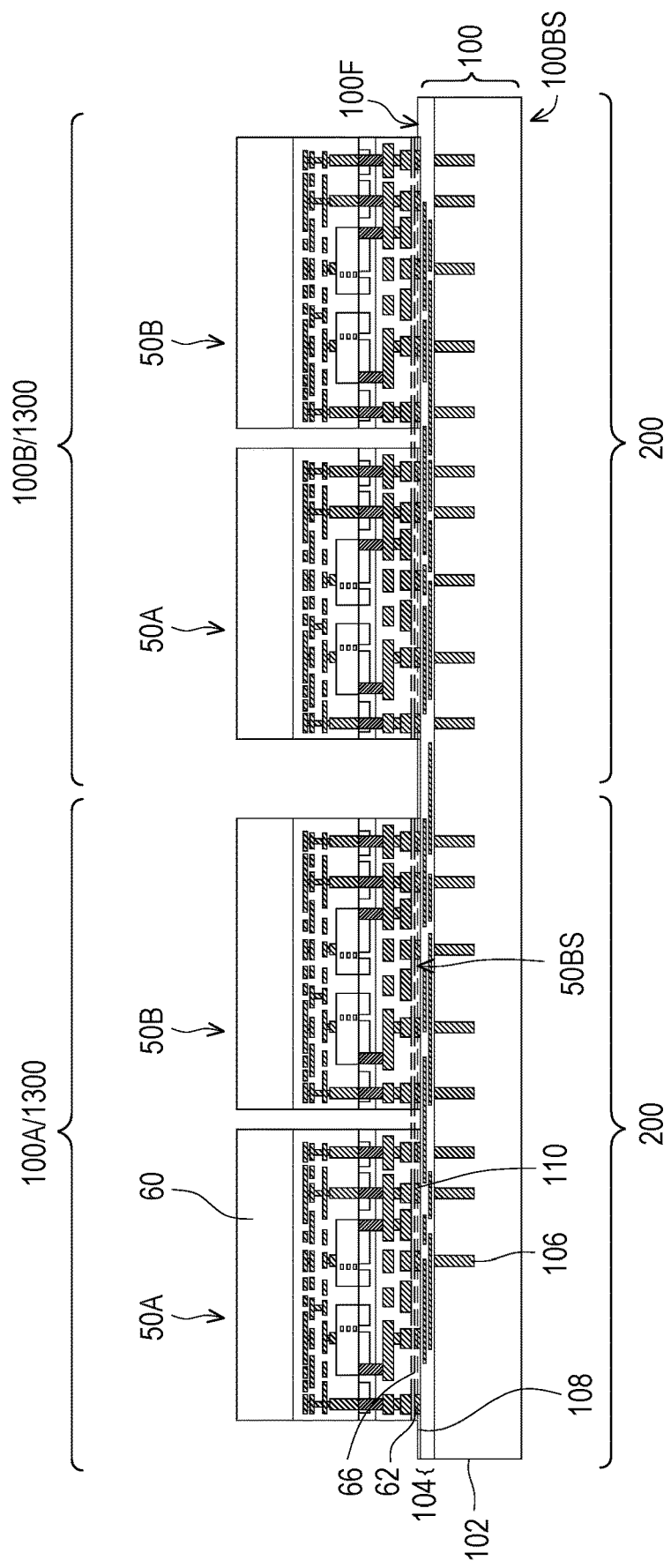
FIGS. 19-23 illustrate cross-sectional views of intermediate stages in the manufacturing of package components, in accordance with some embodiments.

FIGS. 19-23 illustrate cross-sectional views of intermediate stages in the manufacturing of package components 1300, in accordance with some embodiments. In FIG. 19, an interposer wafer 100 is obtained or formed. The interposer wafer 100 may be formed as described above with reference to FIG. 3, and the description is not repeated herein. The interposer wafer 100 comprises a plurality of package regions (such as the package regions 100A and 100B), which will be singulated in subsequent processing to be included in a package component 1300. The interposer wafer 100 comprises an interposer 200 in each of the package regions (such as the package regions 100A and 100B).

Backsides 50BS of integrated circuit dies 50 (e.g., a first integrated circuit die 50A and a second integrated circuit die 50B) are attached to a front side 100F of the interposer wafer 100 in each package region. In the illustrated embodiment, two integrated circuit dies 50 are attached in each package region. In other embodiments, one or more than two integrated circuit dies 50 are attached in each package region of the interposer wafer 100 based on design requirements of the package components 1300. In some embodiments, the first integrated circuit die 50A is a logic device, such as a CPU, GPU, or the like, and the second integrated circuit die 50B is a memory device, such as DRAM dies, HMC modules, HBM modules, or the like. In some embodiments, the first integrated circuit die 50A is the same type of device (e.g., SoCs) as the second integrated circuit die 50B.

In some embodiments, the integrated circuit dies 50 are attached to the interposer wafer 100 by a bonding process, such as a hybrid bonding process. In such embodiments, the integrated circuit dies 50 are bonded to the interposer wafer 100 by fusion bonding the dielectric layers 66 at the backsides 50BS of the integrated circuit dies 50 to the dielectric layer 108 at the front side 100F of the interposer wafer 100, and fusion bonding the die connectors 62 at the backsides 50BS of the integrated circuit dies 50 to the die connectors 110 at the front side 100F of the interposer wafer 100. In some embodiments, before the bonding process, bonding surfaces of the interposer wafer 100 (such as bonding surfaces of the dielectric layer 108 and the die connectors 110) and bonding surfaces of the integrated circuit dies 50 (such as bonding surfaces of the dielectric layers 66 and the die connectors 62) are cleaned and subsequently activated using a plasma process (such as, for example, an Ar plasma process). Subsequently, an anneal process may be performed to improve the bonds between the interposer wafer 100 and the integrated circuit dies 50. The interposer wafer 100 and the integrated circuit dies 50 are electrically coupled through bonded structures that are formed by fusion bonding the die connectors 110 of the interposer wafer 100 to the die connectors 62 of the integrated circuit dies 50.

Figure 20:
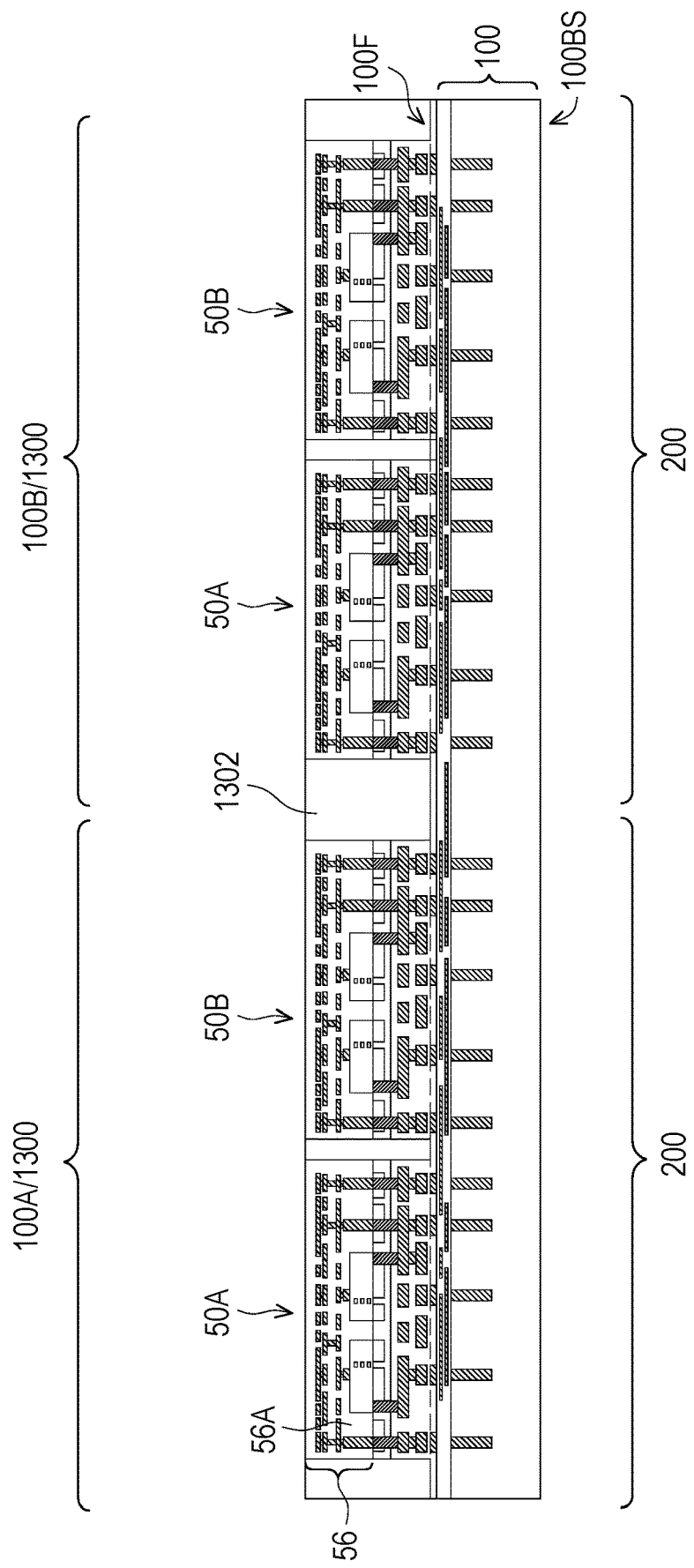

In FIG. 20, an encapsulant 1302 is formed on and around the integrated circuit dies 50. After formation, the encapsulant 1302 encapsulates the integrated circuit dies 50. The encapsulant 1302 may be formed using similar materials and methods as the encapsulant 702 described above with reference to FIG. 13, and the description is not repeated herein. The encapsulant 1302 may be thinned to expose the integrated circuit dies 50. The thinning process may be a grinding process, a CMP, an etch-back, combinations thereof, or the like. In some embodiments, the thinning process also removes the carriers 60 of the integrated circuit dies 50. After the thinning process, top surfaces of the front-side interconnect structures 56 of the integrated circuit dies 50 and the encapsulant 1302 are coplanar (within process variations) such that they are level with one another.

Figure 21:
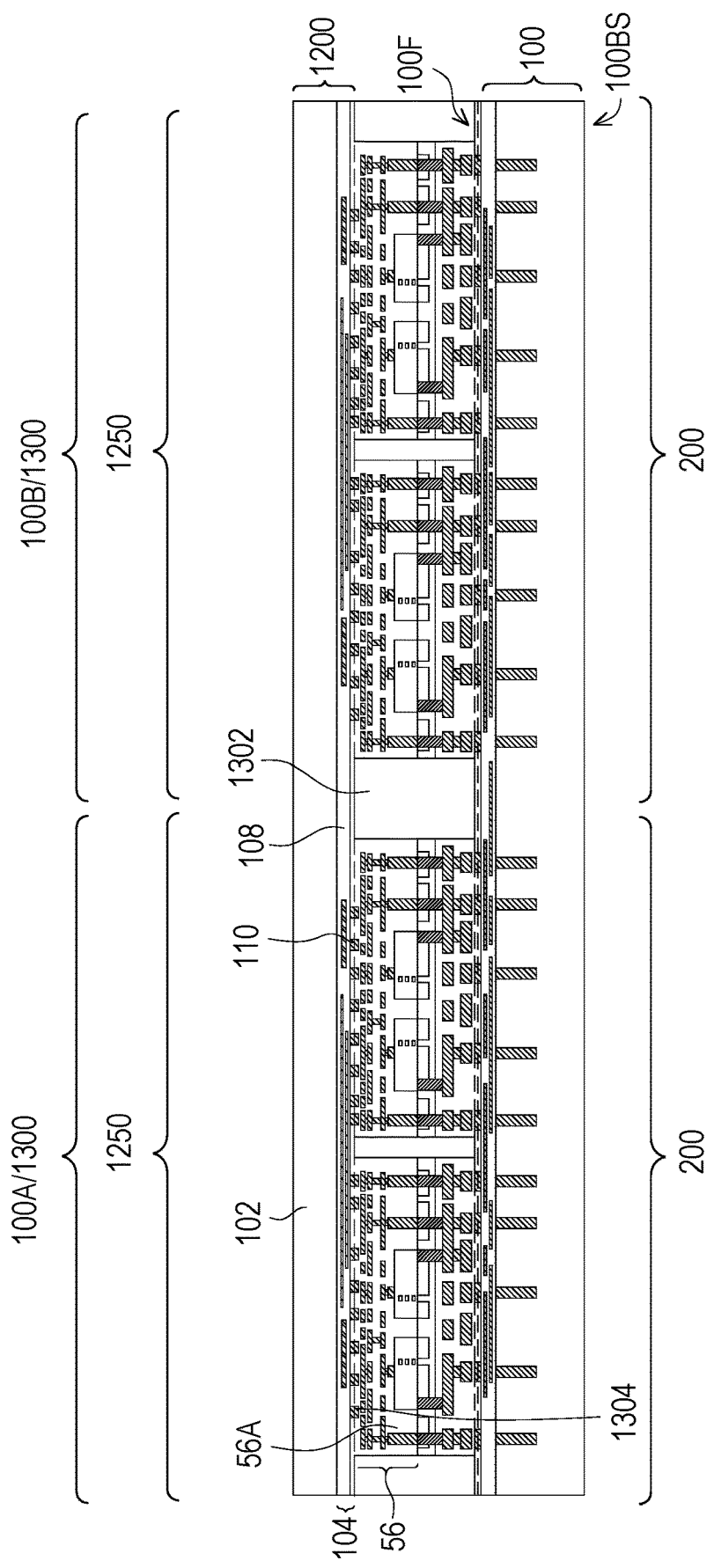

In FIG. 21, an interposer wafer 1200 is attached to the integrated circuit dies 50. The interposer wafer 1200 may comprise a plurality of die-level interposers 1205, such that the die-level interposers 1250 correspond to respective package regions of the interposer wafer 100. The interposer wafer 1200 may be similar to the interposer wafer 100 (see FIG. 4), with similar features being labeled by similar numerical references, and descriptions of the similar features are not repeated herein. The interposer wafer 1200 may be formed using process steps that are similar to the process steps described above with reference to FIGS. 3 and 4, with the distinction that the formation of the conductive vias 106, the dielectric layer 112 and the die connectors 114 is omitted. In some embodiments, the interposers 1250 may be active interposers (including active electrical devices, such as SRAM devices, for example), passive interposers (including passive electrical devices, such as capacitors, for example), I/O interposers (including I/O circuitry), optical or photonic interposers (including optical devices, such as modulators and/or waveguides, for example), hybrid (electrical/optical) interposers (including electrical and optical devices), or the like.

In some embodiments, before attaching the interposer wafer 1200 to the integrated circuit dies 50, die connectors 1304 are formed in uppermost dielectric layers of the front-side interconnect structures 56 of the integrated circuit dies 50 (such as dielectric layers of the front-side interconnect structures 56 that are farthest away from substrates of respective integrated circuit dies 50). In some embodiments, the die connectors 1304 may be formed using similar materials and methods as the die connectors 62 described above with reference to FIG. 2, and the description is not repeated herein. In some embodiments, the interposer wafer 1200 is attached to the integrated circuit dies 50 by a bonding process, such as a hybrid bonding process. In such embodiments, the interposer wafer 1200 is bonded to the integrated circuit dies 50 by fusion bonding the dielectric layer 108 of the interposer wafer 1200 to the uppermost dielectric layers of the front-side interconnect structures 56 of the integrated circuit dies 50, and fusion bonding the die connectors 110 of the interposer wafer 1200 to the die connectors 1304 of the integrated circuit dies 50. In some embodiments, before the bonding process, bonding surfaces of the interposer wafer 1200 (such as bonding surfaces of the dielectric layer 108 and the die connectors 110 of the interposer wafer 1200) and bonding surfaces of the integrated circuit dies 50 (such as bonding surfaces of the uppermost dielectric layers of the front-side interconnect structures 56 of the integrated circuit dies 50 and bonding surfaces of the die connectors 1304 of the integrated circuit dies 50) are cleaned and subsequently activated using a plasma process (such as, for example, an Ar plasma process). Subsequently, an anneal process may be performed to improve the bonds between the interposer wafer 1200 and the integrated circuit dies 50. The interposer wafer 1200 and the integrated circuit dies 50 are electrically coupled through bonded structures that are formed by fusion bonding the die connectors 110 of the interposer wafer 1200 to the die connectors 1304 of the integrated circuit dies 50.

Figure 22:
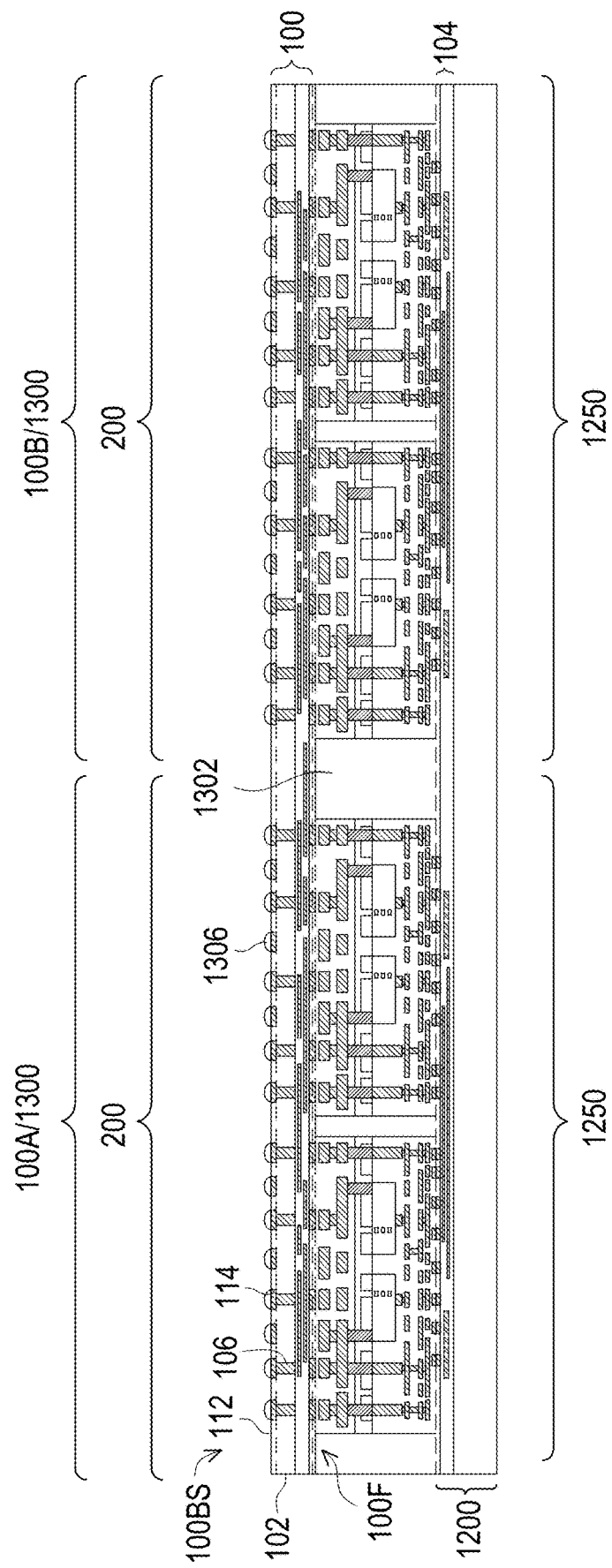

In FIG. 22, the backside 100BS of the interposer wafer 100 is thinned to expose the conductive vias 106. Exposure of the conductive vias 106 may be accomplished by performing a thinning process (such as a grinding process, a CMP, an etch-back, combinations thereof, or the like) on the substrate 102. In some embodiments (not separately illustrated), the thinning process for exposing the conductive vias 106 includes a CMP, and the conductive vias 106 protrude at the backside 100BS of the interposer wafer 100 as a result of dishing that occurs during the CMP. In such embodiments, an insulating layer (not separately illustrated) may optionally be formed on the back surface of the substrate 102, surrounding the protruding portions of the conductive vias 106. The insulating layer may be formed of a silicon-containing insulator, such as, silicon nitride, silicon oxide, silicon oxynitride, or the like, and may be formed by a suitable deposition method such as spin coating, CVD, PECVD, HDP-CVD, or the like. After the substrate 102 is thinned, the exposed surfaces of the conductive vias 106 and the insulating layer (if present) or the substrate 102 are coplanar (within process variations) such that they are level with one another, and are exposed at the back-side of the interposer wafer 100.

After thinning the interposer wafer 100, a dielectric layer 112 and die connectors 114 are formed at the backside 100BS of the interposer wafer 100. In some embodiments, the dielectric layer 112 and the die connectors 114 are formed as described above with reference to FIG. 4, and the description is not repeated herein. Subsequently, conductive connectors 1306 are formed on the die connectors 114 of the interposer wafer 100. The conductive connectors 1306 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 1306 may be formed using similar materials and methods as conductive connectors 708 described above with reference to FIG. 16, and the description is not repeated herein.

Figure 23:
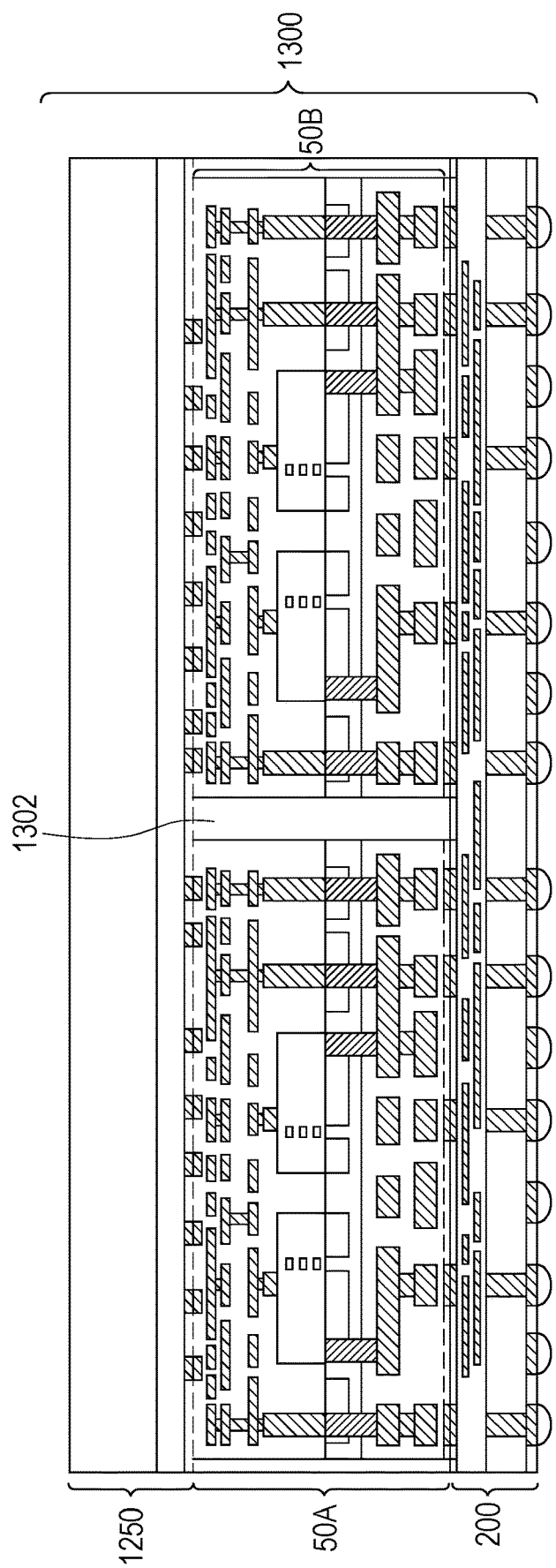

Further, a singulation process is performed on the resulting wafer-level structure by cutting along scribe line regions, e.g., around the package regions 100A and 100B. The singulation process may include sawing, etching, dicing, a combination thereof, or the like. For example, the singulation process can include sawing the encapsulant 1302, the interconnect structure 104 and the substrate 102 of the interposer wafer 100, and the interconnect structure 104 and the substrate 102 of the interposer wafer 1200. The singulation process singulates package regions (such as the package region 100A) from adjacent package regions (such as the package region 100B) to form singulated package components 1300. Such a package component 1300 is illustrated in FIG. 23. The singulation process further forms interposers 200 from the singulated portions of the interposer wafer 100 and interposers 1250 from the singulated portions of the interposer wafer 1200. As a result of the singulation process, the outer sidewalls of the interposer 200, the interposer 1250, and the encapsulant 1302 are laterally coterminous (within process variations) as illustrated in FIG. 23.

Figure 24:
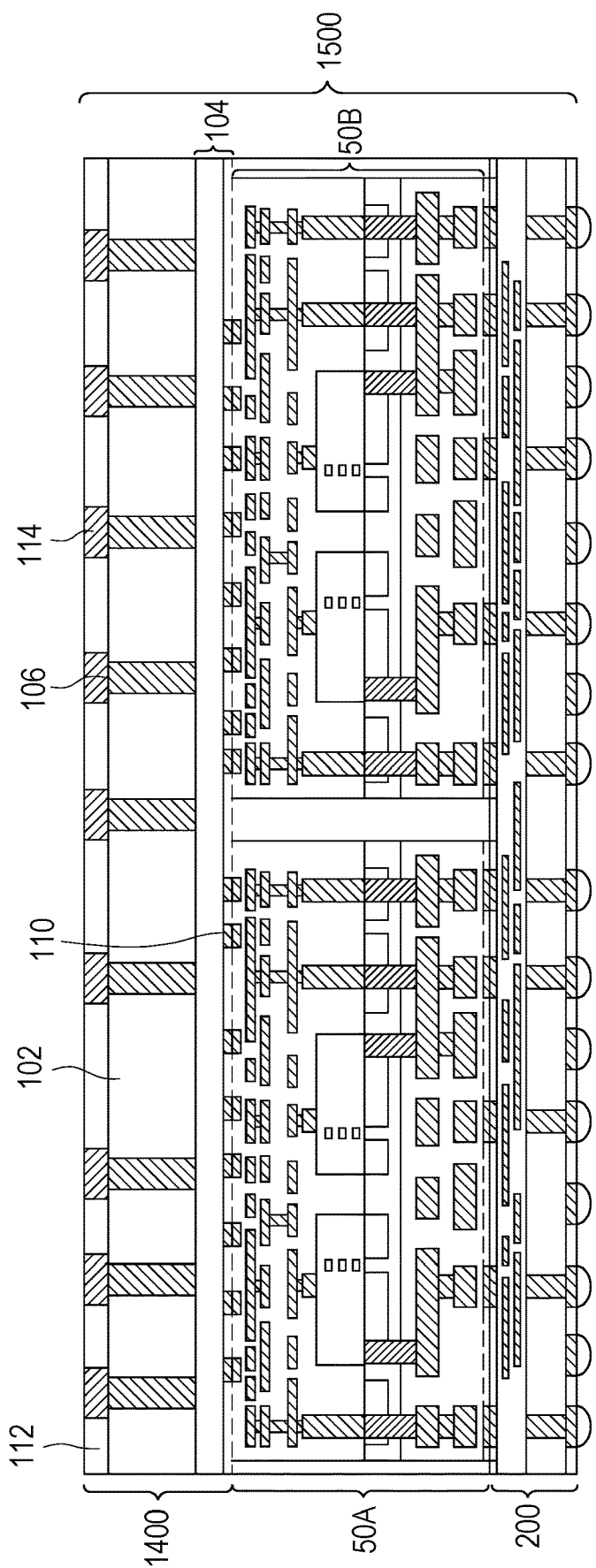
FIG. 24 illustrates a cross-sectional view of a package component, in accordance with some embodiments.

FIG. 24 illustrates a cross-sectional view of a package component 1500, in accordance with some embodiments. The package component 1500 is similar to package component 1300 (see FIG. 23), with similar features being labeled by similar numerical references, and descriptions of the similar features are not repeated herein. In contrast with the package component 1300, the package component 1500 comprises an interposer 1400 instead of the interposer 1250. The interposer 1400 is similar to the interposer 1250, with similar features being labeled by similar numerical references, and descriptions of the similar features are not repeated herein. In contrast with the interposer 1250, the interposer 1400 comprise conductive vias 106, a dielectric layer 112, and die connectors 114. The conductive vias 106, the dielectric layer 112, and the die connectors 114 may be formed as described above with reference to FIG. 4, and the description is not repeated herein.

Figure 25:
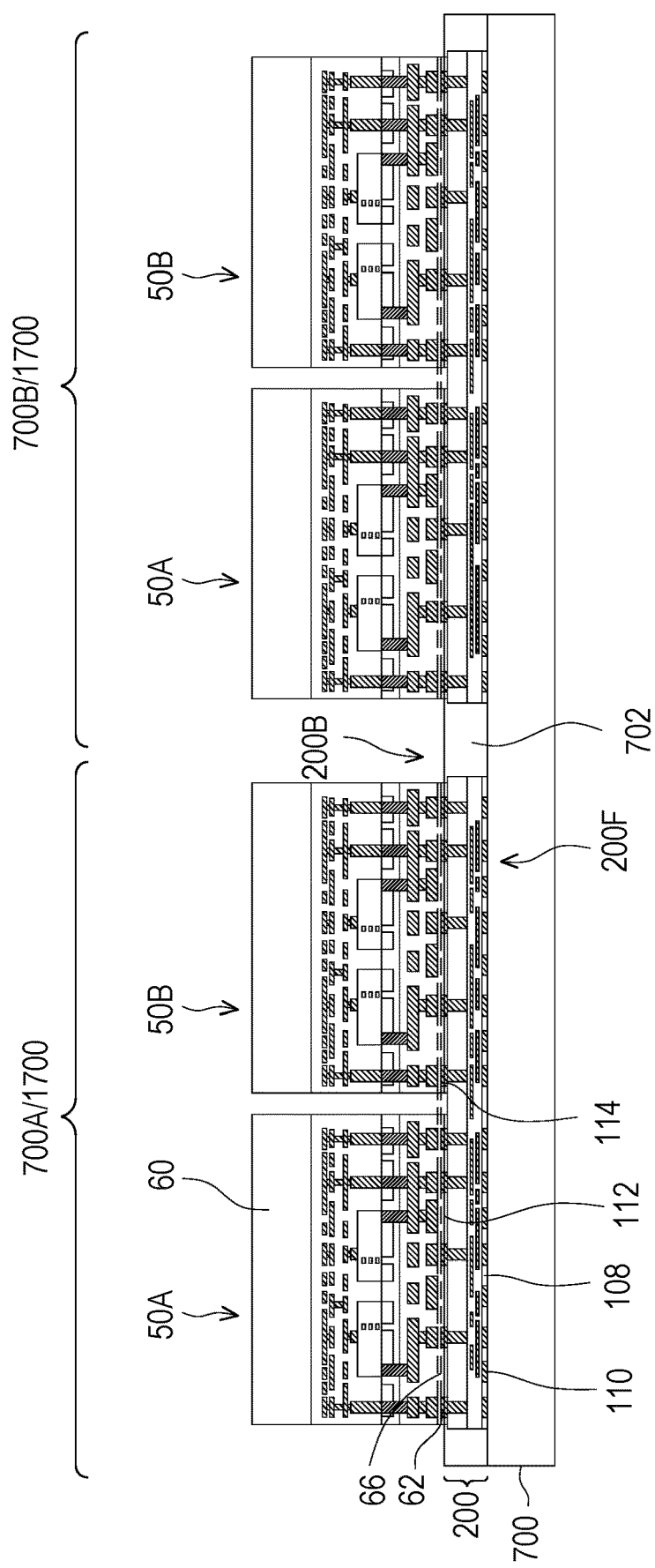
FIGS. 25-30 illustrate cross-sectional views of intermediate stages in the manufacturing of package components, in accordance with some embodiments.

FIGS. 25-30 illustrate cross-sectional views of intermediate stages in the manufacturing of package components 1700, in accordance with some embodiments. In FIG. 25, a carrier wafer 700 is provided or formed. The carrier wafer 700 is used as a platform or a support for a packaging process described below. In some embodiments, the carrier wafer 700 comprises a semiconductor material (such as silicon, or the like), a dielectric material (such as quartz, or the like), a combination thereof, or the like. As described below in greater detail, a wafer-level package component is formed over the carrier wafer, which is singulated in subsequent processing into individual die-level package components 1700. In particular, the carrier wafer 700 comprises a plurality of package regions (such as the package regions 700A and 700A), which correspond to respective die-level package components 1700.

Interposers 200 (see FIG. 3) are attached to the carrier wafer 700. In the illustrated embodiment, one interposer 200 is attached in each package region (such as the package region 700A or 700B) of the carrier wafer 700. In other embodiments, two or more interposers 200 may be attached in each package region of the carrier wafer 700 based on design requirements of the package components 1700. The interposers 200 may be active interposers (including active electrical devices, such as SRAM devices, for example), passive interposers (including passive electrical devices, such as capacitors, for example), I/O interposers (including I/O circuitry), or the like. In some embodiments, the interposers 200 are attached to the carrier wafer 700 using a bonding method as described above with reference to FIG. 13, and the description is not repeated herein.

After attaching the interposers 200 to the carrier wafer 700, an encapsulant 702 is formed on and around the interposers 200 as described above with reference to FIG. 13, and the description is not repeated herein. The encapsulant 702 may be thinned to expose the dielectric layers 112 and the die connectors 114 at the backsides 200B of the interposers 200. The thinning process may be a grinding process, a CMP, an etch-back, combinations thereof, or the like. After the thinning process, the top surfaces of the dielectric layers 112, the die connectors 114, and the encapsulant 702 are coplanar (within process variations) such that they are level with one another.

After forming the encapsulant 702, integrated circuit dies 50 (e.g., a first integrated circuit die 50A and a second integrated circuit die 50B) are attached to each interposer 200. In the illustrated embodiment, two integrated circuit dies 50 are attached to each interposer 200. In other embodiments, one or more than two integrated circuit dies 50 are attached to each interposer 200 based on design requirements of the package components 1700. In some embodiments, the first integrated circuit die 50A is a logic device, such as a CPU, GPU, or the like, and the second integrated circuit die 50B is a memory device, such as DRAM dies, HMC modules, HBM modules, or the like. In some embodiments, the first integrated circuit die 50A is the same type of device (e.g., SoCs) as the second integrated circuit die 50B. In some embodiments, the integrated circuit dies 50 are attached to respective interposers 200 by a bonding process as described above with reference to FIG. 13, and the description is not repeated herein.

Figure 26:
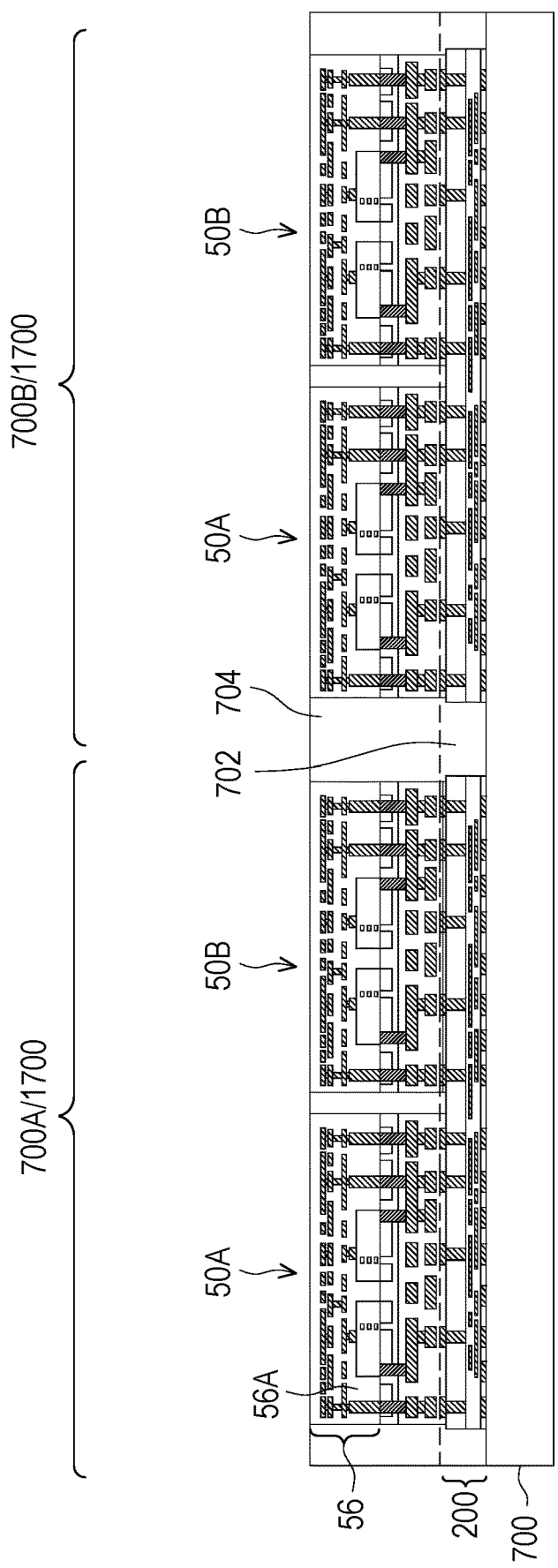

In FIG. 26, an encapsulant 704 is formed on and around the integrated circuit dies 50 as described above with reference to FIG. 14, and the description is not repeated herein. After formation, the encapsulant 704 encapsulates the integrated circuit dies 50. The encapsulant 704 may be thinned to expose the integrated circuit dies 50. The thinning process may be a grinding process, a CMP, an etch-back, combinations thereof, or the like. In some embodiments, the thinning process also removes the carriers 60 of the integrated circuit dies 50. After the thinning process, top surfaces of the front-side interconnect structures 56 of the integrated circuit dies 50 and the encapsulant 704 are coplanar (within process variations) such that they are level with one another. In some embodiments, the encapsulant 702 and the encapsulant 704 comprise a same material and an interface between the encapsulant 702 and the encapsulant 704 may not be detectable. In other embodiment, the encapsulant 702 and the encapsulant 704 comprise different materials.

In the illustrated embodiment, the interposers 200 and the integrated circuit dies 50 are encapsulated by the encapsulants 702 and 704 in a two-stage process as described above. In other embodiments, the interposers 200 and the integrated circuit dies 50 may be encapsulated in a single-stage process. In such embodiments, the formation of the encapsulant 702 is omitted and the encapsulant 704 is formed after attaching both the interposers 200 and the integrated circuit dies 50 to the carrier wafer 700, such that the encapsulant 704 fills gaps between adjacent interposers 200 as well as gaps between adjacent integrated circuit dies 50.

Figure 27:
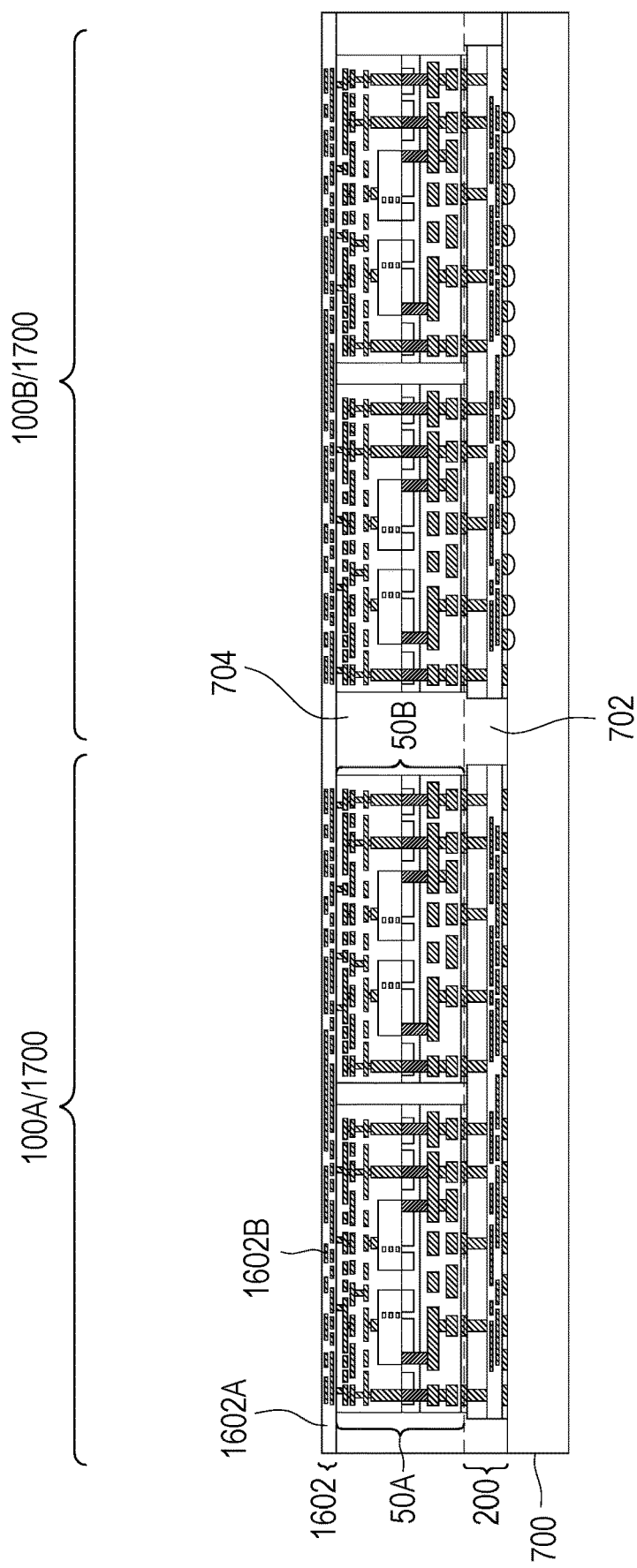
Figure 28:
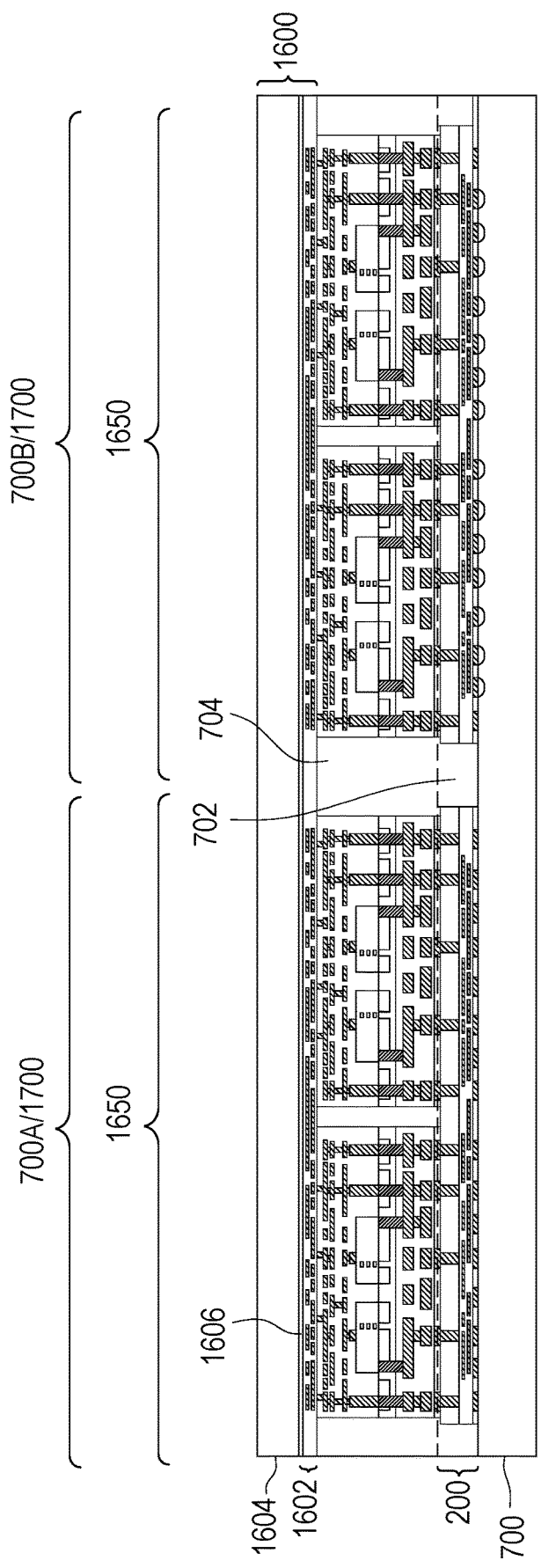

In FIGS. 27 and 28, an interposer wafer 1600 is formed over the integrated circuit dies 50 and the encapsulant 704. The interposer wafer 1600 may comprise a plurality of die-level interposers 1650, such that the die-level interposers 1650 correspond to respective package regions of the carrier wafer 700. In some embodiments, the interposers 1650 may be active interposers (including active electrical devices, such as SRAM devices, for example), passive interposers (including passive electrical devices, such as capacitors, for example), I/O interposers (including I/O circuitry), optical or photonic interposers (including optical devices, such as modulators and/or waveguides, for example), hybrid (electrical/optical) interposer s (including electrical and optical devices), or the like.

In FIG. 27, an interconnect structure 1602 of the interposer wafer 1600 is formed over the integrated circuit dies 50 and the encapsulant 704. The interconnect structure 1602 may include one or more dielectric layer(s) 1602A and respective metallization layer(s) 1602B (including conductive lines and vias) in the dielectric layer(s) 1602A. Acceptable dielectric materials for the dielectric layers 1602A include low-k dielectric materials such as phospho-silicate glass (PSG), boro-silicate glass (BSG), boron-doped phospho-silicate glass (BPSG), undoped silicate glass (USG), or the like. Acceptable dielectric materials for the dielectric layers 1602A further include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layers 1602B may be formed of a conductive material, such as a metal, such as copper, cobalt, aluminum, gold, combinations thereof, or the like. The interconnect structure 1602 may be formed by a damascene process, such as a single damascene process, a dual damascene process, or the like.

In FIG. 28, a semiconductor substrate 1604 of the interposer wafer 1600 is attached to the interconnect structure 1602 of the interposer wafer 1600. The semiconductor substrate 1604 may be formed using similar materials and methods as the semiconductor substrate 52 described above with reference to FIG. 1, and the description is not repeated herein.

In the illustrated embodiment, the semiconductor substrate 1604 is attached to the interconnect structure 1602 by a bonding method, such as a fusion bonding method. In some embodiments, before bonding the semiconductor substrate 1604 to the interconnect structure 1602, a dielectric layer 1606 is formed on the semiconductor substrate 1604. Subsequently, the semiconductor substrate 1604 is bonded to the interconnect structure 1602 by fusion bonding the dielectric layer 1606 to an uppermost dielectric layer of the interconnect structure 1602 (such as a dielectric layer of the interconnect structure 1602 that is closest to the semiconductor substrate 1604). In some embodiments, before the bonding process, a bonding surface of the semiconductor substrate 1604 (such as a bonding surface of the dielectric layer 1606) and a bonding surface of the interconnect structure 1602 (such as a bonding surface of the uppermost dielectric layer of the interconnect structure 1602) are cleaned and subsequently activated using a plasma process (such as, for example, an Ar plasma process). Subsequently, an anneal process may be performed to improve the bonds between the interconnect structure 1602 and the semiconductor substrate 1604.

Figure 29:
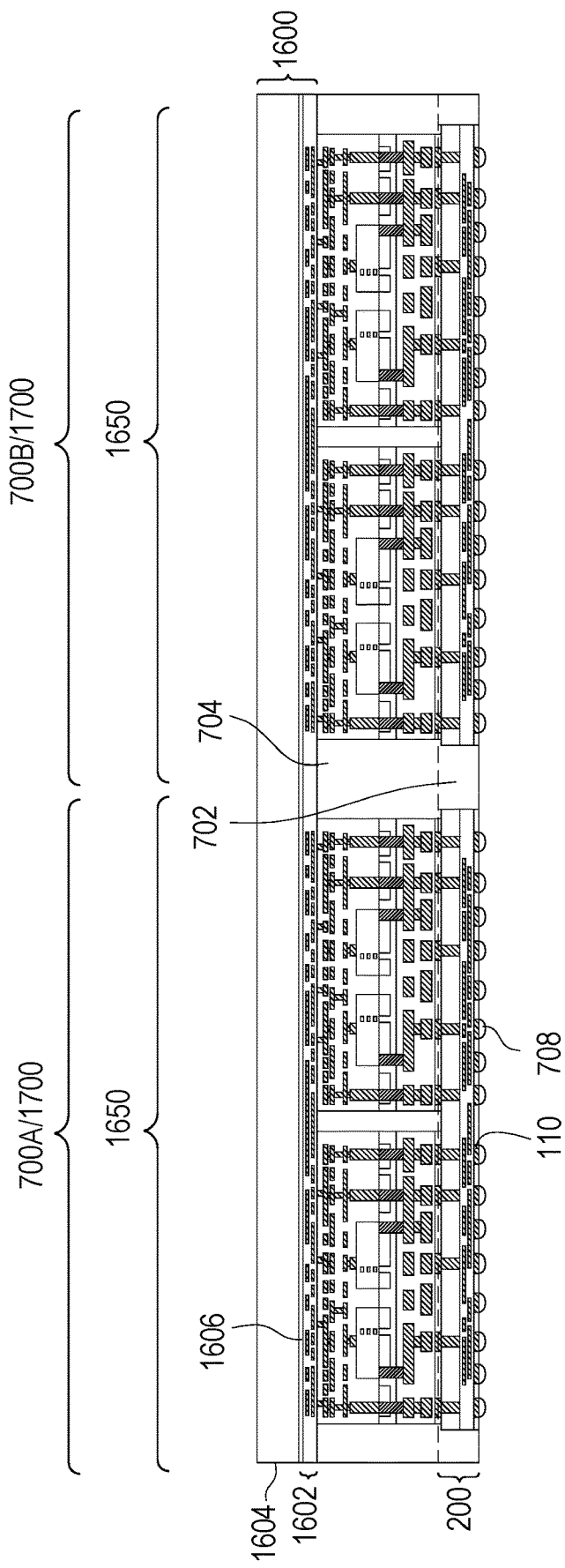

In FIG. 29, after forming the interposer wafer 1600 over the integrated circuit dies 50 and the encapsulant 704, the carrier wafer 700 is de-bonded from the interposers 200. Subsequently, conductive connectors 708 are formed on the die connectors 110 of the interposers 200 as described above with reference to FIG. 16, and the description is not repeated herein.

Figure 30:
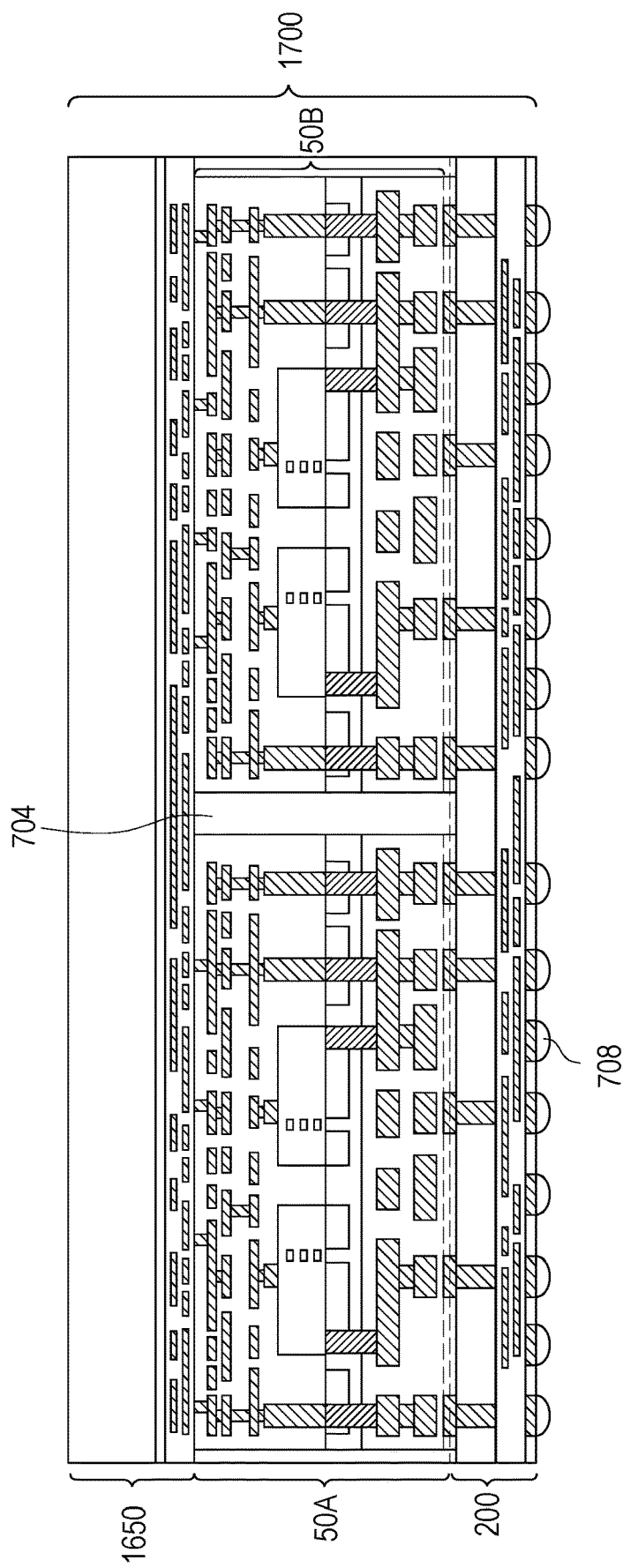

Further, a singulation process is performed on the resulting wafer level structure by cutting along scribe line regions, e.g., around the package regions 700A and 700B. The singulation process may include sawing, etching, dicing, a combination thereof, or the like. For example, the singulation process can include sawing the encapsulants 702 and 704, and the interconnect structure 1602 and the semiconductor substrate 1604 of the interposer wafer 1600. The singulation process singulates the package regions (such as the package region 700A) from adjacent package regions (such as the package region 700B) to form singulated package components 1700. Such a package component 1700 is illustrated in FIG. 30. The singulation process further forms interposers 1650 from the singulated portions of the interposer wafer 1600. As a result of the singulation process, the outer sidewalls of the interposer 1650, the interposer 200, and the encapsulant 704 are laterally coterminous (within process variations) as illustrated in FIG. 30.

Figure 31:
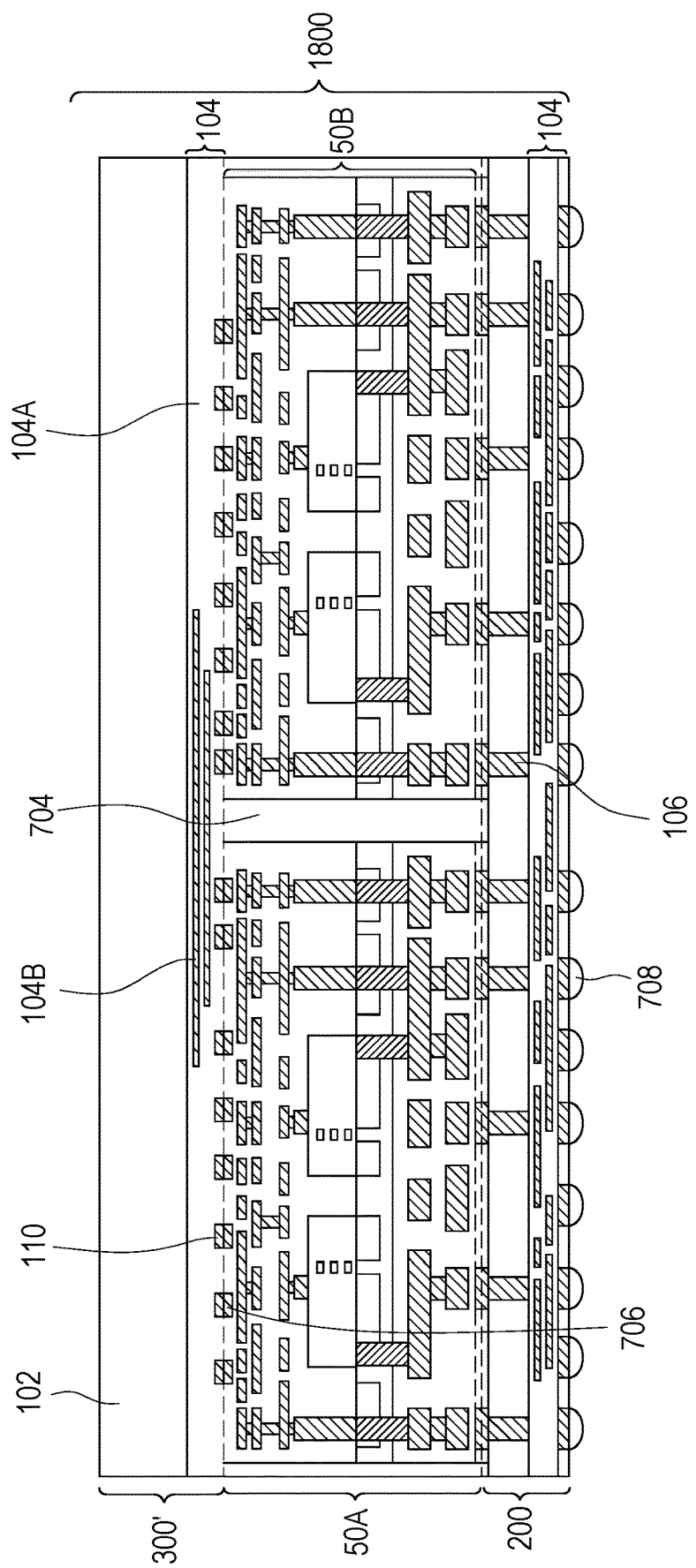
FIG. 31 illustrates a cross-sectional view of a package component, in accordance with some embodiments.

FIG. 31 illustrates a cross-sectional view of a package component 1800, in accordance with some embodiments. The package component 1800 is similar to the package component 900 (see FIG. 17), with similar features being labeled with similar numerical references, and descriptions of the similar features are not repeated herein. In contrast with the package component 900, the package component 1800 comprises the interposer 300' (see FIG. 6) instead of the interposer 850 (see FIG. 17). The integrated circuit dies 50A and 50B are electrically coupled through the interposer 300', such as through the interconnect structure 104 and/or the passive electrical devices (not shown) of the interposer 300'. The integrated circuit dies 50A and 50B are further electrically coupled through the interposer 200, such as through conductive vias 106, the interconnect structure 104, and/or the active/passive electrical devices (not shown) of the interposer 200.

Figures 32A, 32B:
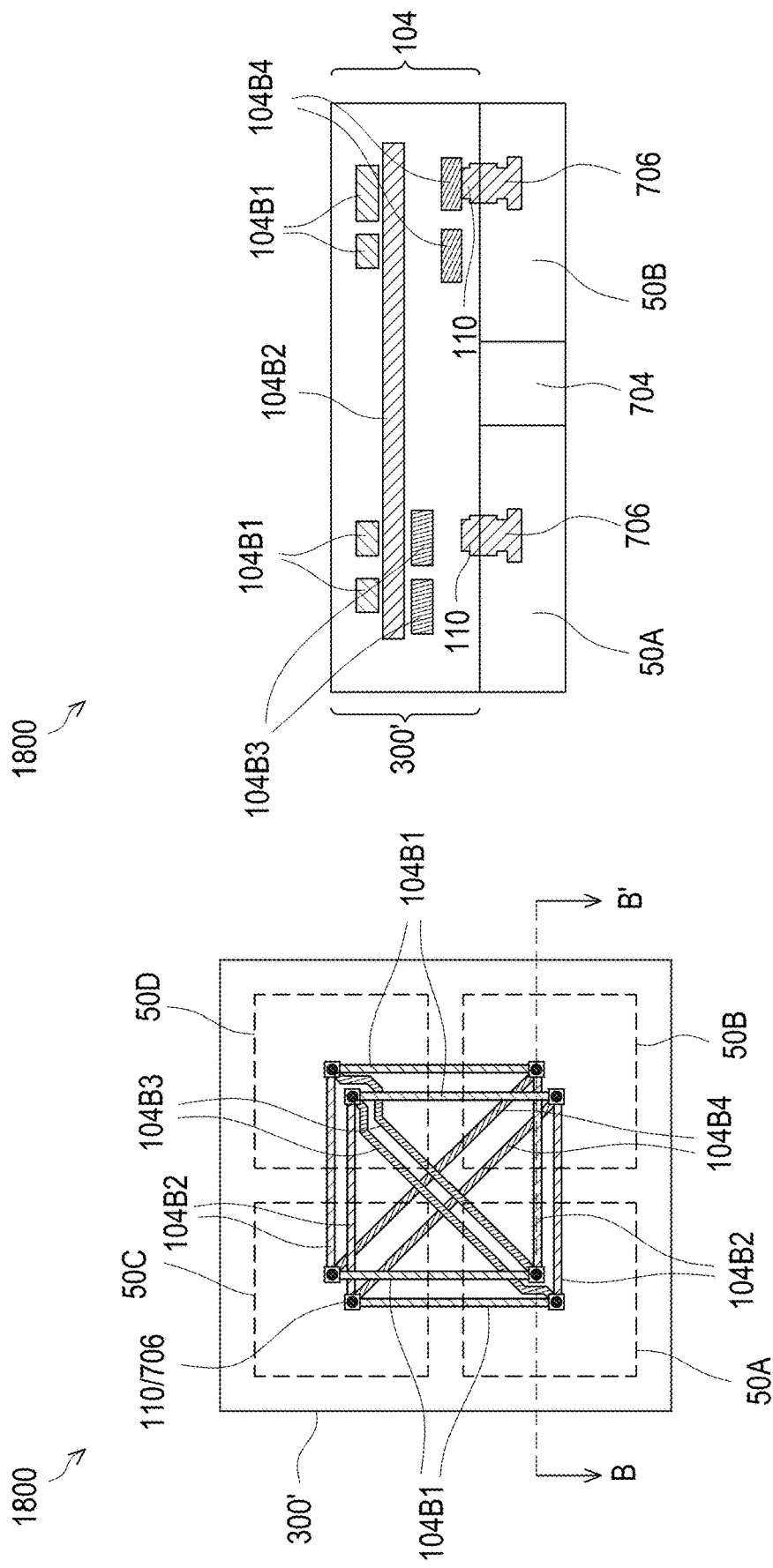
FIGS. 32A and 32B illustrate plan and cross-sectional views of an interconnect structure of a package component, in accordance with some embodiments.

FIGS. 32A and 32B illustrate plan and cross-sectional views of the interconnect structure 104 of the interposer 300' of the package component 1800 (see FIG. 31), in accordance with some embodiments. In particular, FIG. 32A illustrates a plan view, and FIG. 32B illustrates a cross-section view along a line BB' in FIG. 32A. In the illustrated embodiment, the package component 1800 comprises four integrated circuit dies 50 (such as the integrated circuit dies 50A, 50B, 50C, and 50D) that are interconnected by the interconnect structure 104 of the interposer 300'. In some embodiments, the interconnect structure 104 of the interposer 300' comprises metallization layers 104B, which may comprise conductive lines 104B1, 104B2, 104B3, and 104B4. The conductive lines 104B1, 104B2, 104B3, and 104B4 are disposed in different metallization layers of the interconnect structure 104, such that the conductive lines 104B3 are over the conductive lines 104B4, the conductive lines 104B2 are over the conductive lines 104B3, and the conductive lines 104B1 are over the conductive lines 104B2. The conductive lines 104B1, 104B2, 104B3, and 104B4 interconnect the die connectors 706 of the integrated circuit dies 50, thereby electrically connecting the integrated circuit dies 50 to each other. The conductive lines 104B1 interconnect the die connectors 706 of the integrated circuit dies 50A and 50B to the die connectors 706 of the integrated circuit dies 50C and 50D, respectively, along a shortest direct path between connected die connectors 706. The conductive lines 104B2 interconnect the die connectors 706 of the integrated circuit dies 50A and 50C to the die connectors 706 of the integrated circuit dies 50B and 50D, respectively, along a shortest direct path between connected die connectors 706. The conductive lines 104B3 interconnect the die connectors 706 of the integrated circuit die 50A to the die connectors 706 of the integrated circuit die 50D, along a shortest direct path between connected die connectors 706. The conductive lines 104B4 interconnect the die connectors 706 of the integrated circuit die 50B to the die connectors 706 of the integrated circuit die 50C, along a shortest direct path between connected die connectors 706.

FIGS. 33A and 33B illustrate plan and cross-sectional views of the interconnect structure 104 of the interposer 300' of the package component 1800 (see FIG. 31), in accordance with some embodiments. In particular, FIG. 33A illustrates a plan view, and FIG. 33B illustrates a cross-section view along a line BB' in FIG. 33A. In the illustrated embodiment, the package component 1800 comprises four integrated circuit dies 50 (such as the integrated circuit dies 50A, 50B, 50C, and 50D) that are interconnected by the interconnect structure 104 of the interposer 300'. In some embodiments, the interconnect structure 104 of the interposer 300' comprises metallization layers 104B, which may comprise conductive lines 104B1 and 104B2. The conductive lines 104B1 and 104B2 are disposed in different metallization layers of the interconnect structure 104, such that the conductive lines 104B1 are over the conductive lines 104B2. The conductive lines 104B1 and 104B2 interconnect the die connectors 706 of the integrated circuit dies 50, thereby electrically connecting the integrated circuit dies 50 to each other. The conductive lines 104B1 interconnect the die connectors 706 of the integrated circuit dies 50A and 50B to the die connectors 706 of the integrated circuit dies 50C and 50D, respectively, along a shortest direct path between connected die connectors 706. The conductive lines 104B2 interconnect the die connectors 706 of the integrated circuit dies 50A and 50C to the die connectors 706 of the integrated circuit dies 50B and 50D, respectively, along a shortest direct path between connected die connectors 706.

Figure 34:
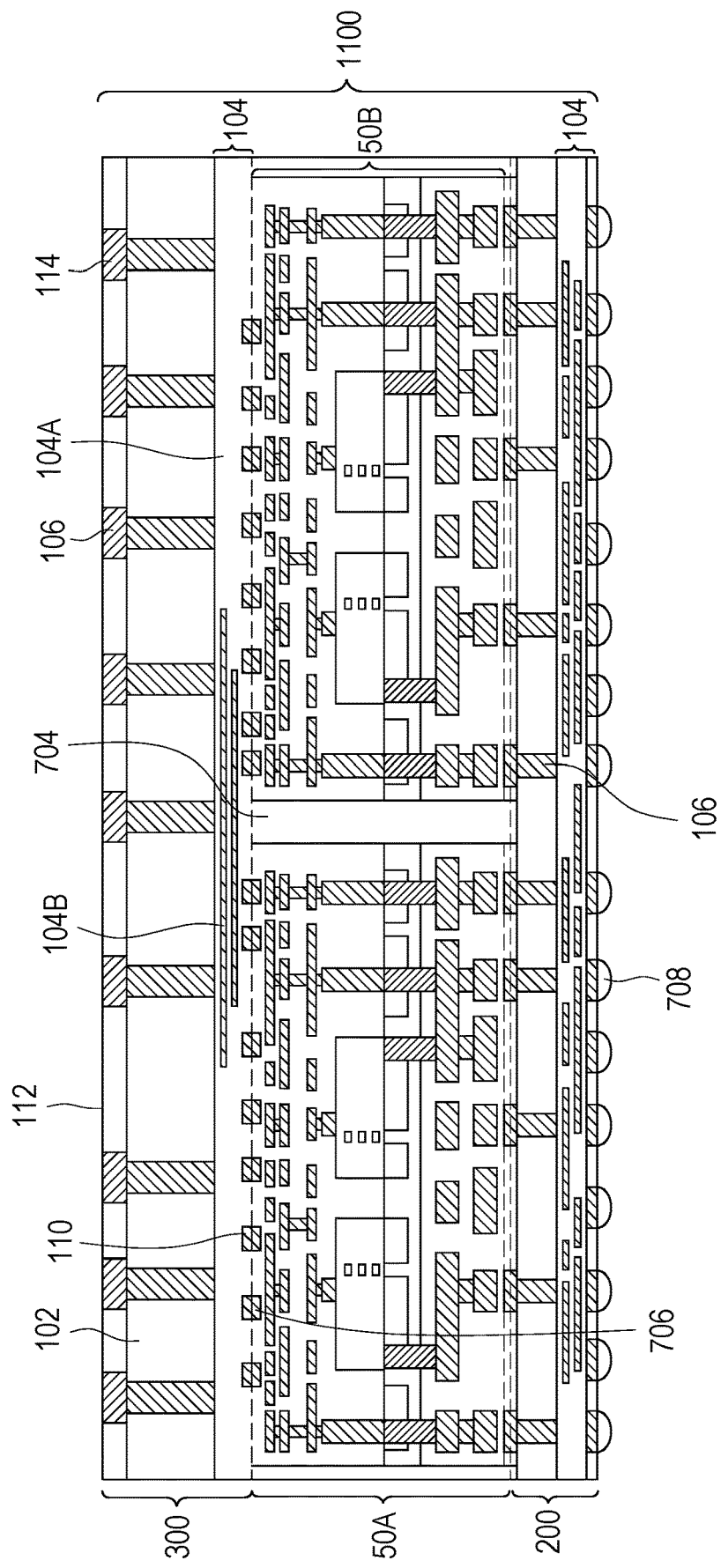
FIG. 34 illustrates a cross-sectional view of a package component, in accordance with some embodiments.

FIG. 34 illustrates a cross-sectional view of a package component 1900, in accordance with some embodiments. The package component 1900 is similar to the package component 900 (see FIG. 17), with similar features being labeled with similar numerical references, and descriptions of the similar features are not repeated herein. In contrast with the package component 900, the package component 1900 comprises the interposer 300 (see FIG. 5) instead of the interposer 850 (see FIG. 17). The integrated circuit dies 50A and 50B are electrically coupled through the interposer 300, such as through the interconnect structure 104 and/or the passive electrical devices (not shown) of the interposer 300. The integrated circuit dies 50A and 50B are further electrically coupled through the interposer 200, such as through conductive vias 106, the interconnect structure 104, and/or the active/passive electrical devices (not shown) of the interposer 200.

Figure 35:
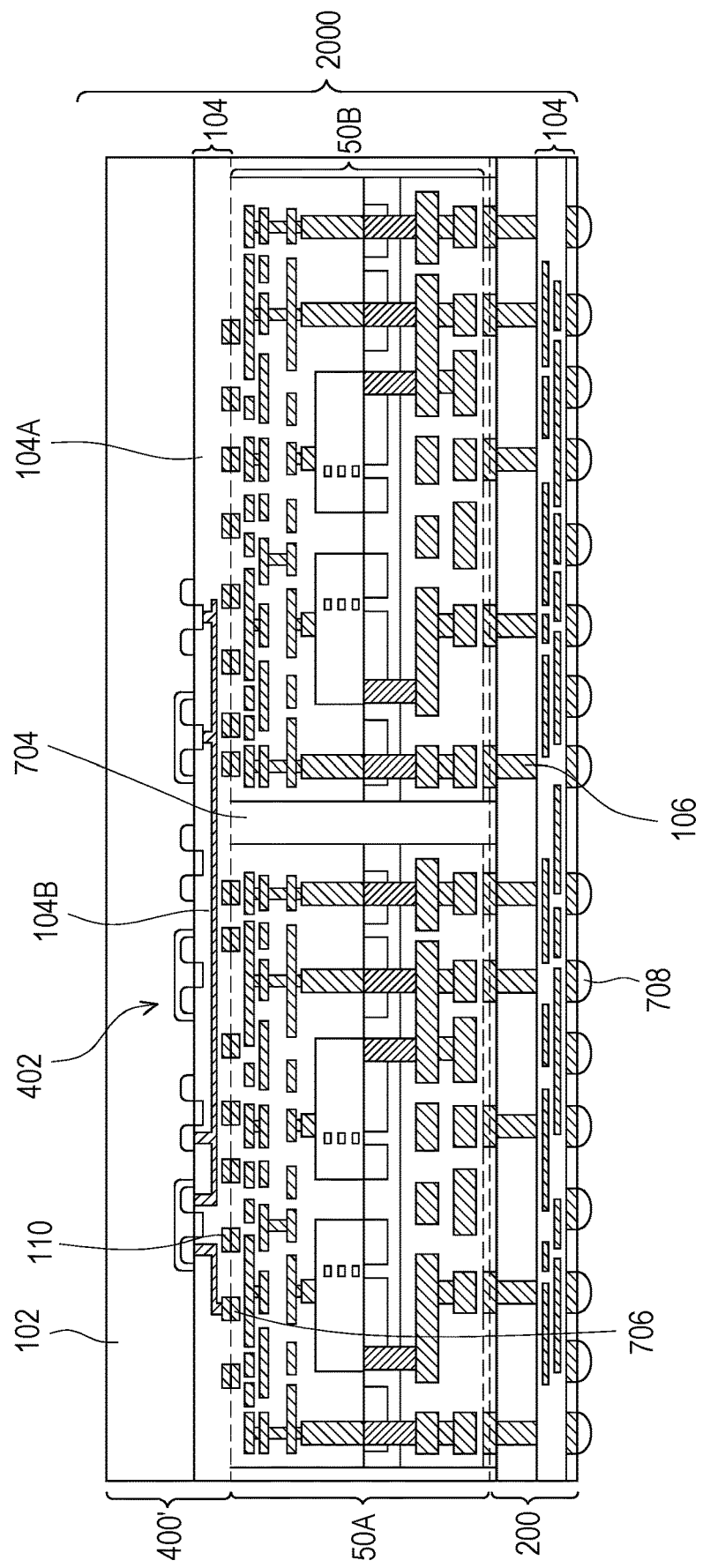
FIG. 35 illustrates a cross-sectional view of a package component, in accordance with some embodiments.

FIG. 35 illustrates a cross-sectional view of a package component 2000, in accordance with some embodiments. The package component 2000 is similar to the package component 900 (see FIG. 17), with similar features being labeled with similar numerical references, and descriptions of the similar features are not repeated herein. In contrast with the package component 900, the package component 2000 comprises the interposer 400' (see FIG. 8) instead of the interposer 850 (see FIG. 17). The integrated circuit dies 50A and 50B are electrically coupled through the interposer 400', such as through the interconnect structure 104 and/or the active/passive electrical devices 402 of the interposer 400'. The integrated circuit dies 50A and 50B are further electrically coupled through the interposer 200, such as through conductive vias 106, the interconnect structure 104, and/or the active/passive electrical devices (not shown) of the interposer 200.

Figure 36:
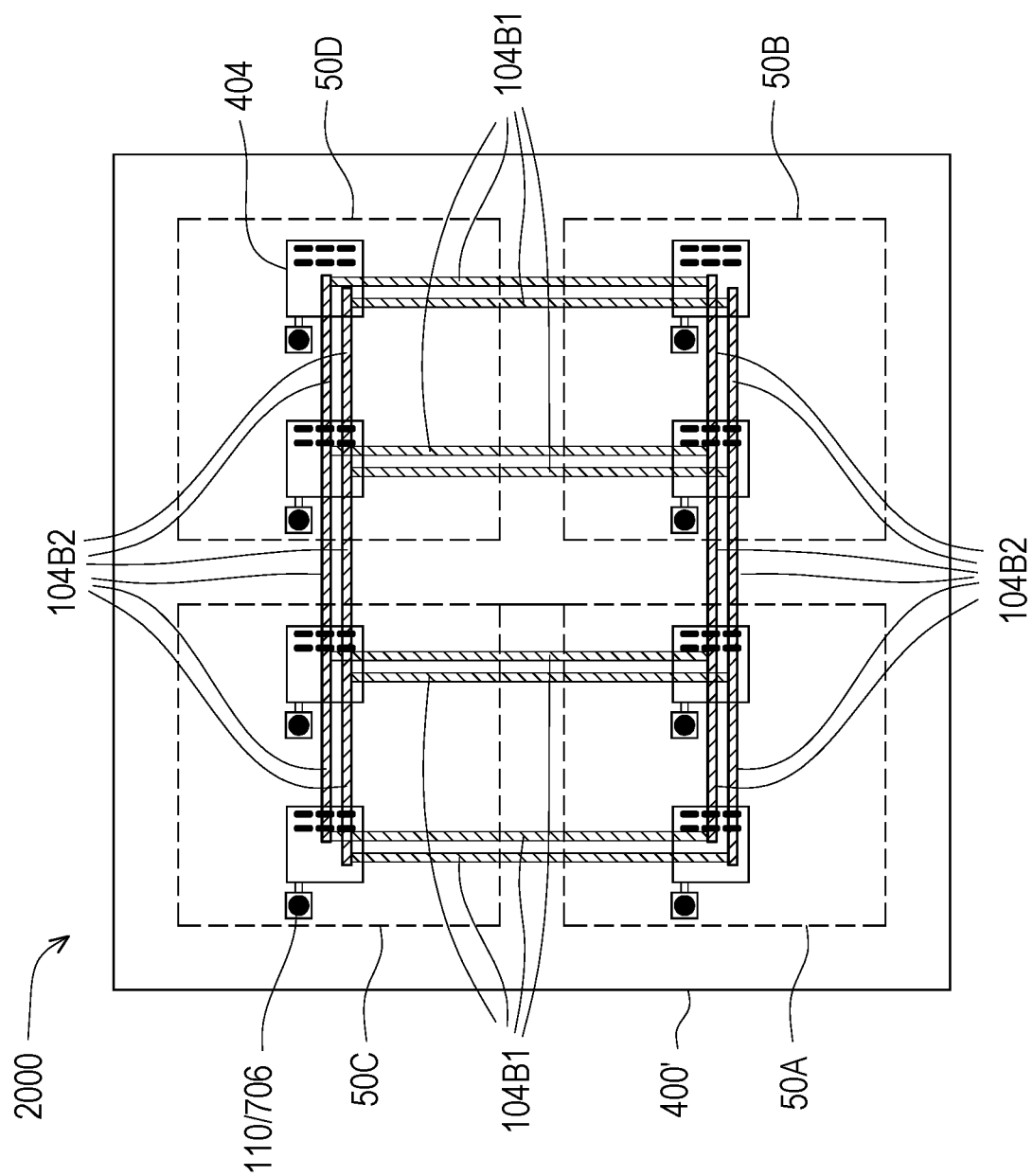
FIG. 36 illustrate a plan view of an interconnect structure of a package component, in accordance with some embodiments.

FIG. 36 illustrate a plan view of interconnect structure 104 of the interposer 400' of the package component 2000, in accordance with some embodiments. In the illustrated embodiment, the package component 2000 comprises four integrated circuit dies 50 (such as the integrated circuit dies 50A, 50B, 50C, and 50D) that are interconnected by the interconnect structure 104 of the interposer 400'. In some embodiments, the die connectors 706 of the integrated circuit dies 50 are coupled to I/O routers/switches 404. In some embodiments, the I/O routers/switches 404 may be formed from the devices 402 (see FIG. 35) of the interposer 400'. The interconnect structure 104 of the interposer 400' comprises metallization layers 104B, which may comprise conductive lines 104B1 and 104B2. In some embodiments, the conductive lines 104B1 and 104B2 are disposed in different metallization layers of the interconnect structure 104, such that the conductive lines 104B2 are over the conductive lines 104B1. The conductive lines 104B1 interconnect I/O routers/switches 404 of the integrated circuit dies 50A and 50B to I/O routers/switches 404 of the integrated circuit dies 50C and 50D, respectively, along a shortest direct path between connected I/O routers/switches. The conductive lines 104B2 interconnect adjacent I/O routers/switches 404 within each of the integrated circuit dies 50A, 50B, 50C, and 50D, along a shortest direct path between connected I/O routers/switches. The conductive lines 104B2 further interconnect an I/O router/switch 404 of the integrated circuit die 50A to an I/O router/switch 404 of the integrated circuit die 50B, and an I/O router/switch 404 of the integrated circuit die 50C to an I/O router/switch 404 of the integrated circuit die 50D, along a shortest direct path between connected I/O routers/switches.

Figure 37:
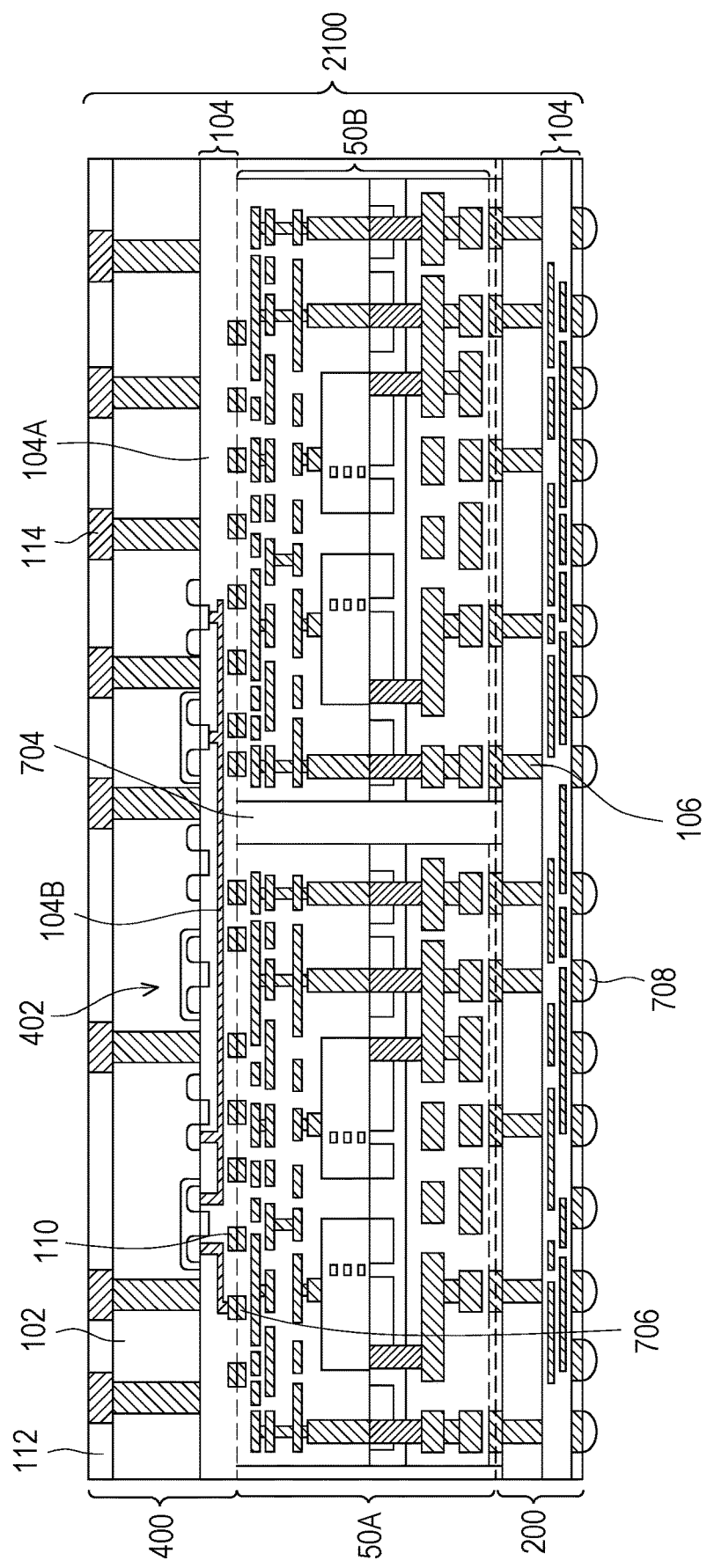
FIG. 37 illustrates a cross-sectional view of a package component, in accordance with some embodiments.

FIG. 37 illustrates a cross-sectional view of a package component 2100, in accordance with some embodiments. The package component 2100 is similar to the package component 900 (see FIG. 17), with similar features being labeled with similar numerical references, and descriptions of the similar features are not repeated herein. In contrast with the package component 900, the package component 2100 comprises the interposer 400 (see FIG. 7) instead of the interposer 850 (see FIG. 17). The integrated circuit dies 50A and 50B are electrically coupled through the interposer 400, such as through the interconnect structure 104 and/or the active/passive electrical devices 402 of the interposer 400. The integrated circuit dies 50A and 50B are further electrically coupled through the interposer 200, such as through conductive vias 106, the interconnect structure 104, and/or the active/passive electrical devices (not shown) of the interposer 200.

Figure 38:
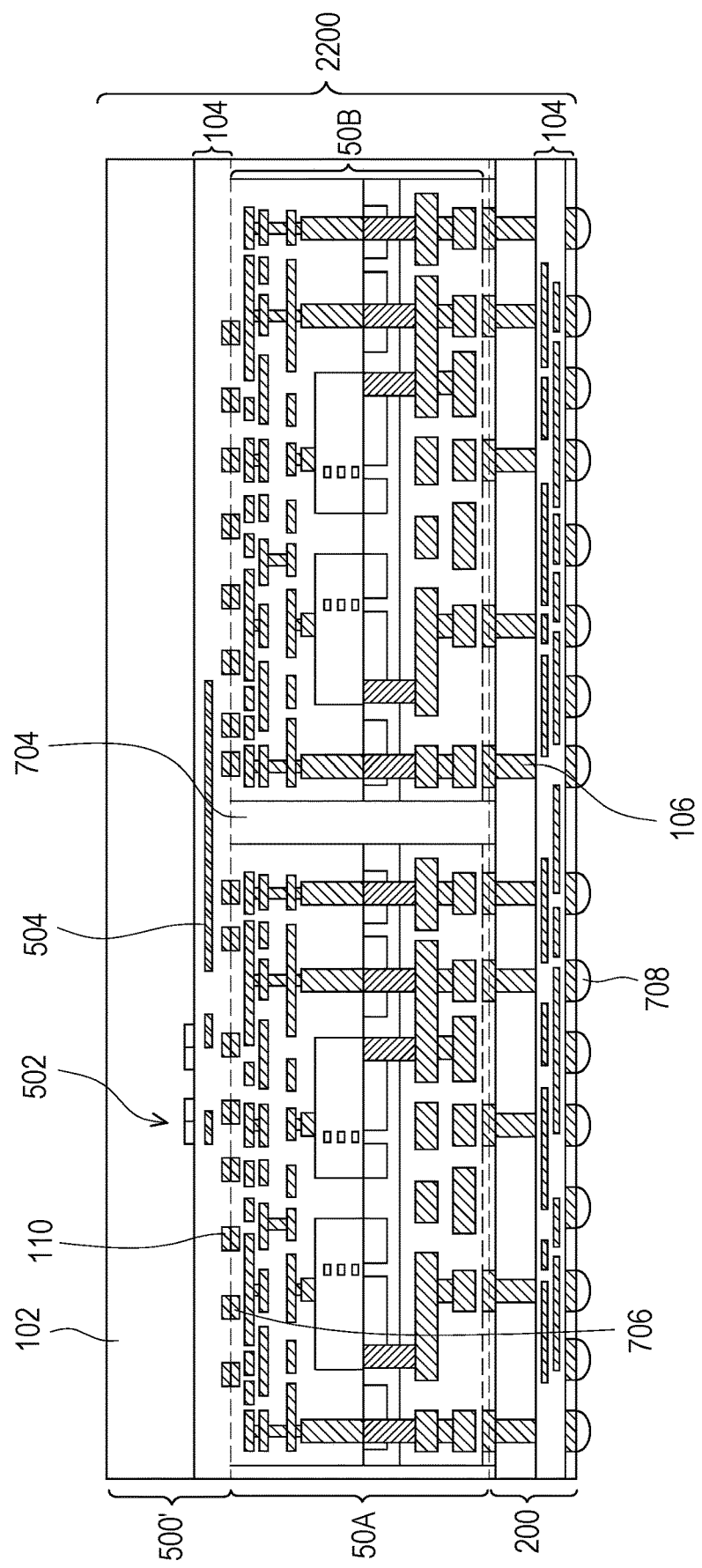
FIG. 38 illustrates a cross-sectional view of a package component, in accordance with some embodiments.

FIG. 38 illustrates a cross-sectional view of a package component 2200, in accordance with some embodiments. The package component 2200 is similar to the package component 900 (see FIG. 17), with similar features being labeled with similar numerical references, and descriptions of the similar features are not repeated herein. In contrast with the package component 900, the package component 2200 comprises the interposer 500' (see FIG. 10) instead of the interposer 850 (see FIG. 17). The integrated circuit dies 50A and 50B are electrically coupled through the interposer 500', such as through the interconnect structure 104, the one or more optical waveguides 504, and/or the optical devices 502 of the interposer 500'. The integrated circuit dies 50A and 50B are further electrically coupled through the interposer 200, such as through conductive vias 106, the interconnect structure 104, and/or the active/passive electrical devices (not shown) of the interposer 200.

Figure 39:
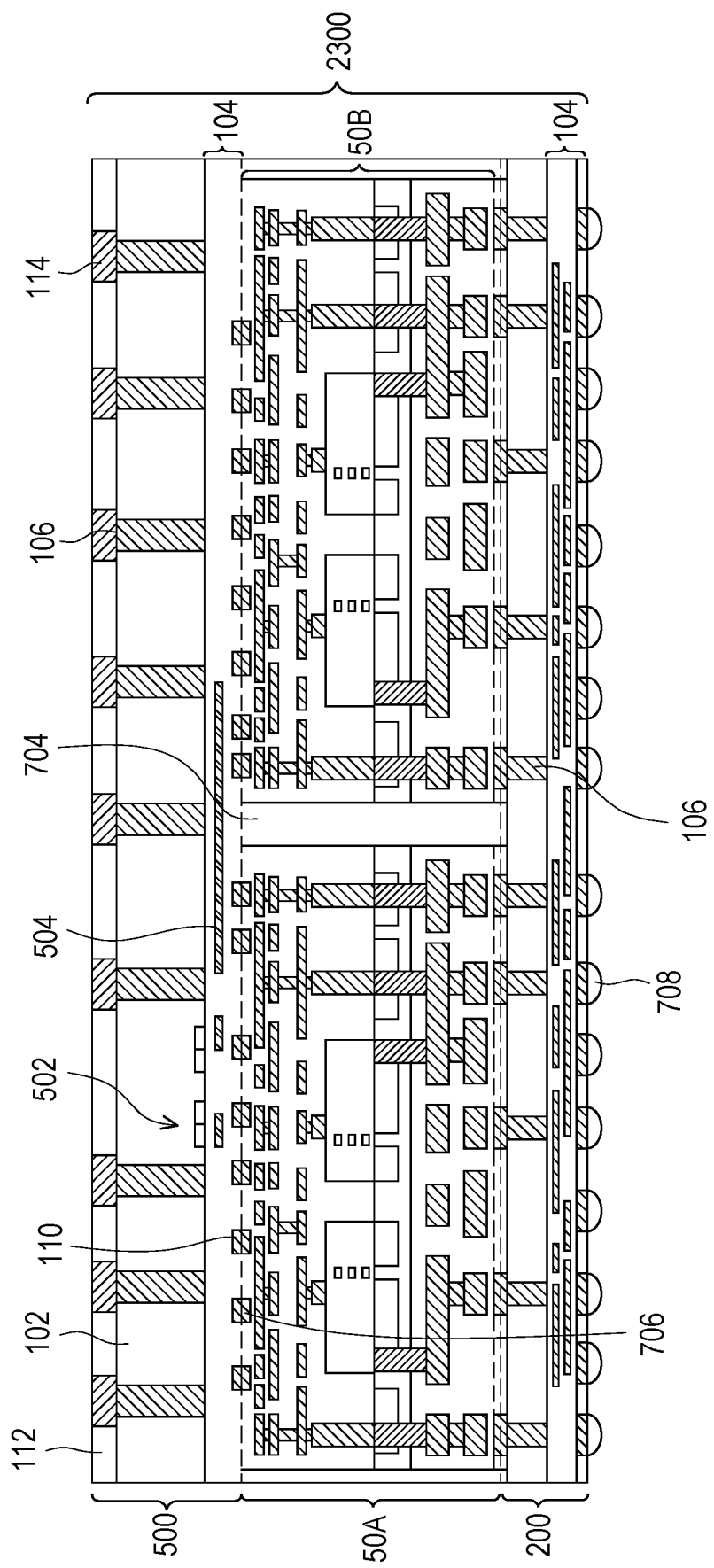
FIG. 39 illustrates a cross-sectional view of a package component, in accordance with some embodiments.

FIG. 39 illustrates a cross-sectional view of a package component 2300, in accordance with some embodiments. The package component 2300 is similar to the package component 900 (see FIG. 17), with similar features being labeled with similar numerical references, and descriptions of the similar features are not repeated herein. In contrast with the package component 900, the package component 2300 comprises the interposer 500 (see FIG. 9) instead of the interposer 850 (see FIG. 17). The integrated circuit dies 50A and 50B are electrically coupled through the interposer 500, such as through the interconnect structure 104, the one or more optical waveguides 504, and/or the optical devices 502 of the interposer 500. The integrated circuit dies 50A and 50B are further electrically coupled through the interposer 200, such as through conductive vias 106, the interconnect structure 104, and/or the active/passive electrical devices (not shown) of the interposer 200.

Figure 40:
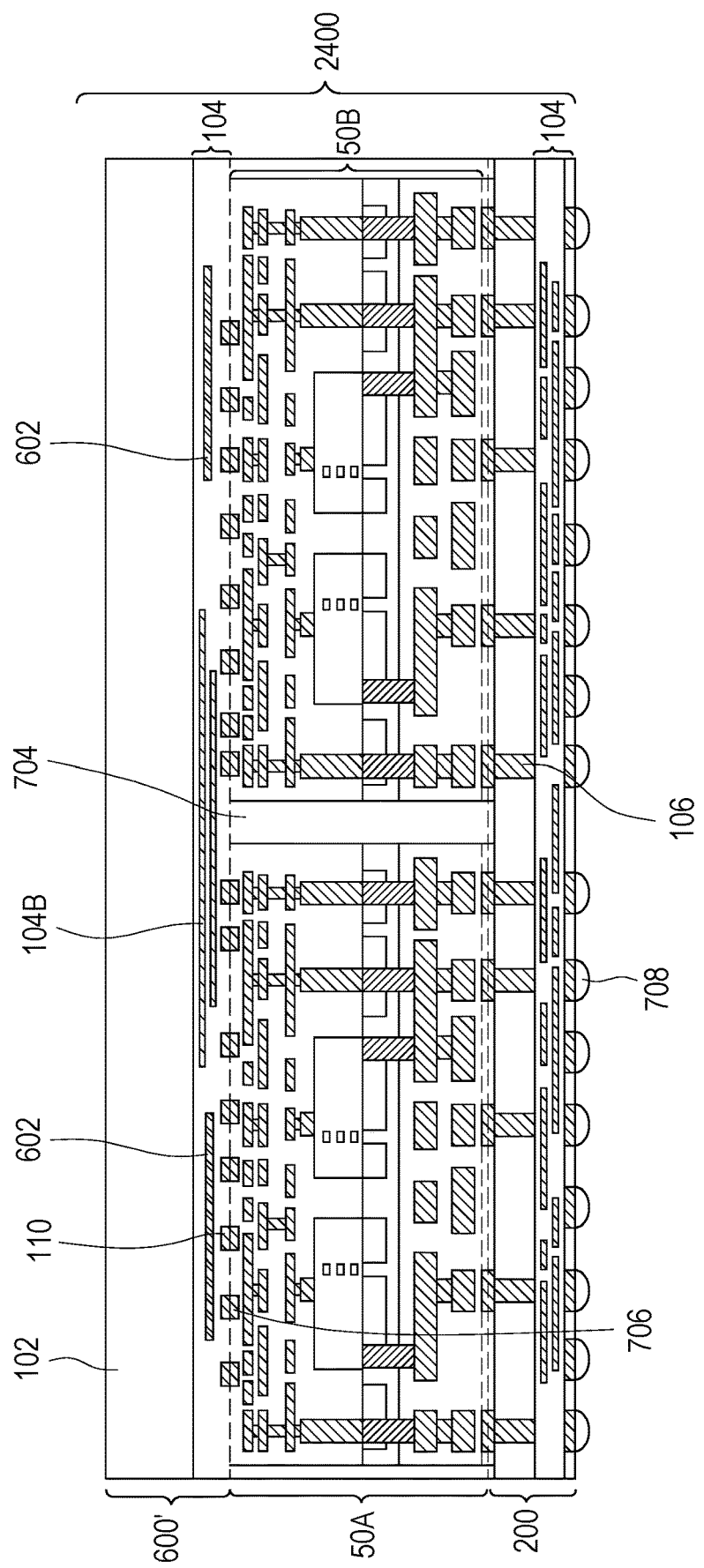
FIG. 40 illustrates a cross-sectional view of a package component, in accordance with some embodiments.

FIG. 40 illustrates a cross-sectional view of a package component 2400, in accordance with some embodiments. The package component 2400 is similar to the package component 900 (see FIG. 17), with similar features being labeled with similar numerical references, and descriptions of the similar features are not repeated herein. In contrast with the package component 900, the package component 2400 comprises the interposer 600' (see FIG. 12) instead of the interposer 850 (see FIG. 17). The integrated circuit dies 50A and 50B are electrically coupled through the interposer 600', such as through the interconnect structure 104, the one or more optical waveguides 602, the optical devices (not shown), and/or active/passive electrical devices (not shown) of the interposer 600'. The integrated circuit dies 50A and 50B are further electrically coupled through the interposer 200, such as through conductive vias 106, the interconnect structure 104, and/or the active/passive electrical devices (not shown) of the interposer 200.

Figure 41:
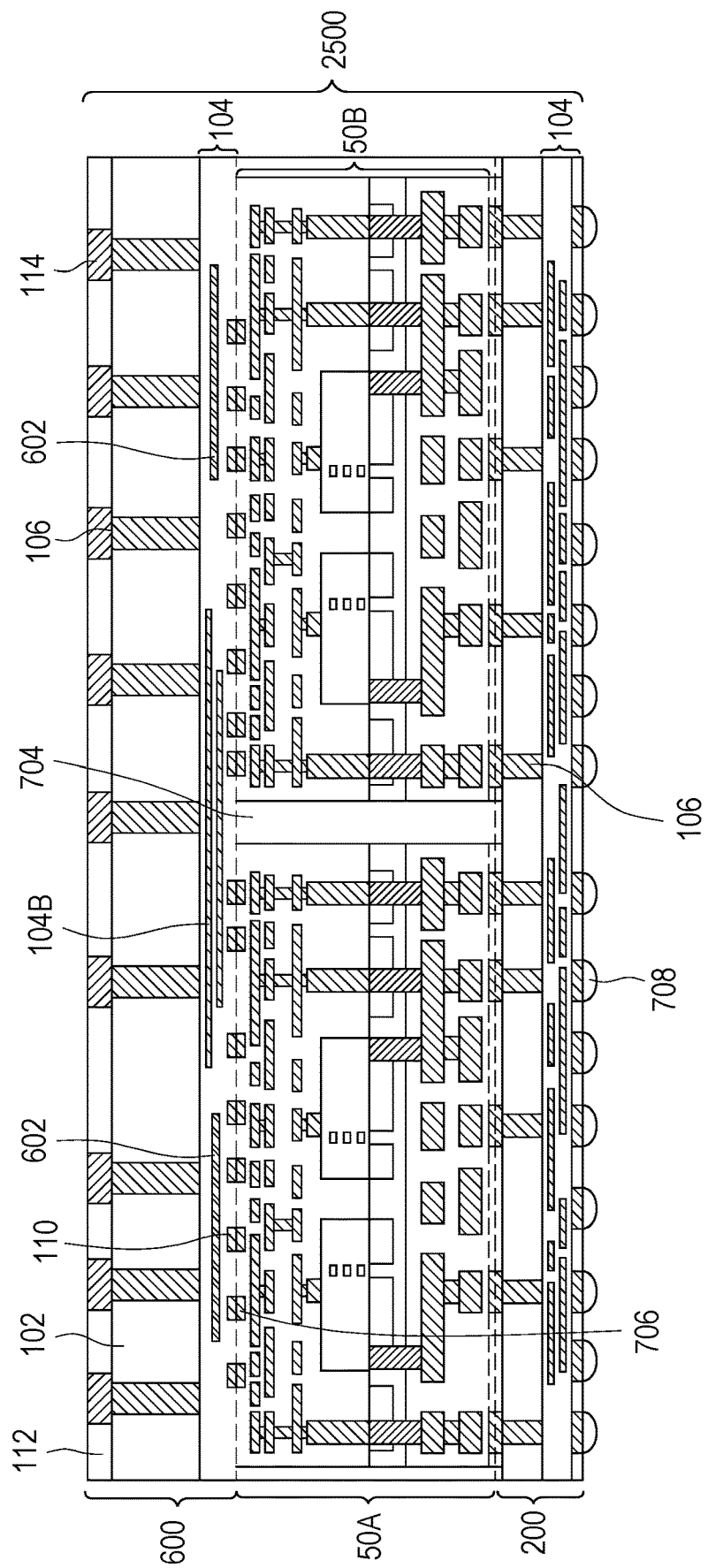
FIG. 41 illustrates a cross-sectional view of a package component, in accordance with some embodiments.

FIG. 41 illustrates a cross-sectional view of a package component 2500, in accordance with some embodiments. The package component 2500 is similar to the package component 900 (see FIG. 17), with similar features being labeled with similar numerical references, and descriptions of the similar features are not repeated herein. In contrast with the package component 900, the package component 2500 comprises the interposer 600 (see FIG. 11) instead of the interposer 850 (see FIG. 17). The integrated circuit dies 50A and 50B are electrically coupled through the interposer 600, such as through the interconnect structure 104, the one or more optical waveguides 602, the optical devices (not shown), and/or active/passive electrical devices (not shown) of the interposer 600. The integrated circuit dies 50A and 50B are further electrically coupled through the interposer 200, such as through conductive vias 106, the interconnect structure 104, and/or the active/passive electrical devices (not shown) of the interposer 200.

Figure 42:
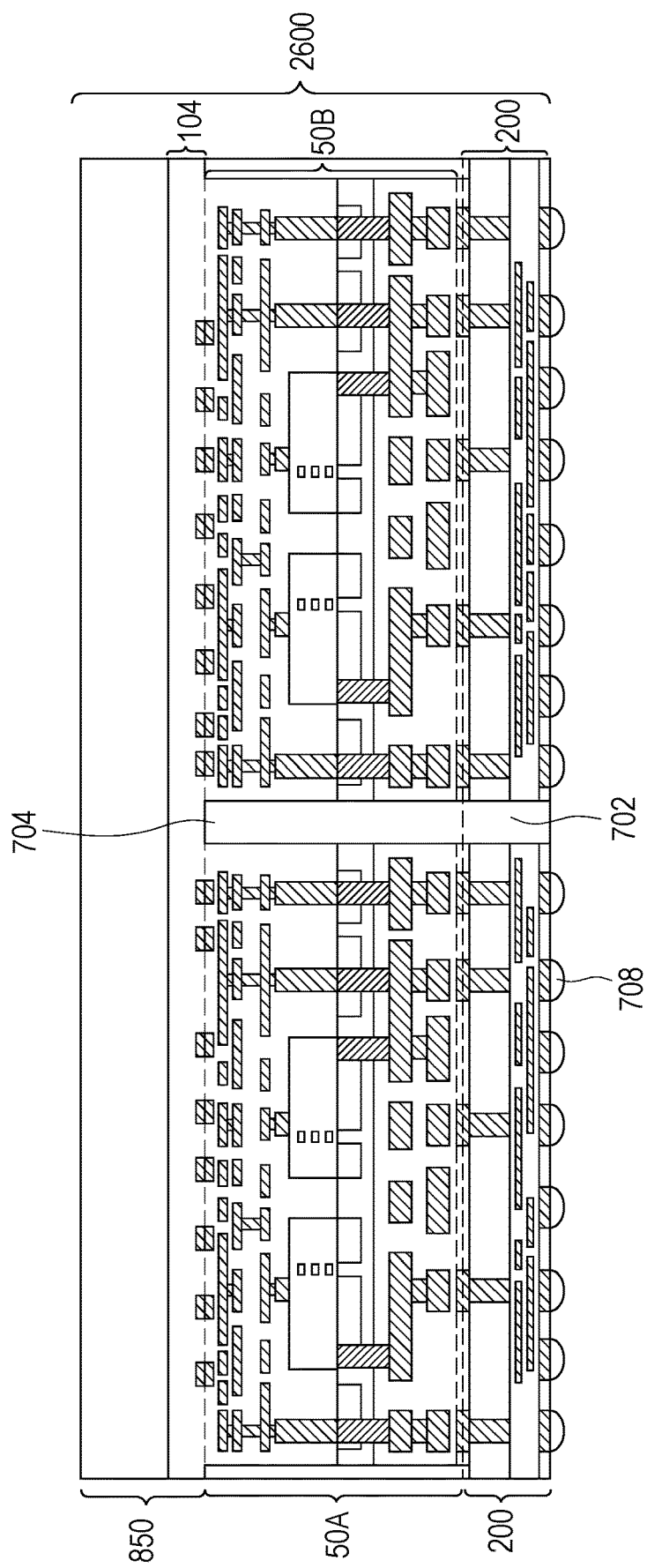
FIG. 42 illustrates a cross-sectional view of a package component, in accordance with some embodiments.

FIG. 42 illustrates a cross-sectional view of a package component 2600, in accordance with some embodiments. The package component 2600 is similar to the package component 900 (see FIG. 17), with similar features being labeled with similar numerical references, and descriptions of the similar features are not repeated herein. In contrast with the package component 900, the package component 2600 comprises two interposers 200 instead of the single interposer (see FIG. 17), such that the integrated circuit die 50A is bonded to a first one of the interposers 200 and the integrated circuit die 50B is bonded to a second one of the interposers 200, with the first one of the interposers 200 being laterally separated from the second one of the interposers 200 by the encapsulant 702. The integrated circuit dies 50A and 50B are electrically coupled through the interposer 850, such as through the interconnect structure 104, the optical devices (not shown), active electrical devices (not shown), and/or passive electrical devices (not shown) of the interposer 850.

Figure 43:
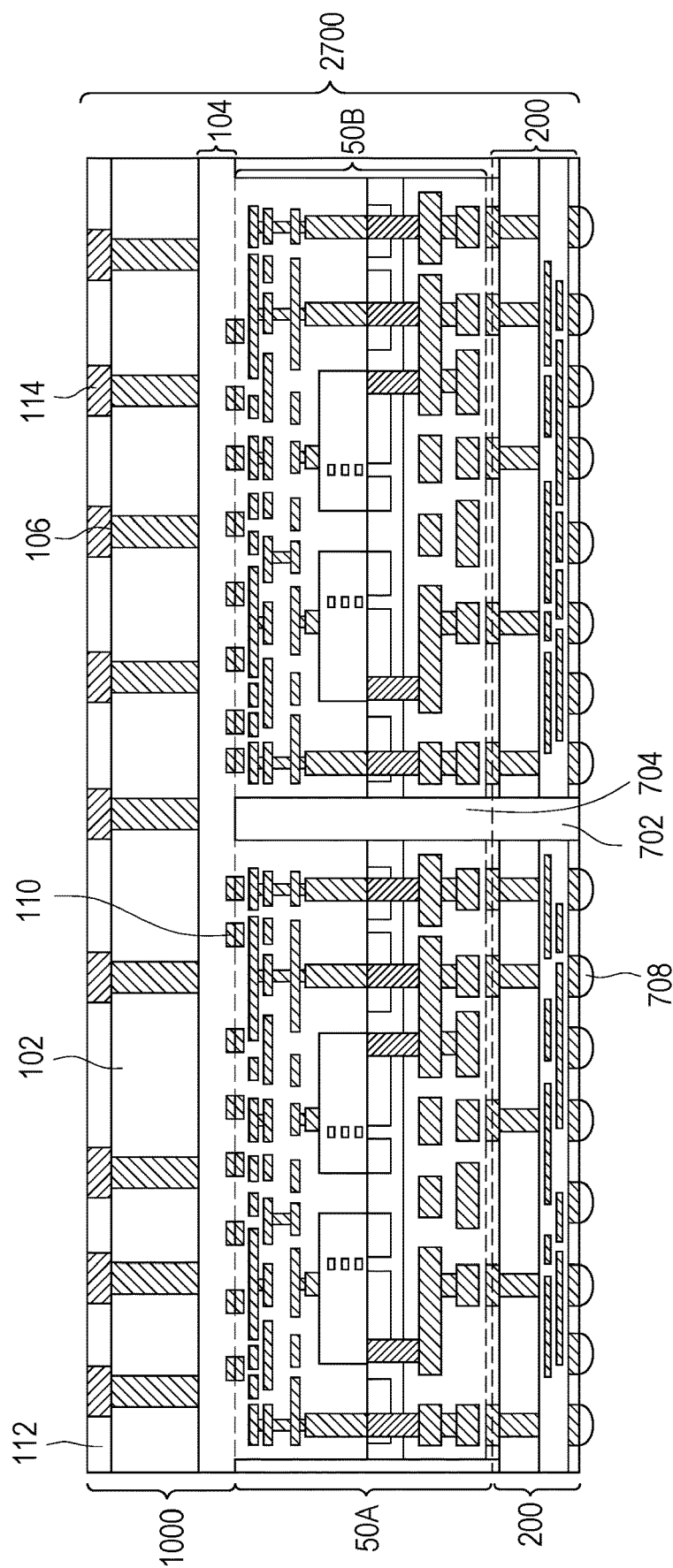
FIG. 43 illustrates a cross-sectional view of a package component, in accordance with some embodiments.

FIG. 43 illustrates a cross-sectional view of a package component 2700, in accordance with some embodiments. The package component 2700 is similar to the package component 1100 (see FIG. 18), with similar features being labeled with similar numerical references, and descriptions of the similar features are not repeated herein. In contrast with the package component 1100, the package component 2700 comprises two interposers 200 instead of the single interposer (see FIG. 18), such that the integrated circuit die 50A is bonded to a first one of the interposers 200 and the integrated circuit die 50B is bonded to a second one of the interposers 200, with the first one of the interposers 200 being laterally separated from the second one of the interposers 200 by the encapsulant 702. The integrated circuit dies 50A and 50B are electrically coupled through the interposer 1000, such as through the interconnect structure 104, the optical devices (not shown), active electrical devices (not shown), and/or passive electrical devices (not shown) of the interposer 1000.

Figure 44:
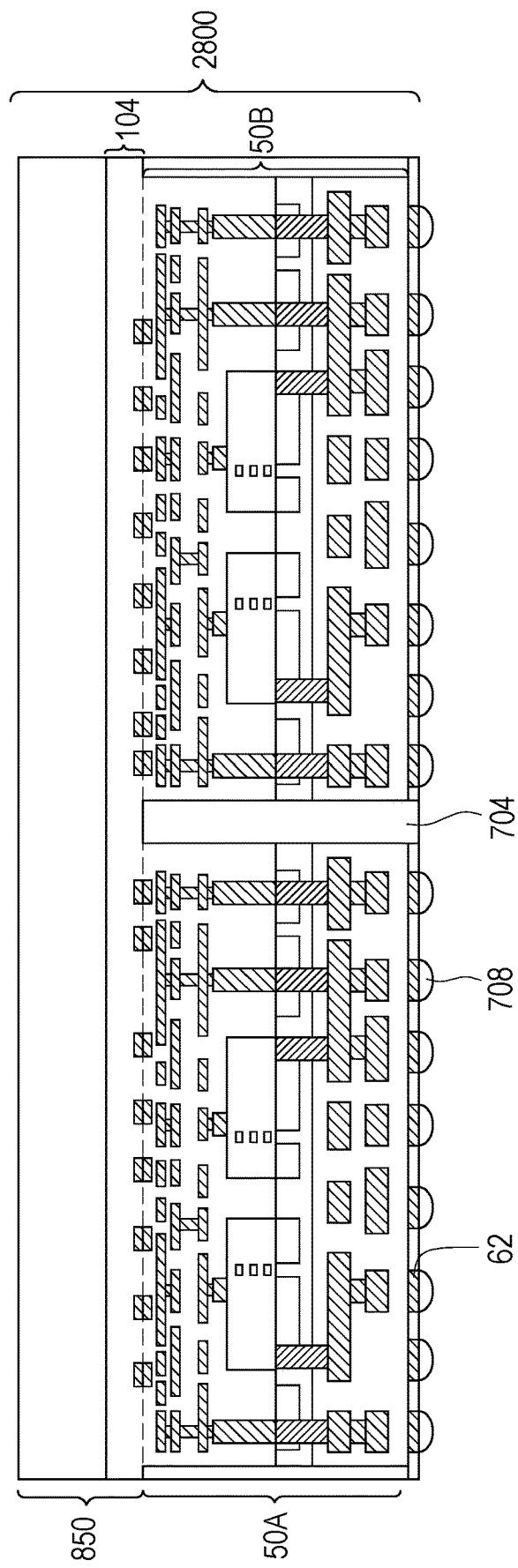
FIG. 44 illustrates a cross-sectional view of a package component, in accordance with some embodiments.

FIG. 44 illustrates a cross-sectional view of a package component 2800, in accordance with some embodiments. The package component 2800 is similar to the package component 900 (see FIG. 17), with similar features being labeled with similar numerical references, and descriptions of the similar features are not repeated herein. In contrast with the package component 900, the package component 2800 does not comprises the interposer 200 (see FIG. 17), such that the conductive connectors 708 are formed on the die connectors 62 of the integrated circuit dies 50A and 50B. The integrated circuit dies 50A and 50B are electrically coupled through the interposer 850, such as through the interconnect structure 104, the optical devices (not shown), active electrical devices (not shown), and/or passive electrical devices (not shown) of the interposer 850.

Figure 45:
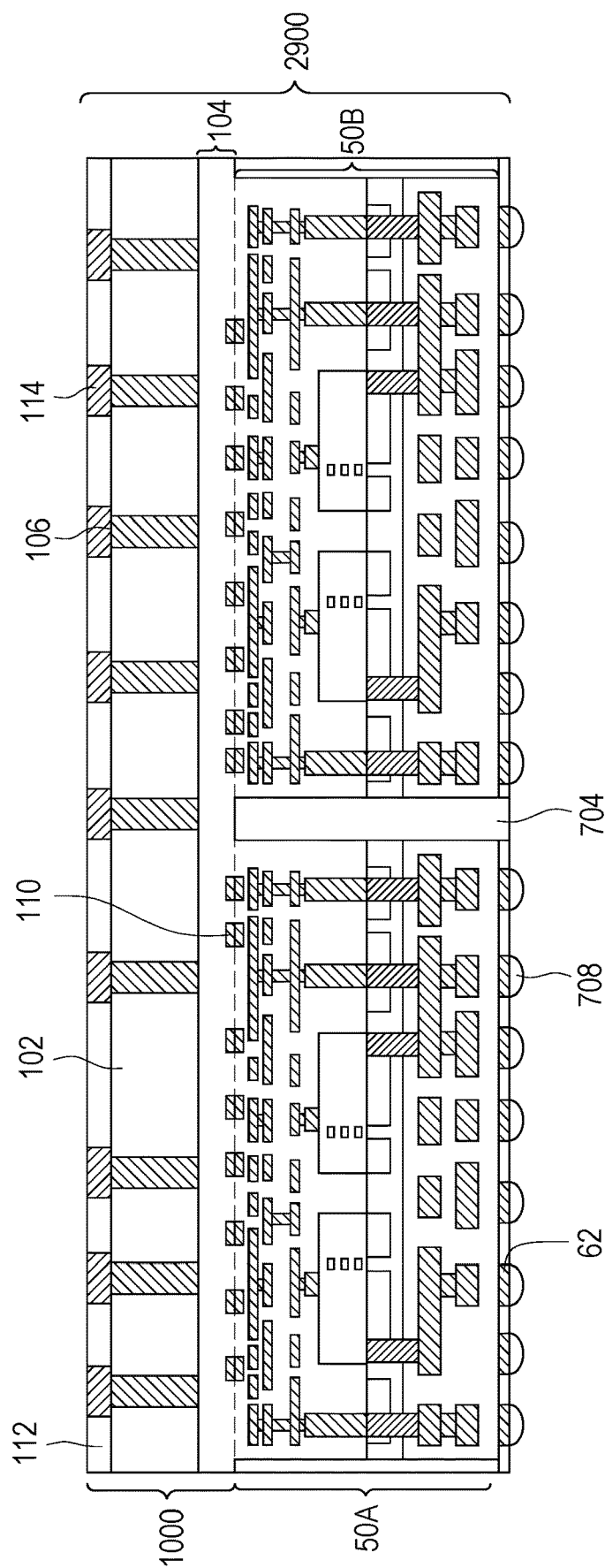
FIG. 45 illustrates a cross-sectional view of a package component, in accordance with some embodiments.

FIG. 45 illustrates a cross-sectional view of a package component 2900, in accordance with some embodiments. The package component 2900 is similar to the package component 1100 (see FIG. 18), with similar features being labeled with similar numerical references, and descriptions of the similar features are not repeated herein. In contrast with the package component 1100, the package component 2900 does not comprises the interposer 200 (see FIG. 18), such that the conductive connectors 708 are formed on the die connectors 62 of the integrated circuit dies 50A and 50B. The integrated circuit dies 50A and 50B are electrically coupled through the interposer 1000, such as through the interconnect structure 104, the optical devices (not shown), active electrical devices (not shown), and/or passive electrical devices (not shown) of the interposer 1000.

Figure 46:
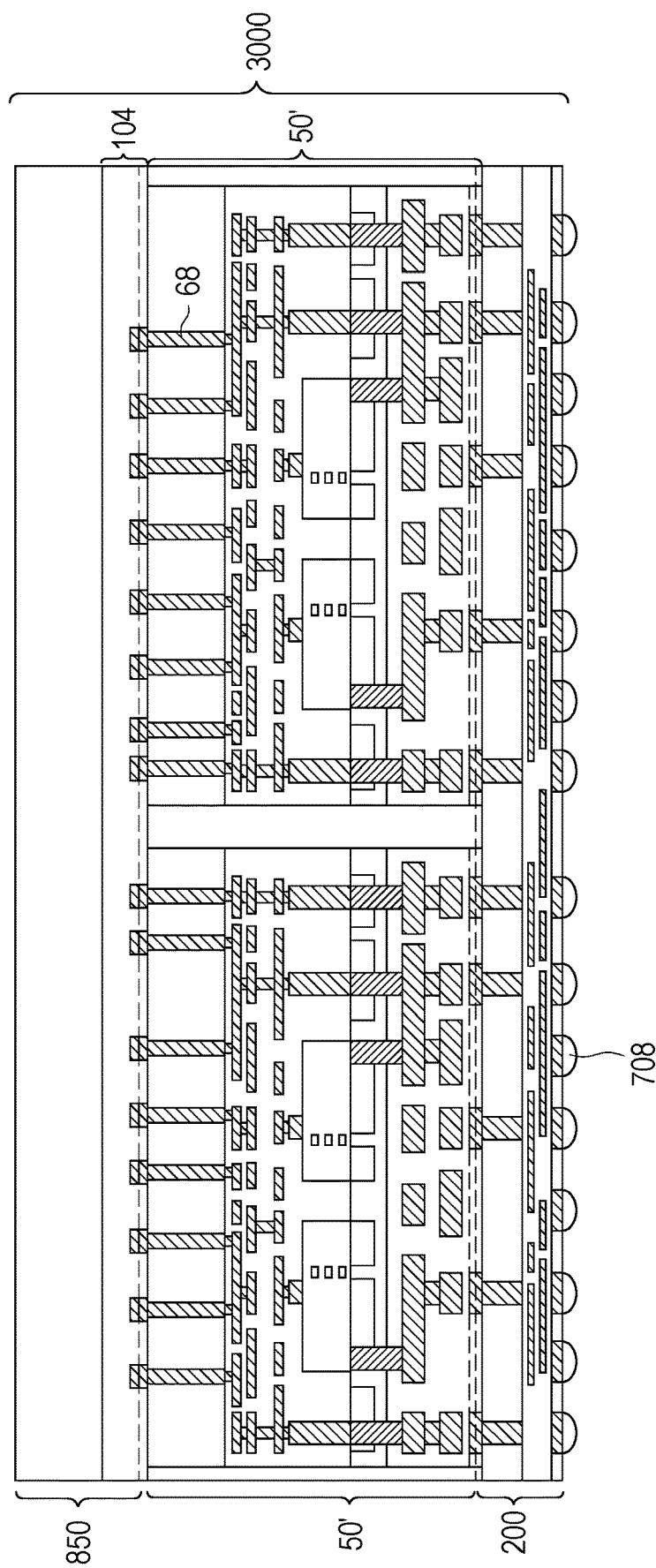
FIG. 46 illustrates a cross-sectional view of a package component, in accordance with some embodiments.

FIG. 46 illustrates a cross-sectional view of a package component 3000, in accordance with some embodiments. The package component 3000 is similar to the package component 900 (see FIG. 17), with similar features being labeled with similar numerical references, and descriptions of the similar features are not repeated herein. In contrast with the package component 900, the package component 3000 comprises the integrated circuit dies 50' instead of the integrated circuit dies 50 (see FIG. 17). The integrated circuit dies 50' are electrically coupled through the interposer 850, such as through the interconnect structure 104, the optical devices (not shown), active electrical devices (not shown), and/or passive electrical devices (not shown) of the interposer 850. The integrated circuit dies 50' are further electrically coupled through the interposer 200, such as through conductive vias 106, the interconnect structure 104, and/or the active/passive electrical devices (not shown) of the interposer 200.

Figure 47:
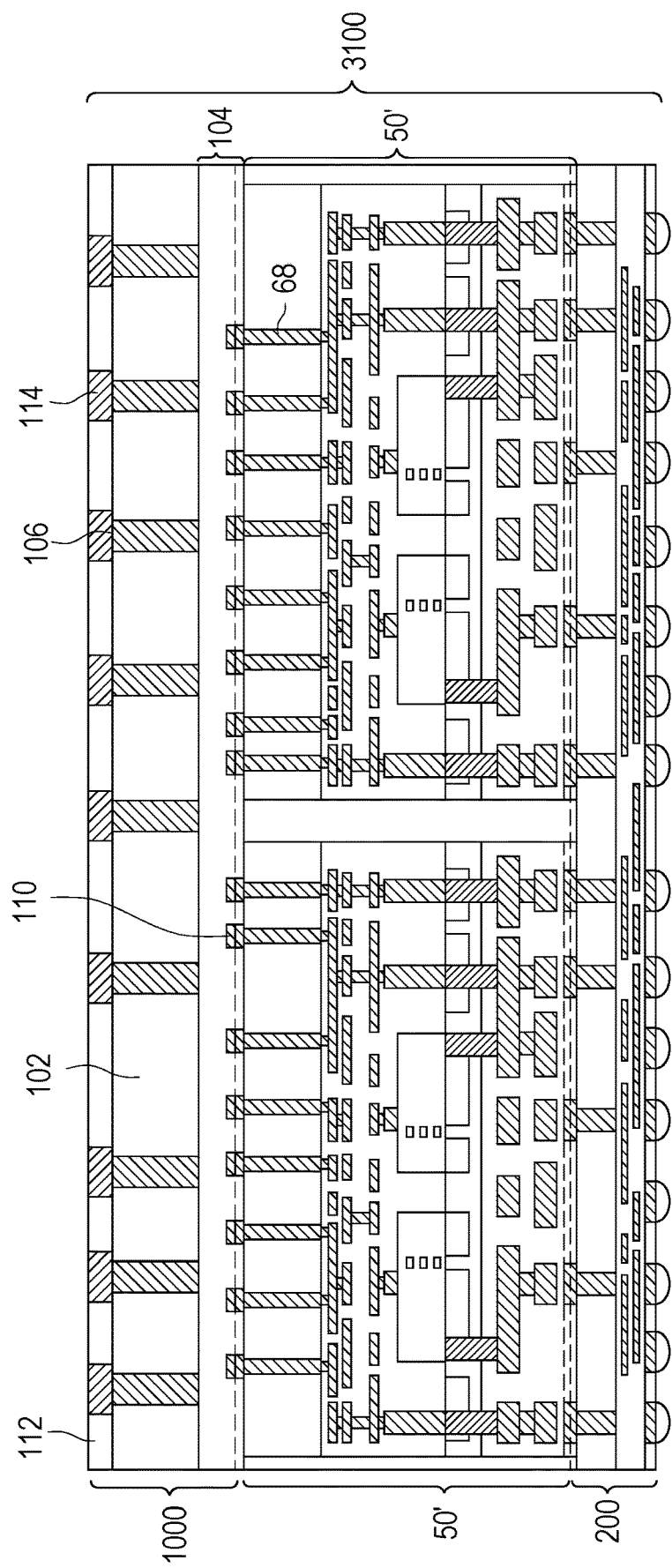
FIG. 47 illustrates a cross-sectional view of a package component, in accordance with some embodiments.

FIG. 47 illustrates a cross-sectional view of a package component 3100, in accordance with some embodiments. The package component 3100 is similar to the package component 1100 (see FIG. 18), with similar features being labeled with similar numerical references, and descriptions of the similar features are not repeated herein. In contrast with the package component 1100, the package component 3100 comprises the integrated circuit dies 50' instead of the integrated circuit dies 50 (see FIG. 18). The integrated circuit dies 50' are electrically coupled through the interposer 1000, such as through the interconnect structure 104, the optical devices (not shown), active electrical devices (not shown), and/or passive electrical devices (not shown) of the interposer 1000. The integrated circuit dies 50' are further electrically coupled through the interposer 200, such as through conductive vias 106, the interconnect structure 104, and/or the active/passive electrical devices (not shown) of the interposer 200.

Figure 48:
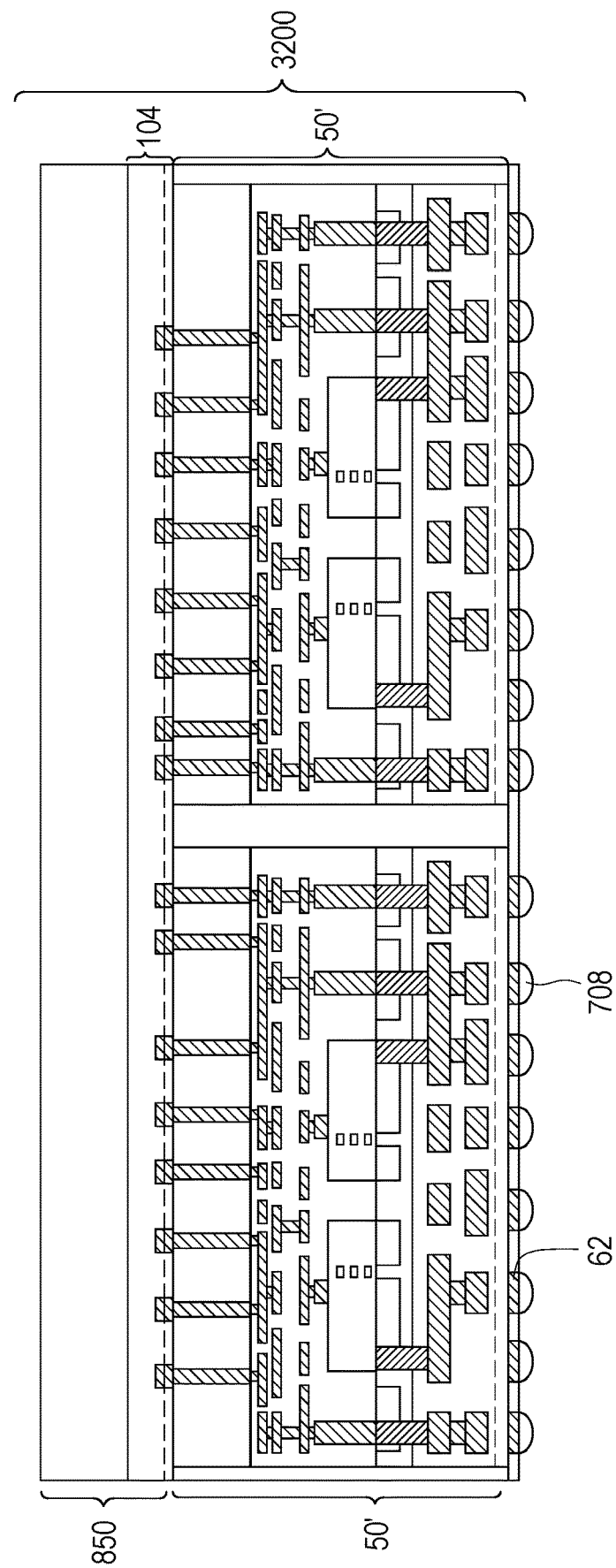
FIG. 48 illustrates a cross-sectional view of a package component, in accordance with some embodiments.

FIG. 48 illustrates a cross-sectional view of a package component 3200, in accordance with some embodiments. The package component 3200 is similar to the package component 3000 (see FIG. 46), with similar features being labeled with similar numerical references, and descriptions of the similar features are not repeated herein. In contrast with the package component 3000, the package component 3200 does not comprises the interposer 200 (see FIG. 46), such that the conductive connectors 708 are formed on the die connectors 62 of the integrated circuit dies 50'. The integrated circuit dies 50' are electrically coupled through the interposer 850, such as through the interconnect structure 104, the optical devices (not shown), active electrical devices (not shown), and/or passive electrical devices (not shown) of the interposer 850.

Figure 49:
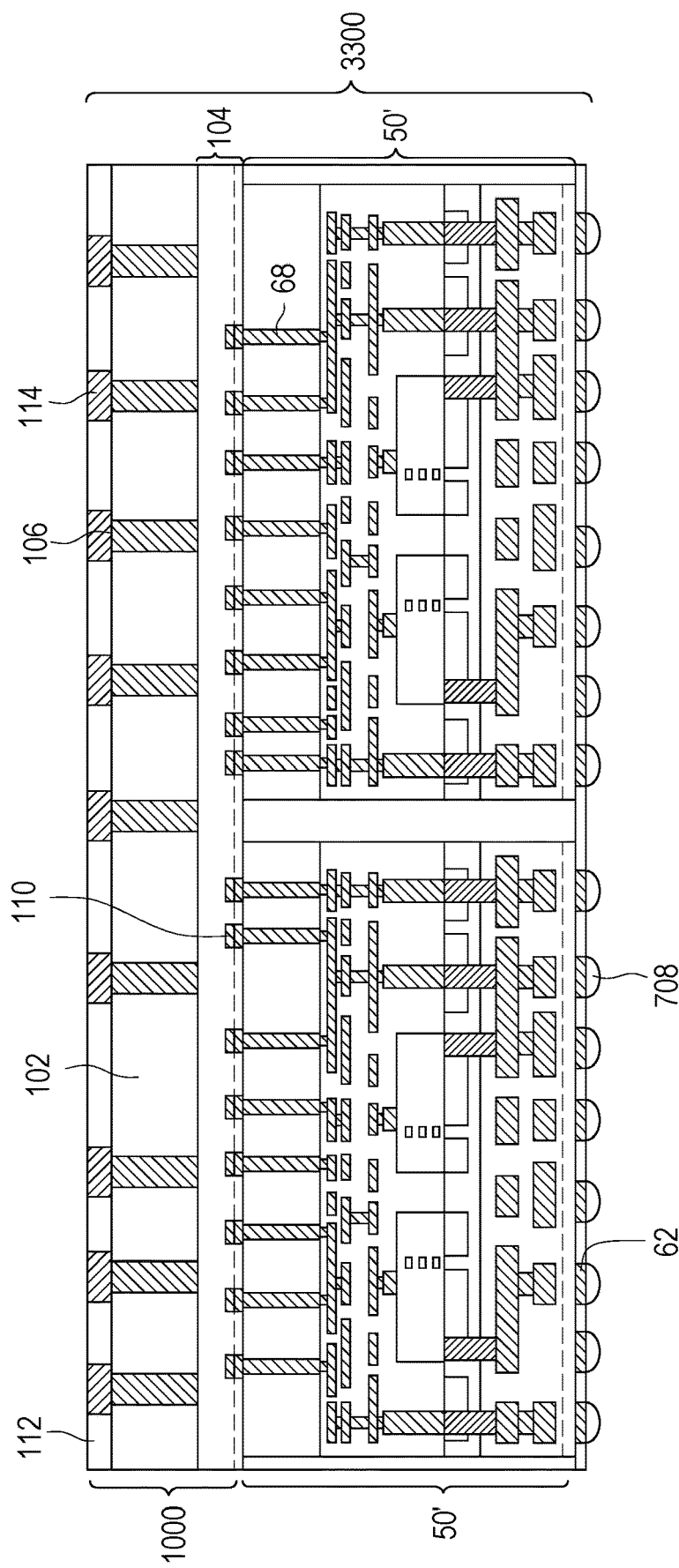
FIG. 49 illustrates a cross-sectional view of a package component, in accordance with some embodiments.

FIG. 49 illustrates a cross-sectional view of a package component 3300, in accordance with some embodiments. The package component 3300 is similar to the package component 3100 (see FIG. 47), with similar features being labeled with similar numerical references, and descriptions of the similar features are not repeated herein. In contrast with the package component 3100, the package component 3300 does not comprises the interposer 200 (see FIG. 47), such that the conductive connectors 708 are formed on the die connectors 62 of the integrated circuit dies 50'. The integrated circuit dies 50' are electrically coupled through the interposer 1000, such as through the interconnect structure 104, the optical devices (not shown), active electrical devices (not shown), and/or passive electrical devices (not shown) of the interposer 1000.

Figure 50:
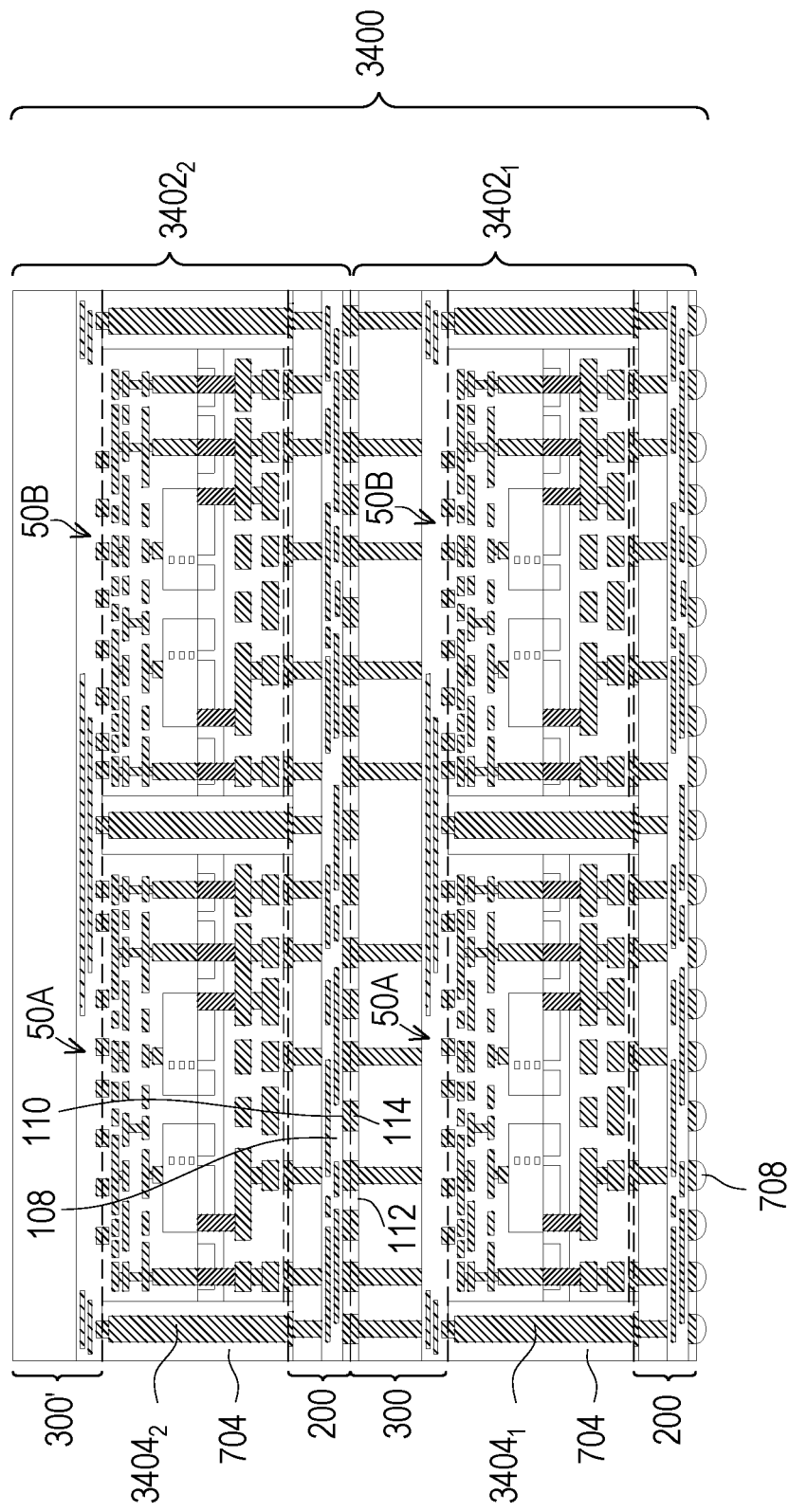
FIG. 50 illustrates a cross-sectional view of a multi-tier package component, in accordance with some embodiments.

FIG. 50 illustrates a cross-sectional view of a multi-tier package component 3400, in accordance with some embodiments. The multi-tier package component 3400 comprises a package component $3402_2$ attached to a package component $3402_1$. The package component $3402_1$ is similar to the package component 1900 (see FIG. 34), with similar features being labeled with similar numerical references, and the description is not repeated herein. In some embodiments, the package component $3402_1$ may be formed using process steps that are similar to the process steps described above with reference to FIGS. 13-16, and description is not repeated herein. In distinction with the package component 1900 (see FIG. 34), the package component $3402_1$ comprises through vias $3404_1$ extending through the encapsulant 704. The through vias $3404_1$ may be also referred to as through molding vias, through encapsulant vias, or through chip vias. In some embodiments, after attaching the interposers 200 to the carrier wafer 700 as described above with reference to FIG. 13, a seed layer (such as, for example, a copper layer) is formed over the interposers 200, a photoresist is formed on the seed layer and is patterned to from openings for the through vias $3404_1$. Subsequently, a conductive material (such as, for example, copper) is formed in the openings using a plating process, for example. After forming the conductive material, the photoresist is removed and, after removing the photoresist, exposed portions of the seed layer are removed. Remaining portions of the seed layer and the conductive material form the through vias $3404_1$. The through vias $3404_1$ electrically couple the interposer 200 of the package component $3402_1$ to the interposer 300 of the package component $3402_1$.

The package component 34022 is similar to the package component 1800 (see FIG. 31), with similar features being labeled with similar numerical references, and the description is not repeated herein. In some embodiments, the package component 34022 may be formed using process steps that are similar to the process steps described above with reference to FIGS. 13-16, and description is not repeated herein. In distinction with the package component 1800 (see FIG. 31), the package component 34022 comprises through vias 34042 extending through the encapsulant 704. The through vias 34042 may be also referred to as through molding vias, through encapsulant vias, or through chip vias. The through vias 34042 may be formed using similar materials and methods as the through vias 34041. The through vias 34042 electrically couple the interposer 200 of the package component 34022 to the interposer 300' of the package component 34022.

In some embodiments, the package component 3402$_2$ is attached to the package component 3402$_1$ using a bonding process, such as a hybrid bonding process. In such embodiments, the dielectric layer 108 of the package component 3402$_2$ is fusion bonded to the dielectric layer 112 of the package component 3402$_1$, and the die connectors 110 of the package component 3402$_2$ are fusion bonded to the die connectors 114 of the package component 3402$_1$. In some embodiments, before the bonding process, bonding surfaces of the dielectric layers 108 and 112 and the die connectors 110 and 114 are cleaned and subsequently activated using a plasma process (such as, for example, an Ar plasma process). Subsequently, an anneal process may be performed to improve the bonds between the package component 3402$_1$ and the package component 3402$_2$. The package component 3402$_1$ and the package component 3402$_2$ are electrically coupled through bonded structures that are formed by fusion bonding the die connectors 110 of the package component 3402$_2$ to the die connectors 114 of the package component 3402$_1$.

In some embodiments, the interposer 300' may be replaced by any of the interposers 400' (see FIG. 8), 500' (see FIG. 10) and 600' (see FIG. 12) based on design requirements for the multi-tier package component 3400. In some embodiments, the interposer 300 may be replaced by any of the interposers 400 (see FIG. 7), 500 (see FIG. 9) and 600 (see FIG. 11) based on design requirements for the multi-tier package component 3400. In some embodiments, some or all of the integrated circuit dies 50 may be replaced by integrated circuit dies 50' (see FIG. 2) based on design requirements for the multi-tier package component 3400. In the illustrated embodiment, the multi-tier package component 3400 comprises two package components (such as the package components 3402$_1$ and 3402$_2$). In other embodiments, the multi-tier package component 3400 may comprise more than two package components based on design requirements for the multi-tier package component 3400.

Figure 51:
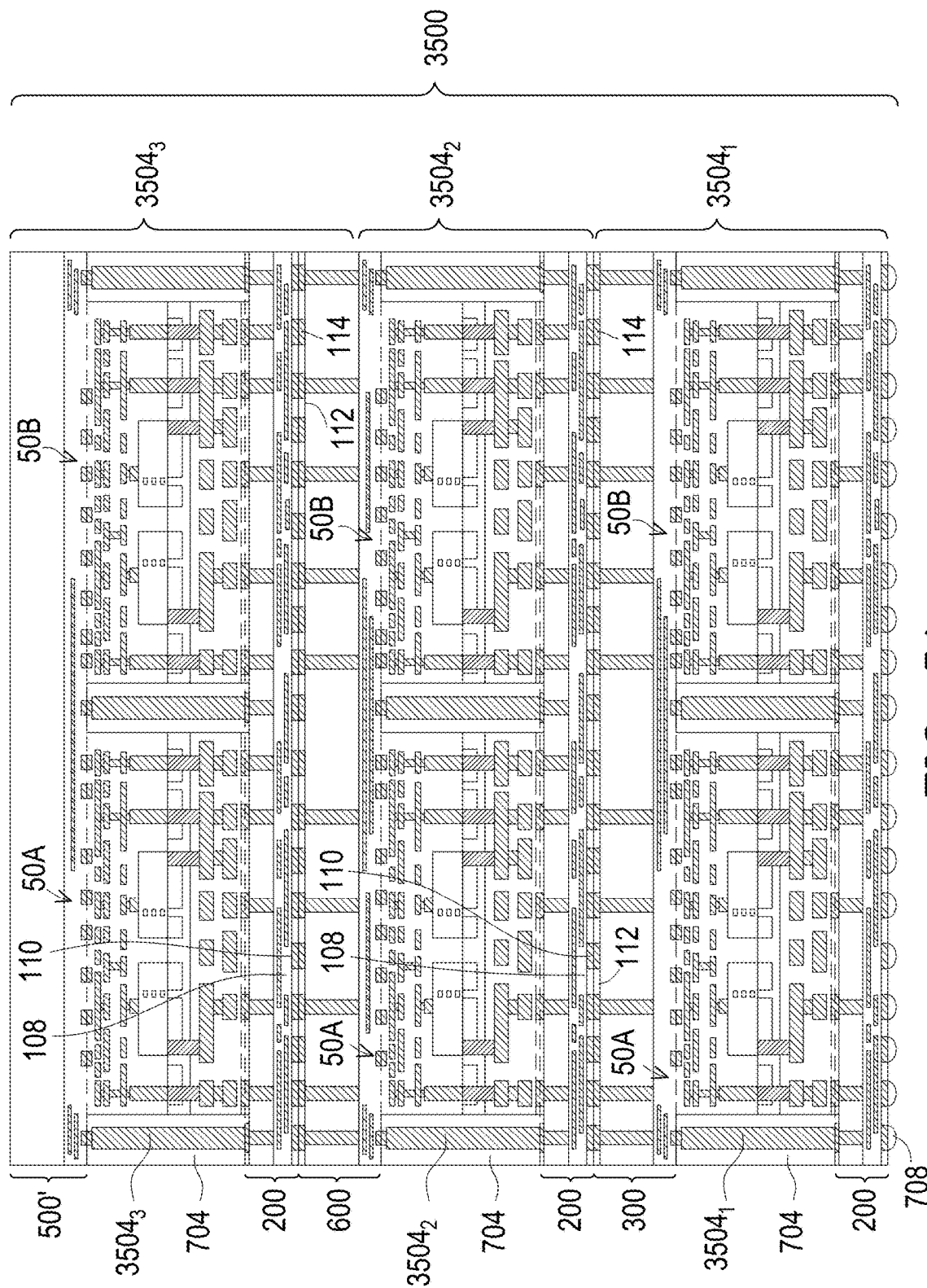
FIG. 51 illustrates a cross-sectional view of a multi-tier package component, in accordance with some embodiments.

FIG. 51 illustrates a cross-sectional view of a multi-tier package component 3500, in accordance with some embodiments. The multi-tier package component 3500 comprises a package component 3502$_1$, a package component 3502$_2$, and a package component 3502$_3$. The package component 3502$_2$ is attached to the package component 3502$_1$, and the package component 3502$_3$ is attached to the package component 3502$_2$, such that the package component 3502$_2$ is interposed between the package component 3502$_1$ and the package component 3502$_3$.

The package component 3502$_1$ is similar to the package component 1900 (see FIG. 34), with similar features being labeled with similar numerical references, and the description is not repeated herein. In some embodiments, the package component 3502$_1$ may be formed using process steps that are similar to the process steps described above with reference to FIGS. 13-16, and description is not repeated herein. In distinction with the package component 1900 (see FIG. 34), the package component 3502$_1$ comprises through vias 3504$_1$ extending through the encapsulant 704. The through vias 3504$_1$ may be also referred to as through molding vias, through encapsulant vias, or through chip vias. In some embodiments, the through vias 3504$_1$ may be formed using similar materials and methods as the through vias 3404$_1$ described above with reference to FIG. 50, and the description is not repeated herein. The through vias 3504$_1$ electrically couple the interposer 200 of the package component 3502$_1$ to the interposer 300 of the package component 3502$_1$.

The package component 3502$_2$ is similar to the package component 2500 (see FIG. 41), with similar features being labeled with similar numerical references, and the description is not repeated herein. In some embodiments, the package component 3502$_2$ may be formed using process steps that are similar to the process steps described above with reference to FIGS. 13-16, and description is not repeated herein. In distinction with the package component 2500 (see FIG. 41), the package component 3502$_2$ comprises through vias 3504$_2$ extending through the encapsulant 704. The through vias 3504$_2$ may be also referred to as through molding vias, through encapsulant vias, or through chip vias. In some embodiments, the through vias 3504$_2$ may be formed using similar materials and methods as the through vias 3404$_1$ described above with reference to FIG. 50, and the description is not repeated herein. The through vias 3504$_2$ electrically couple the interposer 200 of the package component 3502$_2$ to the interposer 600 of the package component 3502$_2$.

The package component 35023 is similar to the package component 2200 (see FIG. 38), with similar features being labeled with similar numerical references, and the description is not repeated herein. In some embodiments, the package component 35023 may be formed using process steps that are similar to the process steps described above with reference to FIGS. 13-16, and description is not repeated herein. In distinction with the package component 2200 (see FIG. 38), the package component 35023 comprises through vias 35043 extending through the encapsulant 704. The through vias 35043 may be also referred to as through molding vias, through encapsulant vias, or through chip vias. In some embodiments, the through vias 35043 may be formed using similar materials and methods as the through vias 34041 described above with reference to FIG. 50, and the description is not repeated herein. The through vias 35043 electrically couple the interposer 200 of the package component 35023 to the interposer 500' of the package component 35023.

In some embodiments, the package component 3502$_1$ is attached to the package component 3502$_2$ using a bonding process, such as a hybrid bonding process. In such embodiments, the interposer 200 of the package component 3502$_2$ is bonded to the interposer 300 of the package component 3502$_1$, such that the dielectric layer 108 of the package component 3502$_2$ is fusion bonded to the dielectric layer 112 of the package component 3502$_1$, and the die connectors 110 of the package component 3502$_2$ are fusion bonded to the die connectors 114 of the package component 3502$_1$. In some embodiments, before the bonding process, bonding surfaces of the dielectric layers 108 and 112 and the die connectors 110 and 114 are cleaned and subsequently activated using a plasma process (such as, for example, an Ar plasma process). Subsequently, an anneal process may be performed to improve the bonds between the package component $3502_1$ and the package component $3502_2$. The package component $3502_1$ and the package component $3502_2$ are electrically coupled through bonded structures that are formed by fusion bonding the die connectors 110 of the package component $3502_2$ to the die connectors 114 of the package component $3502_1$.

In some embodiments, the package component $3502_3$ is attached to the package component $3502_2$ using a bonding process, such as a hybrid bonding process. In such embodiments, the interposer 200 of the package component $3502_3$ is bonded to the interposer 600 of the package component $3502_2$, such that the dielectric layer 108 of the package component $3502_3$ is fusion bonded to the dielectric layer 112 of the package component $3502_2$, and the die connectors 110 of the package component $3502_3$ are fusion bonded to the die connectors 114 of the package component $3502_2$. In some embodiments, before the bonding process, bonding surfaces of the dielectric layers 108 and 112 and the die connectors 110 and 114 are cleaned and subsequently activated using a plasma process (such as, for example, an Ar plasma process). Subsequently, an anneal process may be performed to improve the bonds between the package component $3502_2$ and the package component $3502_3$. The package component $3502_2$ and the package component $3502_3$ are electrically coupled through bonded structures that are formed by fusion bonding the die connectors 110 of the package component $3502_3$ to the die connectors 114 of the package component $3502_2$.

In some embodiments, the interposer 300 may be replaced by any of the interposers 400 (see FIG. 7), 500 (see FIG. 9) and 600 (see FIG. 11) based on design requirements for the multi-tier package component 3500. In some embodiments, the interposer 600 may be replaced by any of the interposers 300 (see FIG. 5), 400 (see FIG. 7) and 500 (see FIG. 9) based on design requirements for the multi-tier package component 3500. In some embodiments, the interposer 500' may be replaced by any of the interposers 300' (see FIG. 6), 400' (see FIG. 8), and 600' (see FIG. 12) based on design requirements for the multi-tier package component 3500. In some embodiments, some or all of the integrated circuit dies 50 may be replaced by integrated circuit dies 50' (see FIG. 2) based on design requirements for the multi-tier package component 3500. In the illustrated embodiment, the multi-tier package component 3500 comprises three package components (such as the package components $3502_1$, $3502_2$, and $3502_3$). In other embodiments, the multi-tier package component 3500 may comprise more than three package components based on design requirements for the multi-tier package component 3500.

Figure 52:
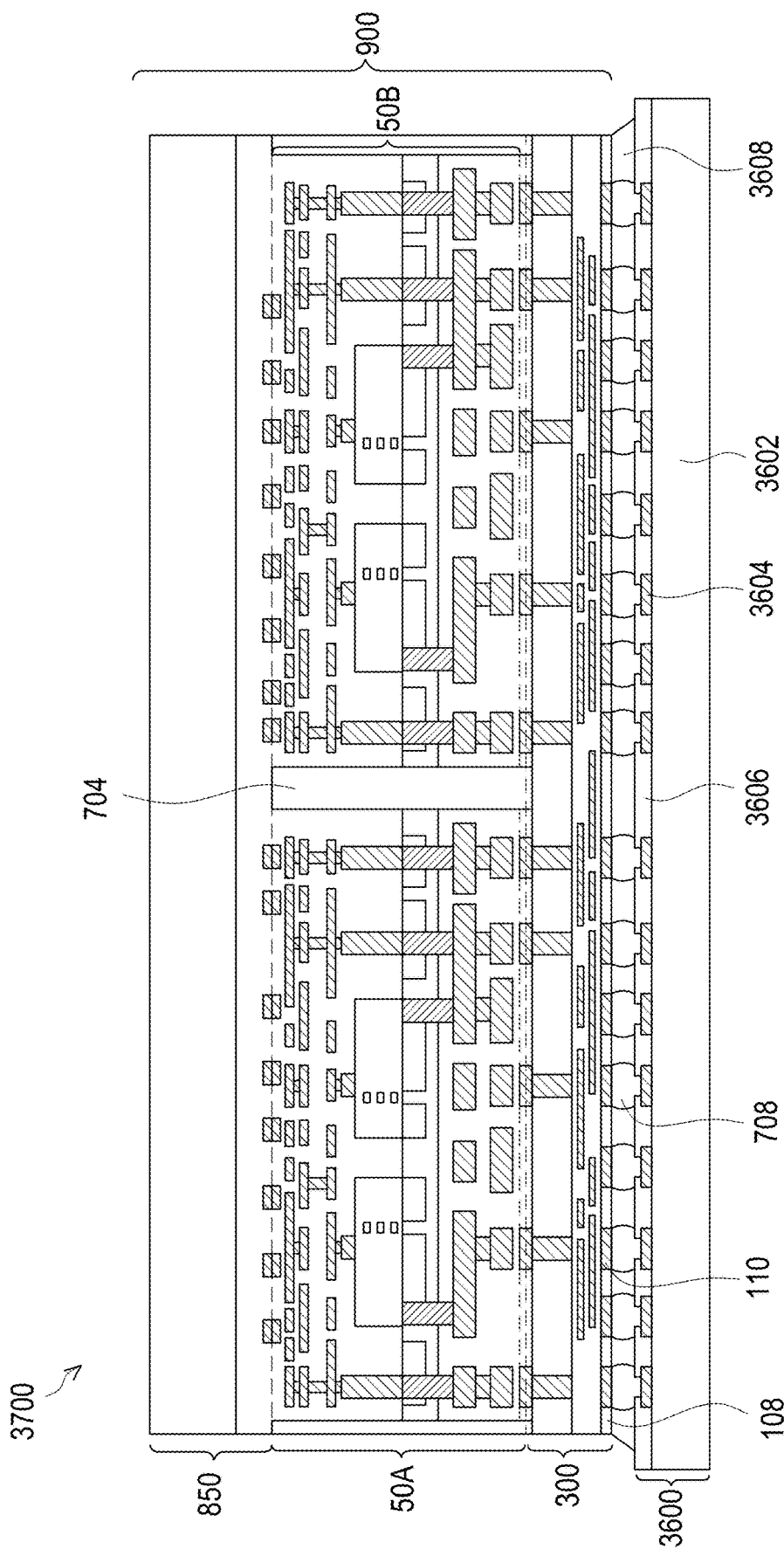
FIG. 52 illustrates a cross-sectional view of an integrated circuit package, in accordance with some embodiments.

In some embodiments, any of the package components described above may be attached to a package substrate to form an integrated circuit package. Such an integrated circuit package 3700 is illustrated in FIG. 52. In particular, FIG. 52 illustrates a cross-sectional view of the integrated circuit package 3700 comprising a package component 900 (see FIG. 17) mounted on a package substrate 3600, in accordance with some embodiments. The package component 900 may be mounted on the package substrate 3600 using the conductive connectors 708.

The package substrate 3600 includes a substrate core 3602 and bond pads 3604 over the substrate core 3602. The substrate core 3602 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 3602 may be an SOI substrate. Generally, an SOI substrate includes a layer of a semiconductor material such as epitaxial silicon, germanium, silicon germanium, SOI, SGOI, or combinations thereof. The substrate core 3602 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 3602.

The substrate core 3602 may include active and passive devices (not shown). A wide variety of devices such as transistors, capacitors, resistors, combinations of these, and the like may be used to generate the structural and functional requirements of the design for the integrated circuit package 3700. The devices may be formed using any suitable methods.

The substrate core 3602 may also include metallization layers and vias (not shown), with the bond pads 3604 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 3602 is substantially free of active and passive devices.

In some embodiments, the conductive connectors 708 are reflowed to attach the package component 900 to the bond pads 3604. The conductive connectors 708 electrically and/or physically couple the package substrate 3600, including metallization layers in the substrate core 3602, to the package component 900. In some embodiments, a solder resist 3606 is formed on the package substrate 3600. The conductive connectors 708 may be disposed in openings in the solder resist 3606 to be electrically and mechanically coupled to the bond pads 3604. The solder resist 3606 may be used to protect areas of the package substrate 3600 from external damage.

The conductive connectors 708 may have an epoxy flux (not shown) formed thereon before they are reflowed with at least some of the epoxy portion of the epoxy flux remaining after the package component 900 is attached to the package substrate 3600. This remaining epoxy portion may act as an underfill to reduce stress and protect the joints resulting from reflowing the conductive connectors 708. In some embodiments, an underfill 3608 may be formed between the package component 900 and the package substrate 3600 and surrounding the conductive connectors 708. The underfill 3608 may be formed of a molding compound, an epoxy, or the like. The underfill 3608 may be formed by a capillary flow process after the package component 900 is attached to the package substrate 3600, or may be formed by a suitable deposition method before the package component 900 is attached to the package substrate 3600.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Various embodiments described above allow for forming a package component (such as, for example, the package component 900 illustrated in FIG. 17) including a plurality of integrated circuit dies (such as, for example, the integrated circuit dies 50A and 50B illustrated in FIG. 17) encapsulated in an encapsulant (such as, for example, an encapsulant 704 illustrated in FIG. 17), where each of the integrated circuit dies includes a front-side interconnect structure (such as, for example, the front-side interconnect structure 56 illustrated in FIG. 1) and a backside interconnect structure (such as, for example, the backside interconnect structure 58 illustrated in FIG. 1). The package component further includes a first interposer (such as, for example, the interposer 200 illustrated in FIG. 17) in physical and electrical contact with the backside interconnect structures of the integrated circuit dies and a second interposer (such as, for example, the interposer 850 illustrated in FIG. 17) in physical and electrical contact with the front-side interconnect structures of the integrated circuit dies. The second interposer allows for coupling the front-side interconnect structures of the integrated circuit dies without relying on the back-side interconnect structures (such as super power rails) of the integrated circuit dies, and interconnect structures and through vias of the first interposer. By hybrid bonding the first interposer and the second interposer to the integrated circuit dies, a thermal resistance of the package component is reduced. By electrically coupling the integrated circuit dies through the second interposer, flexibility in circuit design for the package component is improved.

In accordance with an embodiment, a package includes an encapsulant having a first side and a second side opposite to the first side, a first integrated circuit die and a second integrated circuit die embedded in the encapsulant, and a first interposer on the first side of the encapsulant. The first interposer is mechanically and electrically coupled to the first integrated circuit die and the second integrated circuit die. The package further includes a second interposer on the second side of the encapsulant. The second interposer is mechanically and electrically coupled to the first integrated circuit die and the second integrated circuit die. The second interposer optically or electrically couples the first integrated circuit die to the second integrated circuit die. In an embodiment, the first interposer includes active electrical devices or passive electrical devices. In an embodiment, the second interposer includes active electrical devices, passive electrical devices, or optical devices. In an embodiment, the first integrated circuit die includes: a substrate; a first interconnect structure on a backside of the substrate, where the first interconnect structure is in physical and electrical contact with the first interposer; and a second interconnect structure on a front side of the substrate, where the second interconnect structure is in physical and electrical contact with the second interposer. In an embodiment, the second integrated circuit die includes: a substrate; a first interconnect structure on a backside of the substrate, where the first interconnect structure is in physical and electrical contact with the first interposer; and a second interconnect structure on a front side of the substrate, where the second interconnect structure is in physical and electrical contact with the second interposer. In an embodiment, a sidewall of the first interposer, a sidewall of the second interposer, and a sidewall of the encapsulant are laterally coterminous. In an embodiment, the first interposer electrically couples the first integrated circuit die to the second integrated circuit die.

In accordance with another embodiment, a package includes a first integrated circuit die and a second integrated circuit die. The first integrated circuit die includes a first substrate, a first interconnect structure on a backside of the first substrate, and a second interconnect structure on a front side of the first substrate. The second interconnect structure is electrically coupled to the first interconnect structure. The second integrated circuit die includes a second substrate, a third interconnect structure on a backside of the second substrate, and a fourth interconnect structure on a front side of the second substrate. The fourth interconnect structure is electrically coupled to the third interconnect structure. The package further includes a first interposer in physical contact with the first interconnect structure and the third interconnect structure, and a second interposer in physical contact with the second interconnect structure and the fourth interconnect structure. The first interposer electrically couples the first interconnect structure to the third interconnect structure. The second interposer electrically and optically couples the second interconnect structure to the fourth interconnect structure. In an embodiment, the first interposer includes active electrical devices or passive electrical devices. In an embodiment, the second interposer includes electrical devices and optical devices. In an embodiment, the package further includes an encapsulant between the first interposer and the second interposer, the encapsulant extending along sidewalls of the first integrated circuit die and sidewalls of the second integrated circuit die. In an embodiment, the second interposer includes metallization layers and one or more waveguides, the second interconnect structure and the fourth interconnect structure being electrically coupled through the metallization layers, the second interconnect structure and the fourth interconnect structure being optically coupled through the one or more waveguides. In an embodiment, the first interposer includes first bond pads at a front side of the first interposer and the first interconnect structure includes second bond pads, the second bond pads being in physical contact with the first bond pads. In an embodiment, the second interposer includes third bond pads at a front side of the second interposer and the second interconnect structure includes fourth bond pads, the fourth bond pads being in physical contact with the third bond pads.

In accordance with yet another embodiment, a method includes attaching an interposer die to a carrier wafer. A first encapsulant is formed over the carrier wafer and extending along sidewalls of the interposer die. A first integrated circuit die and a second integrated circuit die are bonded to the interposer die. The interposer die electrically couples the first integrated circuit die to the second integrated circuit die. A second encapsulant is formed over the carrier wafer and extending along sidewalls of the first integrated circuit die and sidewalls of the second integrated circuit die. An interposer wafer is bonded to the first integrated circuit die and the second integrated circuit die. The interposer wafer electrically and optically couples the first integrated circuit die to the second integrated circuit die. In an embodiment, bonding the first integrated circuit die and the second integrated circuit die to the interposer die includes bonding first bond pads of the first integrated circuit die and second bond pads of the second integrated circuit die to third bond pads of the interposer die. In an embodiment, bonding the interposer wafer to the first integrated circuit die and the second integrated circuit die includes bonding fourth bond pads of the first integrated circuit die and fifth bond pads of the second integrated circuit die to sixth bond pads of the interposer wafer, the first bond pads and the fourth bond pads being on opposite sides of the first integrated circuit die, the second bond pads and the fifth bond pads being on opposite sides of the second integrated circuit die. In an embodiment, the method further includes de-bonding the carrier wafer from the interposer wafer, and bonding a plurality of conductive connectors to the interposer wafer. In an embodiment, the first encapsulant and the second encapsulant include a same material. In an embodiment, the first encapsulant and the second encapsulant include different materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
attaching an interposer die to a carrier wafer, the interposer die having a first surface facing the carrier wafer, a second surface facing away from the carrier wafer, and sidewalls extending between the first surface and the second surface;
after attaching the interposer die to the carrier wafer, forming a first encapsulant over the carrier wafer and extending along sidewalls of the interposer die;
after forming the first encapsulant, bonding a first integrated circuit die and a second integrated circuit die to the interposer die, the interposer die electrically coupling the first integrated circuit die to the second integrated circuit die, wherein bonding the first integrated circuit die and the second integrated circuit die to the interposer die comprises bonding first bond pads of the first integrated circuit die and second bond pads of the second integrated circuit die to third bond pads of the interposer die;
forming a second encapsulant over the carrier wafer and extending along sidewalls of the first integrated circuit die and sidewalls of the second integrated circuit die; and
bonding an interposer wafer to the first integrated circuit die and the second integrated circuit die, the interposer wafer electrically and optically coupling the first integrated circuit die to the second integrated circuit die.

2. The method of claim 1, wherein bonding the interposer wafer to the first integrated circuit die and the second integrated circuit die comprises bonding fourth bond pads of the first integrated circuit die and fifth bond pads of the second integrated circuit die to sixth bond pads of the interposer wafer, wherein the first bond pads and the fourth bond pads are on opposite sides of the first integrated circuit die, wherein the second bond pads and the fifth bond pads are on opposite sides of the second integrated circuit die.

3. The method of claim 1, wherein the first encapsulant and the second encapsulant comprise a same material.

4. The method of claim 1, wherein the first encapsulant and the second encapsulant comprise different materials.

5. The method of claim 1, wherein a front side of the first integrated circuit die faces the interposer die.

6. The method of claim 1, further comprising singulating the interposer wafer after bonding the interposer wafer to the first integrated circuit die and the second integrated circuit die.

7. The method of claim 6, wherein singulating singulates through the first encapsulant.

8. The method of claim 1, wherein the first encapsulant directly contacts the second encapsulant.

9. A method comprising:
attaching a first interposer die and a second interposer die to a carrier wafer;
after attaching the first interposer die and the second interposer die, forming a first encapsulant over the carrier wafer and along sidewalls of the first interposer die and the second interposer die, the first encapsulant being between the first interposer die and the second interposer die;
after forming the first encapsulant, bonding a first integrated circuit die and a second integrated circuit die to the first interposer die, wherein bonding the first integrated circuit die and the second integrated circuit die to the first interposer die comprises bonding first bond pads of the first integrated circuit die and second bond pads of the second integrated circuit die to third bond pads of the first interposer die;
after forming the first encapsulant, bonding a third integrated circuit die and a fourth integrated circuit die to the second interposer die;
forming a second encapsulant over the carrier wafer and along sidewalls of the first integrated circuit die, sidewalls of the second integrated circuit die, sidewalls of the third integrated circuit die, and sidewalls of the fourth integrated circuit die;
bonding an interposer wafer to the first integrated circuit die, the second integrated circuit die, the third integrated circuit die, and the fourth integrated circuit die, the interposer wafer electrically coupling the first integrated circuit die to the second integrated circuit die; and
singulating through the interposer wafer and the second encapsulant to form a first package and a second package, the first package including the first interposer die, the first integrated circuit die, and the second integrated circuit die, the second package including the second interposer die, the third integrated circuit die, and the fourth integrated circuit die.

10. The method of claim 9, wherein an upper surface of the first interposer die is level with an upper surface of the first encapsulant.

11. The method of claim 9, wherein the first interposer die electrically couples the first integrated circuit die to the second integrated circuit die.

12. The method of claim 9, wherein the interposer wafer includes optical components.

13. The method of claim 9, wherein the first encapsulant physically contacts the second encapsulant.

14. The method of claim 9, wherein the first integrated circuit die comprises a substrate, wherein the substrate has electrical devices and a first interconnect structure on a front side of the substrate, wherein the substrate has a second interconnect on a back side of the substrate, wherein the front side of the substrate faces the first interposer die.

15. A method comprising:
    attaching a first interposer die and a second interposer die to a carrier wafer;
    after attaching the first interposer die, bonding a first integrated circuit die and a second integrated circuit die to the first interposer die, wherein bonding the first integrated circuit die and the second integrated circuit die to the first interposer die comprises bonding first bond pads of the first integrated circuit die and second bond pads of the second integrated circuit die to third bond pads of the first interposer die;
    after attaching the second interposer die, bonding a third integrated circuit die and a fourth integrated circuit die to the second interposer die;
    bonding an interposer wafer to the first integrated circuit die, the second integrated circuit die, the third integrated circuit die, and the fourth integrated circuit die, the interposer wafer electrically coupling the first integrated circuit die to the second integrated circuit die; and
    singulating through the interposer wafer to form a first package and a second package, the first package including the first interposer die, the first integrated circuit die, and the second integrated circuit die, the second package including the second interposer die, the third integrated circuit die, and the fourth integrated circuit die.

16. The method of claim 15, further comprising:
    prior to bonding the interposer wafer, forming a first encapsulant between along of the first integrated circuit die, sidewalls of the second integrated circuit die, sidewalls of the third integrated circuit die, and sidewalls of the fourth integrated circuit die.

17. The method of claim 16, further comprising:
    prior to bonding the first integrated circuit die and the second integrated circuit die to the first interposer die and prior to forming the first encapsulant, forming a second encapsulant over the carrier wafer and along sidewalls of the first interposer die and the second interposer die.

18. The method of claim 17, wherein the first encapsulant is formed directly on the second encapsulant.

19. The method of claim 15, wherein the interposer wafer includes metallization layers.

20. The method of claim 15, wherein the interposer wafer includes optical components.

* * * * *